United States Patent
Ohki et al.

(10) Patent No.: US 9,035,353 B2
(45) Date of Patent: May 19, 2015

(54) COMPOUND SEMICONDUCTOR DEVICE COMPRISING ELECTRODE ABOVE COMPOUND SEMICONDUCTOR LAYER AND METHOD OF MANUFACTURING THE SAME

(75) Inventors: Toshihiro Ohki, Hadano (JP); Naoya Okamoto, Isehara (JP); Yuichi Minoura, Zama (JP); Kozo Makiyama, Kawasaki (JP); Shirou Ozaki, Yamato (JP)

(73) Assignee: FUJITSU LIMITED, Kawasaki (JP)

( * ) Notice: Subject to any disclaimer, the term of this patent is extended or adjusted under 35 U.S.C. 154(b) by 145 days.

(21) Appl. No.: 13/567,246

(22) Filed: Aug. 6, 2012

(65) Prior Publication Data

US 2013/0082400 A1    Apr. 4, 2013

(30) Foreign Application Priority Data

Sep. 29, 2011    (JP) .................................. 2011-215280

(51) Int. Cl.
  *H01L 29/66*    (2006.01)
  *H01L 21/00*    (2006.01)
  *H01L 29/778*    (2006.01)
  *H01L 29/20*    (2006.01)

(52) U.S. Cl.
  CPC ...... *H01L 29/7787* (2013.01); *H01L 29/66462* (2013.01); *H01L 29/2003* (2013.01)

(58) Field of Classification Search
  CPC .................... H01L 29/66462; H01L 23/3171; H01L 29/778; H01L 29/66431; H01L 29/7786; H01L 2924/13064
  USPC .................... 257/192, 194, E29.246; 438/172
  See application file for complete search history.

(56) References Cited

U.S. PATENT DOCUMENTS 7,709,269 B2    5/2010  Smith et al.
8,105,889 B2 *  1/2012  Smith et al. .................. 438/181

(Continued)

FOREIGN PATENT DOCUMENTS

JP    2002-359256 A1    12/2002
JP    2008124440       5/2008

(Continued)

OTHER PUBLICATIONS

C. S. Oh et al: "AlGaN/GaN metal-oxide-semiconductor heterostructure field-effect transistor with oxidized Ni as a gate insulator", Applied Physics Letters, vol. 85, No. 18, Nov. 1, 2004, pp. 4214-4216.

(Continued)

*Primary Examiner* — Minh-Loan Tran
(74) *Attorney, Agent, or Firm* — Kratz, Quintos & Hanson, LLP

(57) ABSTRACT

A HEMT has a compound semiconductor layer, a protection film which has an opening and covers an upper side of the compound semiconductor layer, and a gate electrode which fills the opening and has a shape riding on the compound semiconductor layer, wherein the protection film has a stacked structure of a lower insulating film not containing oxygen and an upper insulating film containing oxygen, and the opening includes a first opening formed in the lower insulating film and a second opening formed in the upper insulating film and wider than the first opening, the first opening and the second opening communicating with each other.

17 Claims, 32 Drawing Sheets

(56) References Cited

U.S. PATENT DOCUMENTS

| | | |
|---|---|---|
| 8,283,699 B2 | 10/2012 | Wu |
| 8,350,297 B2 | 1/2013 | Kaneko |
| 8,933,486 B2 | 1/2015 | Wu |
| 2006/0102929 A1 | 5/2006 | Okamoto et al. |
| 2010/0171150 A1* | 7/2010 | Smith et al. ............. 257/194 |
| 2011/0018040 A1 | 1/2011 | Smith et al. |
| 2011/0057232 A1* | 3/2011 | Sheppard et al. ......... 257/194 |

FOREIGN PATENT DOCUMENTS

| | | |
|---|---|---|
| JP | 2009524242 | 6/2009 |
| JP | 2011124385 | 6/2011 |
| WO | 2007084465 A1 | 7/2007 |

OTHER PUBLICATIONS

H. J. Ahn et al.: "Reduction of Gate Leakage Current in AlGaN/GaN MOSHFET Using NiO", Journal of the Korean Physical Society, vol. 47, Nov. 2005, pp. S581-S584.

Extended European Search Report dated Mar. 3, 2014 issued in counterpart application No. 12179147.9.

CN Office Action dated Oct. 29, 2014. Application No. 201210320857.2.

Office Action of JP Patent Application 2011-215280 dated Mar. 12, 2015. Translation of the relevant part, p. 1, the sixth line from the bottom to the last line, p. 2, lines 5-8, and p. 2, lines 11-14 of the Office Action.

* cited by examiner

CONVENTIONAL STRUCTURE

STRUCTURE OF FIRST EMBODIMENT

US 9,035,353 B2

COMPOUND SEMICONDUCTOR DEVICE COMPRISING ELECTRODE ABOVE COMPOUND SEMICONDUCTOR LAYER AND METHOD OF MANUFACTURING THE SAME

CROSS-REFERENCE TO RELATED APPLICATION

This application is based upon and claims the benefit of priority of the prior Japanese Patent Application No. 2011-215280, filed on Sep. 29, 2011, the entire contents of which are incorporated herein by reference.

FIELD

The embodiments discussed herein are directed to a compound semiconductor device and a method of manufacturing the same.

BACKGROUND

Nitride semiconductor devices have been actively developed as high-withstand-voltage, high-power semiconductor devices, by utilizing their characteristics such as a high saturation electron velocity, a wide band gap, and so on. Many reports have been made on field-effect transistors, in particular, HEMT (High Electron Mobility Transistor) as the nitride semiconductor devices. Especially, an AlGaN/GaN HEMT using GaN as an electron transit layer and using AlGaN as an electron supply layer has been drawing attention. In the AlGaN/GaN HEMT, a distortion ascribable to a difference in lattice constant between GaN and AlGaN occurs in AlGaN. Owing to piezoelectric polarization caused by the distortion and to spontaneous polarization of AlGaN, a high-concentration two-dimensional electron gas (2DEG) is obtained. This makes it possible to realize a high withstand voltage and a high output power.

Patent Literature 1: Japanese Laid-open Patent Publication No. 2002-359256

In a nitride semiconductor device for high power and high frequency such as AlGaN/GaN HEMT, one of problems when it is operated under a high voltage is a current collapse phenomenon. This current collapse refers to a phenomenon that on-resistance increases by the application of a high voltage and is said to occur because electrons are trapped in semiconductor crystals, an interface between a semiconductor and an insulating film, and so on and accordingly the concentration of 2DEG in these regions decreases. As one method to suppress the current collapse phenomenon, a field plate structure has been widely known. For example, it is known that forming a gate electrode in a so-called overhanging shape has an effect to suppress the current collapse phenomenon.

However, only with the aforesaid field plate structure, it is difficult to fully suppress the current collapse phenomenon, and there is a problem that the current collapse noticeably occurs especially during a high-voltage operation, which has given rise to a demand for a method for further suppressing the current collapse.

SUMMARY

A compound semiconductor device according to an aspect includes: a compound semiconductor layer; a protection film which has an opening and covers an upper side of the compound semiconductor layer; and an electrode which fills the opening and has a shape riding on the compound semiconductor layer, wherein the protection film has a stacked structure of a lower insulating film not containing oxygen and an upper insulating film containing oxygen, and the opening has a first opening formed in the lower insulating film and a second opening formed in the upper insulating film and wider than the first opening, the first opening and the second opening communicating with each other.

A method of manufacturing a compound semiconductor device according to an aspect includes: forming a protection film to cover an upper side of a compound semiconductor layer, the protection film having a stacked structure of a lower insulating film not containing oxygen and an upper insulating film containing oxygen; forming a first opening in the lower insulating film and forming, in the upper insulating film, a second opening wider than the first opening, the first opening and the second opening being formed to communicate with each other; forming an electrode that fills the opening and has a shape riding on the compound semiconductor layer.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Hereinafter, embodiments will be described in detail with reference to the drawings. In the following embodiments, a structure of a compound semiconductor device will be described along with its manufacturing method.

Note that, in the following drawings, some constituent members are not illustrated with relatively accurate size and thickness for convenience of illustration.

First Embodiment

In this embodiment, a Schottky-type AlGaN/GaN HEMT is disclosed as the compound semiconductor device.

FIG. 1A to FIG. 1C and FIG. 2A to FIG. 2C are schematic cross-sectional views illustrating a method of manufacturing the AlGaN/GaN HEMT according to the first embodiment in order of processes.

Figure 1A:
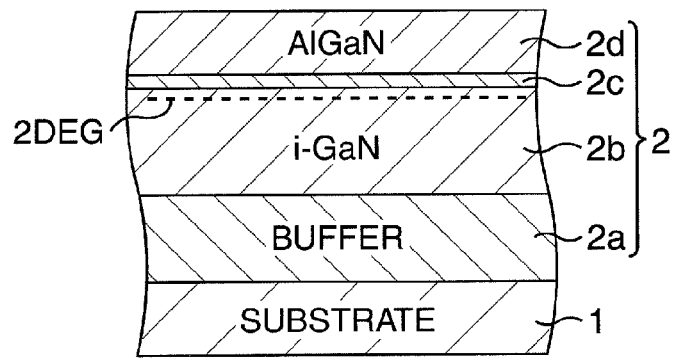
FIG. 1A to FIG. 1C are schematic cross-sectional views illustrating a method of manufacturing an AlGaN/GaN HEMT according to a first embodiment in order of processes.

First, as illustrated in FIG. 1A, a compound semiconductor layer 2 having a stacked structure of compound semiconductors is formed on, for example, a semi-insulating SiC substrate 1 being a growth substrate. As the growth substrate, a Si substrate, a sapphire substrate, a GaAs substrate, a GaN substrate, or the like may be used instead of the SiC substrate. The conductivity of the substrate may be either semi-insulating or conductive.

The compound semiconductor layer 2 includes a buffer layer 2a, an electron transit layer 2b, an intermediate layer 2c and an electron supply layer 2d.

In the finished AlGaN/GaN HEMT, two-dimensional electron gas (2DEG) is generated in the vicinity of an interface, of the electron transit layer 2b, with the electron supply layer 2d (to be exact, the intermediate layer 2c) during its operation. This 2DEG is generated based on spontaneous polarizations of the electron transit layer 2b and the electron supply layer 2d and also based on piezoelectric polarization caused by a distortion ascribable to a difference in lattice constant between the compound semiconductor (here GaN) of the electron transit layer 2b and the compound semiconductor (here AlGaN) of the electron supply layer 2d.

In more detail, on the SiC substrate 1, the following compound semiconductors are grown by, for example, a MOVPE (Metal Organic Vapor Phase Epitaxy) method. A MBE (Molecular Beam Epitaxy) method or the like may be used instead of the MOVPE method.

On the SiC substrate 1, the compound semiconductors to be the buffer layer 2a, the electron transit layer 2b, the intermediate layer 2c, and the electron supply layer 2d are sequentially grown. The buffer layer 2a is formed by AlN being grown with an about 0.1 μm thickness on the Si substrate 1. The electron transit layer 2b is formed by i (intentionally undoped)-GaN being grown with an about 1 μm to about 3 μm thickness. The intermediate layer 2c is formed by i-AlGaN being grown with an about 5 nm thickness. The electron supply layer 2d is formed by n-AlGaN being grown with an about 30 nm thickness. In some case, the intermediate layer 2c is not formed. As the electron supply layer 2d, i-AlGaN may be formed.

To grow GaN, mixed gas of trimethylgallium (TMGa) gas being a Ga source and ammonia ($NH_3$) gas is used as a source gas. To grow AlGaN, mixed gas of TMAl gas, TMGa gas, and $NH_3$ gas is used as a source gas. Depending on the compound semiconductor layer that is to be grown, whether or not to supply the TMAl gas and the TMGa gas and their flow rates are appropriately set. A flow rate of the $NH_3$ gas being a common source is set to about 100 sccm to about 10 slm. Further, growth pressure is set to about 50 Torr to about 300 Torr, and growth temperature is set to about 1000° C. to about 1200° C.

In order to grow AlGaN as an n-type, that is, in order to form the electron supply layer 2d (n-AlGaN), n-type impurities are added to the AlGaN source gas. Here, gas containing, for example, Si, for example, silane ($SiH_4$) gas is added to the source gas at a predetermined flow rate, thereby doping AlGaN with Si. A doping concentration of Si is set to about $1 \times 10^{18}/cm^3$ to about $1 \times 10^{20}/cm^3$, for example, set to about $2 \times 10^{18}/cm^3$.

Subsequently, element isolation structures are formed.

In more detail, argon (Ar), for instance, is injected to element isolation regions of the compound semiconductor layer 2. Consequently, the element isolation structures are formed in the compound semiconductor layer 2 and in a surface layer portion of the SiC substrate 1. The element isolation structures demarcate an active region on the compound semiconductor layer 2.

Incidentally, instead of the above injection method, a STI (Shallow Trench Isolation) method, for instance, may be used for the element isolation.

Figure 1B:
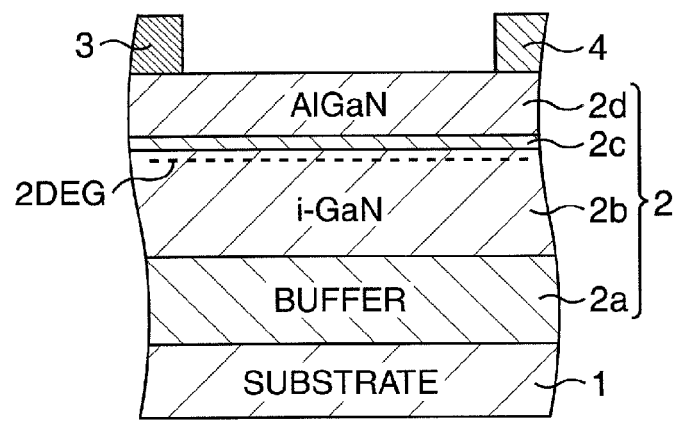

Subsequently, as illustrated in FIG. 1B, a source electrode 3 and a drain electrode 4 are formed.

As an electrode material, Ta/Al (Ta for a lower layer and Al for an upper layer) are used, for instance. To form the electrodes, an eaves-structure, double-layer resist suitable for a vapor deposition method and a liftoff method is used, for instance. This resist is applied on the compound semiconductor layer 2 to form a resist mask having openings at predetermined positions where to form the source electrode and the drain electrode. Ta/Al are deposited by using this resist mask by, for example, the vapor deposition method. A thickness of Ti is about 20 nm and a thickness of Al is about 200 nm. By the liftoff method, the resist mask with the eaves structure and Ta/Al deposited thereon are removed. Thereafter, the SiC substrate 1 is heat-treated at 400° C. to 1000° C., for example, at about 550° C. in, for example, a nitrogen atmosphere, and the residual Ti/Al are brought into ohmic contact with the electron supply layer 2d. Through the above processes, the source electrode 4 and the drain electrode 5 made of Ta/Al are formed.

Figure 1C:
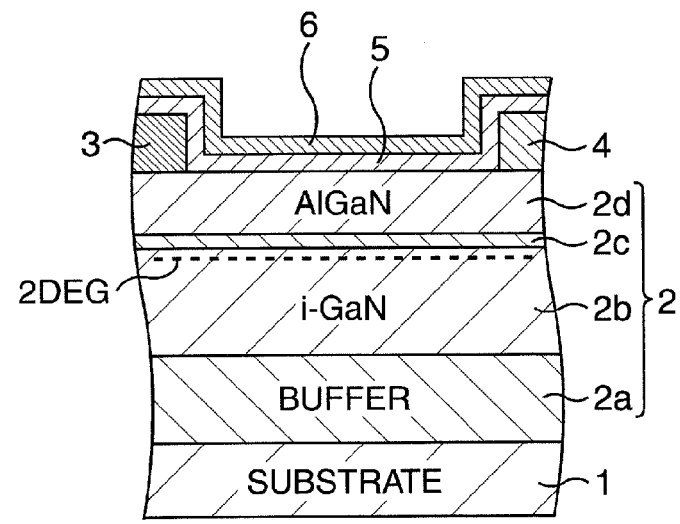

Subsequently, as illustrated in FIG. 1C, a passivation film protecting a surface of the compound semiconductor layer 2 is formed.

The passivation film has a stacked structure of a lower insulating film not containing oxygen, here, a $SiN(Si_3N_4)$ film 5, and an upper insulating film containing oxygen, here a SiON film 6.

In more detail, SiN is deposited on the whole surface of the compound semiconductor layer 2 to, for example, an about 2 nm to about 200 nm thickness, for example, an about 20 nm thickness by a plasma CVD method, a sputtering method, or the like, to form the SiN film 5. Subsequently, SiON is deposited on the SiN film 5 to, for example, an about 2 nm to about 200 nm thickness, for example, to an about 20 nm thickness by a plasma CVD method, a sputtering method, or the like, to form the SiON film 6. Through the above processes, the passivation film in which the SiN film 5 and the SiON film 6 are stacked is formed.

Figure 2A:
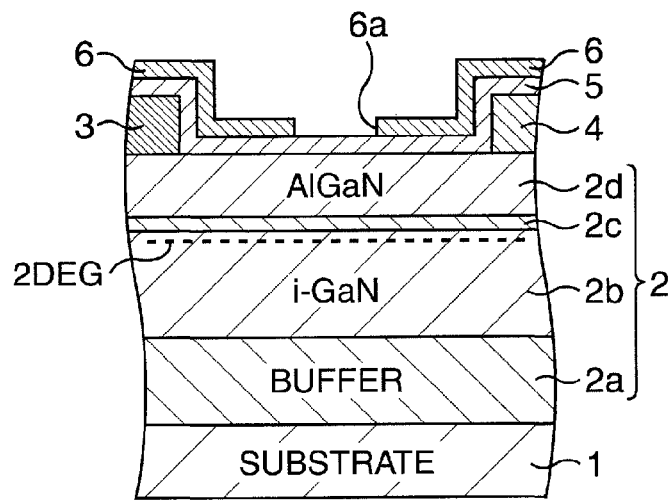
FIG. 2A to FIG. 2C, which are continued from FIG. 1A to FIG. 1C, are schematic cross-sectional views illustrating the method of manufacturing the AlGaN/GaN HEMT according to the first embodiment in order of processes.

Subsequently, as illustrated in FIG. 2A, an opening 6a is formed in the SiON film 6.

In more detail, a resist is applied on the whole surface of the SiON film 6 and is processed by lithography. Consequently, a resist mask having an opening from which a predetermined gate electrode formation position of the SiON film 6 is exposed is formed.

By using this resist mask, the SiON film 6 is dry-etched with, for example, fluorine-based gas used as etching gas. At this time, a surface layer of the SiN film 5 may be slightly etched together with the SiON film 6. Consequently, the opening 6a is formed at the predetermined gate electrode formation position of the SiON film 6.

The resist mask is removed by ashing or wet processing using a predetermined chemical solution.

Figure 2B:
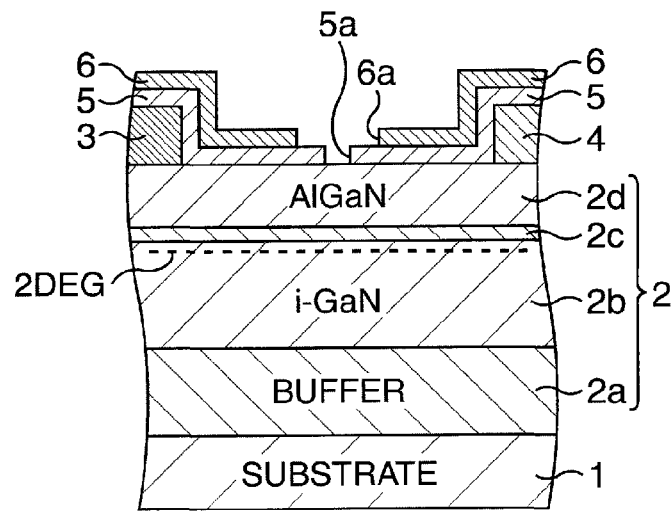

Subsequently, as illustrated in FIG. 2B, an opening 5a is formed in the SiN film 5.

In more detail, a resist is applied on the whole surface of the SiON film 6 including a region on the SiN film 5 exposed from the opening 6a and is processed by lithography. Consequently, a resist mask having an opening from which the predetermined gate electrode formation position of the SiN film 5 in the opening 6a is exposed is formed.

By using this resist mask, the SiN film 5 is dry-etched with, for example, fluorine-based gas used as etching gas. Consequently, the opening 5a is formed at the predetermined gate electrode formation position of the SiN film 5. The opening 6a of the SiON film 6 is wider than the opening 5a of the SiN film 5. The openings 5a, 6a communicate with each other, so that an opening where to form the gate electrode is formed.

The resist mask is removed by aching or wet processing using a predetermined chemical solution.

Figure 2C:
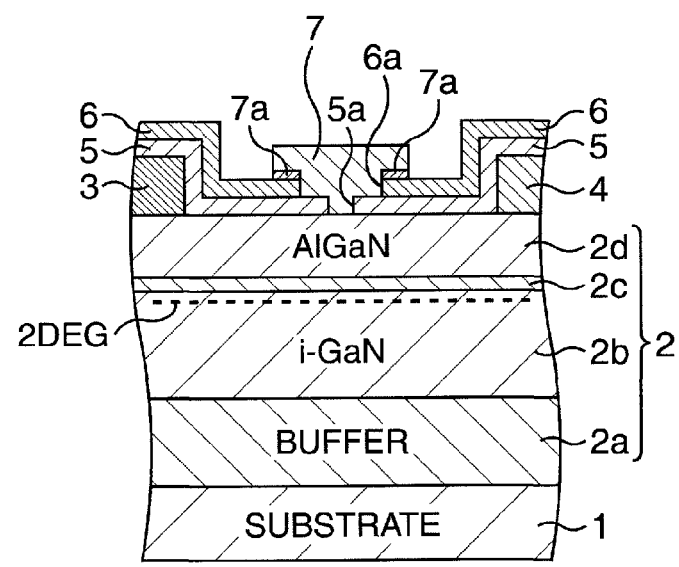

Subsequently, as illustrated in FIG. 2C, the gate electrode 7 is formed.

As an electrode material, for example, Ni/Au (Ni for a lower layer and Au for an upper layer) are used. To form the electrode, an eaves-structure, double-layer resist suitable for a vapor deposition method and a liftoff method is used, for instance. This resist is applied on the SiON film 6 including the inside of the openings 5a, 6a, and consequently a resist mask having an opening at the predetermined gate electrode formation position including the openings 5a, 6a is formed. By using this resist mask, Ni/Au are deposited by, for example, the vapor deposition method. A thickness of Ni is about 30 nm and a thickness of Au is about 400 nm. By the liftoff method, the resist mask with the eaves structure and Ni/Au deposited thereon are removed. Consequently, the gate electrode 7 in Schottky contact with the compound semiconductor layer 2 is formed so as to fill the openings 5a, 6a with gate metal.

The gate electrode 7 is formed in a so-called overhanging shape, using Ni filling the inside of the openings 5a, 6a and riding on the SiON film 6 and Au deposited on Ni. In the vicinity of the opening 6a of a surface of the SiON film 6, at a portion in contact with Ni of the gate electrode 7, oxygen of the SiON film 6 and Ni of the overhanging portion of the gate electrode 7 react with each other, so that a NiO layer 7a being a thin oxide film is formed.

Thereafter, through processes of electrical connection of the source electrode 3, the drain electrode 4, and the gate electrode 7, and so on, the Schottky-type AlGaN/GaN HEMT is formed.

In this embodiment, the passivation film is formed as a stacked structure of the SiN film 5 not containing oxygen and the SiON film 6 containing oxygen. As the passivation film, an insulating film not containing oxygen with little interface state is suitable. The surface of the compound semiconductor layer 2 to be a Schottky surface is directly covered by the SiN film 5 not containing oxygen, and the SiN film 5 mainly functions as a protection film. Being separated from the Schottky surface by the SiN film 5, the SiON film 6 containing oxygen might not affect the Schottky surface. The opening 5a of the SiN film 5 and the opening 6a of the SiON film 6 wider than the opening 5a communicate with each other, and the gate electrode 7 in the overhanging shape is formed so as to fill the inside of an opening made up of the openings 5a, 6a. In this structure, the gate electrode 7 is formed on the portion where it fills the opening 5a, the portion where it fills the opening 6a, and a gradually fanning out multi-step structure (here, triple-step structure) of the overhanging portion, so that electric field concentration points during a high-voltage operation are dispersed.

Further, in this embodiment, oxygen of the SiON film 6 and Ni of the overhanging portion of the gate electrode 7 react with each other to form the NiO layer 7a. NiO functions as a p-type oxide semiconductor. The overhanging portion of the gate electrode 7 is located at the uppermost step of the multi-step structure, and in the gate electrode 7, the overhanging portion is a portion closest to the drain electrode 4 and thus the largest electric field concentration occurs here. Due to the presence of the NiO layer 7a being the p-type oxide semiconductor formed on the overhanging portion, a lateral resistance of the overhanging portion increases and field intensity at a gate end is greatly alleviated. Consequently, the current collapse phenomenon is suppressed.

Here, an experiment where current-voltage characteristics of the AlGaN/GaN HEMT according to this embodiment are examined will be described. As a comparative example of this embodiment, a conventional AlGaN/GaN HEMT whose passivation film is made up of a single layer of SiN is presented as an example.

Figure 3A:
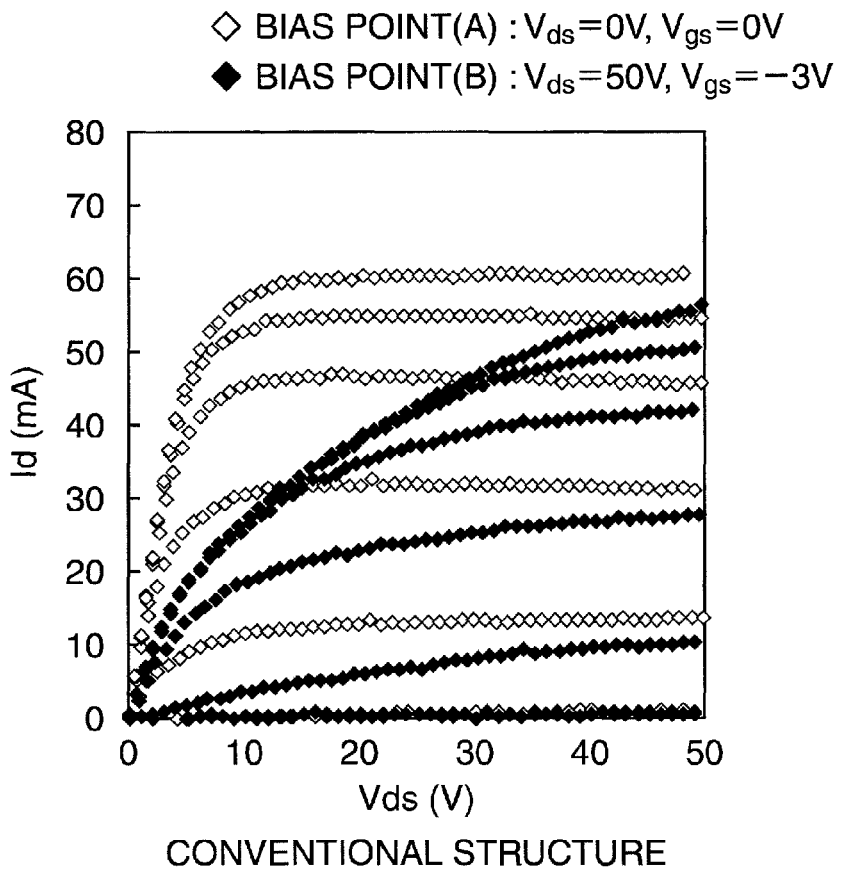
FIG. 3A and FIG. 3B are characteristic charts presenting results of experiments in which current-voltage characteristics of the AlGaN/GaN HEMT according to the first embodiment are studied.
Figure 3B:
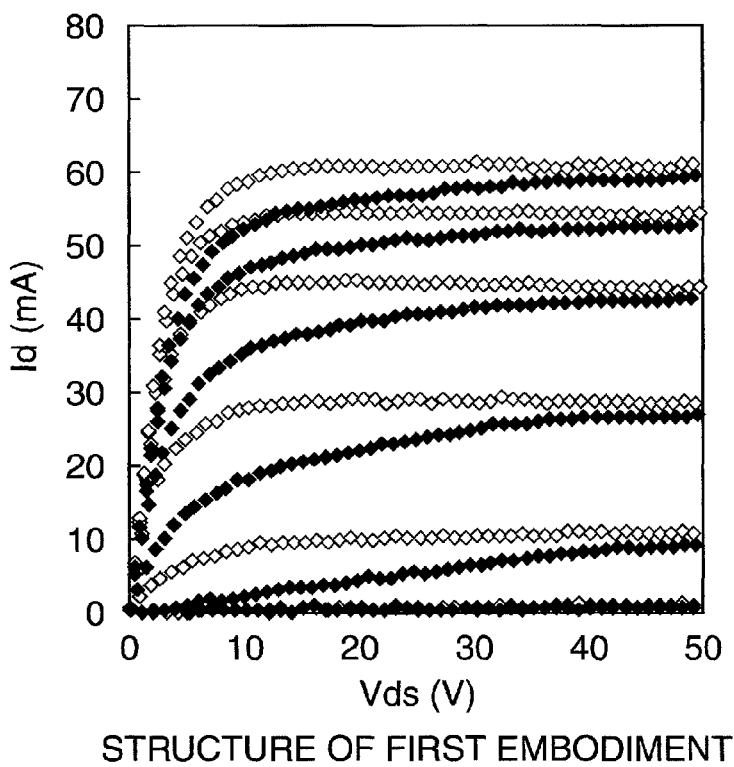

The experiment results are presented in FIG. 3A and FIG. 3B. FIG. 3A presents the results of the comparative example and FIG. 3B presents the results of this embodiment. In the comparative example, due to a 50 V bias stress, on-resistance increases and the current collapse is large. On the other hand, in this embodiment, it has been confirmed that an increase in on-resistance is very small and the current collapse can be effectively suppressed.

As described above, according to this embodiment, a highly reliable AlGaN/GaN HEMT that fully suppresses the current collapse phenomenon even during the high-voltage operation and realizes a high withstand voltage and a high power is obtained.

Second Embodiment

Hereinafter, a Schottky-type AlGaN/GaN HEMT according to a second embodiment will be described. Note that the same constituent members and so on as those of the AlGaN/GaN HEMT according to the first embodiment will be denoted by the same reference signs, and a detailed description thereof will be omitted.

Figure 4A:
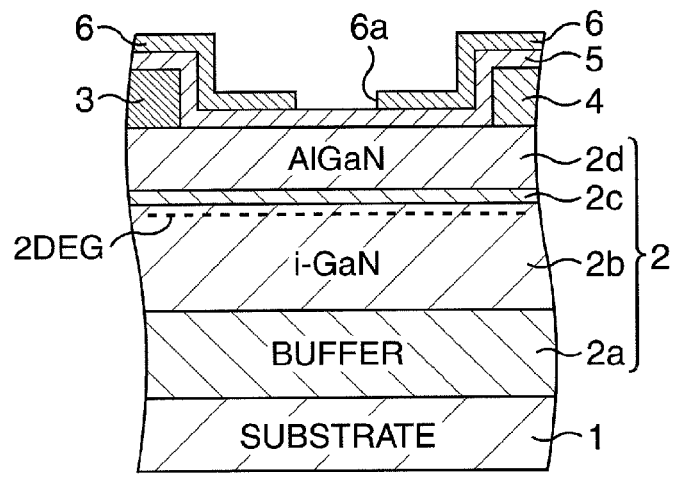
FIG. 4A to FIG. 4C are schematic cross-sectional views illustrating main processes in a method of manufacturing an AlGaN/GaN HEMT according to a second embodiment.
Figure 4B:
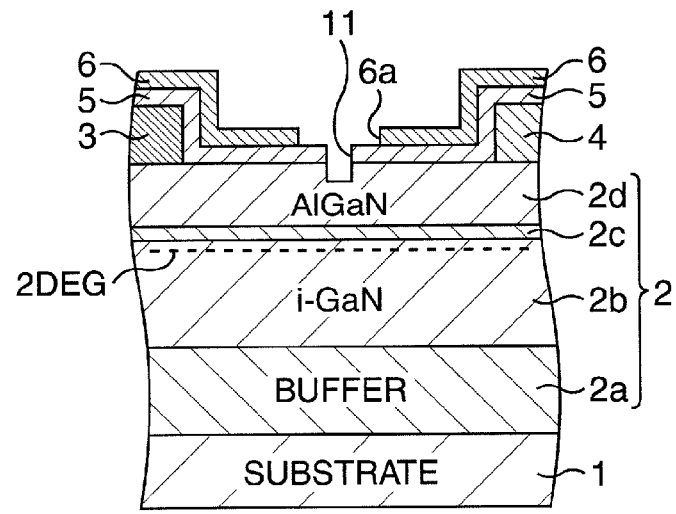
Figure 4C:
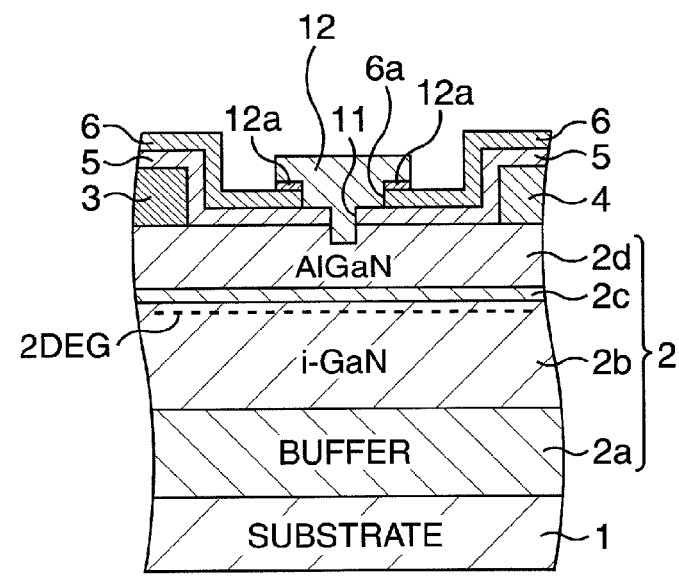

FIG. 4A to FIG. 4C are schematic cross-sectional views illustrating main processes in a method of manufacturing the AlGaN/GaN HEMT according to the second embodiment.

First, through the processes in FIG. 1A to FIG. 2A of the first embodiment, an opening 6a is formed in a SiON film 6 as illustrated in FIG. 4A.

Subsequently, as illustrated in FIG. 4B, a trench 11 is formed in the SiON film 6 and an electron supply layer 2d.

In more detail, a resist is applied on the whole surface of the SiON film 6 including an upper part of a SiN film 5 exposed from the opening 6a, and is processed by lithography. Consequently, a resist mask having an opening from which a predetermined gate electrode formation position of the SiN film 5 in the opening 6a is exposed is formed.

By using this resist mask, the SiN film 5 and a surface layer of the electron supply layer 2d are dry-etched with, for example, fluorine-based gas used as etching gas. Consequently, the trench 11 penetrating through the SiN film 5 to reach the surface layer of the electron supply layer 2d is formed at the predetermined gate electrode formation position of the electron supply layer 2d and the SiN film 5. The opening 6a of the SiON film 6 is wider than the trench 11. The trench 11 and the opening 6a communicate with each other, so that an electrode trench where to form the gate electrode is formed.

The resist mask is removed by ashing or wet processing using a predetermined chemical solution.

Subsequently, as illustrated in FIG. 4C, the gate electrode 12 is formed.

As an electrode material, for example, Ni/Au (Ni for a lower layer and Au for an upper layer) are used. To form the electrode, an eaves-structure, double-layer resist suitable for a vapor deposition method and a liftoff method is used, for instance. This resist is applied on the SiON film 6 including the inside of the trench 11 and the opening 6a, and consequently a resist mask having an opening at the predetermined gate electrode formation position including the trench 11 and the opening 6a is formed. By using this resist mask, Ni/Au are deposited by, for example, the vapor deposition method. A thickness of Ni is about 30 nm and a thickness of Au is about 400 nm. By the liftoff method, the resist mask with the eaves structure and Ni/Au deposited thereon are removed. Consequently, the gate electrode 12 in Schottky contact with a surface of a compound semiconductor layer 2 is formed so as to fill the trench 11 and the opening 6a with gate metal.

The gate electrode 12 is formed in a so-called overhanging shape, using Ni filling the inside of the trench 11 and the opening 6a and riding on the SiON film 6 and Au deposited on Ni. In the vicinity of the opening 6a of the surface of the SiON film 6, at a portion in contact with Ni of the gate electrode 12, oxygen of the SiON film 6 and Ni of the overhanging portion of the gate electrode 12 react with each other, so that a NiO layer 7a being a thin oxide film is formed.

Thereafter, through processes of electrical connection of a source electrode 3, a drain electrode 4, and the gate electrode 12 and so on, the Schottky-type AlGaN/GaN HEMT is formed.

In this embodiment, a passivation film is formed as a stacked structure of the SiN film 5 not containing oxygen and the SiON film 6 containing oxygen. As the passivation film, an insulating film not containing oxygen with little interface state is suitable. The surface of the compound semiconductor layer 2 to be a Schottky surface is directly covered by the SiN film 5 not containing oxygen, and the SiN film 5 mainly functions as a protection film. Being separated from the Schottky surface by the SiN film 5, the SiON film 6 containing oxygen might not affect the Schottky surface. The trench 11 of the electrode supply layer 2d and the SiN film 5 and the opening 6a of the SiON film 6 wider than the opening 5a communicate with each other, and the gate electrode 12 in the overhanging shape is formed so as to fill the inside of an electrode trench made up of the trench 11 and the opening 6a. In this structure, the gate electrode 12 is formed on the portion where it fills the trench 11, the portion where it fills the opening 6a, and a gradually fanning out multi-step structure (here, triple-step structure) of the overhanging portion, so that electric field concentration points during a high-voltage operation are dispersed.

Further, in this embodiment, oxygen of the SiON film 6 and Ni of the overhanging portion of the gate electrode 12 react with each other to form a NiO layer 12a. NiO functions as a p-type oxide semiconductor. The overhanging portion of the gate electrode 12 is located at the uppermost step of the multi-step structure, and in the gate electrode 12, the overhanging portion is a portion closest to the drain electrode 4 and thus the largest electric field concentration occurs here. Due to the presence of the NiO layer 12a being the p-type oxide semiconductor formed on the overhanging portion, a lateral resistance of the overhanging portion increases and field intensity at a gate end is greatly alleviated. Consequently, the current collapse phenomenon is suppressed.

Further, in this embodiment, as part of the trench 11, a trench portion is also formed in the electron supply layer 2d, and the lowest portion of the gate electrode 12 is formed in the trench portion. This contributes to realizing a so-called normally-off operation in which no gate current passes during a power-off time, and also further alleviates the electric field concentration in the gate electrode 12.

As described above, according to this embodiment, a highly reliable AlGaN/GaN HEMT that fully suppresses the current collapse phenomenon even during the high-voltage operation and realizes a high withstand voltage and a high power is obtained.

Third Embodiment

Hereinafter, a MIS-type AlGaN/GaN HEMT according to a third embodiment will be described. Note that the same constituent members and so on as those of the AlGaN/GaN HEMT according to the first embodiment will be denoted by the same reference signs, and a detailed description thereof will be omitted.

Figure 5A:
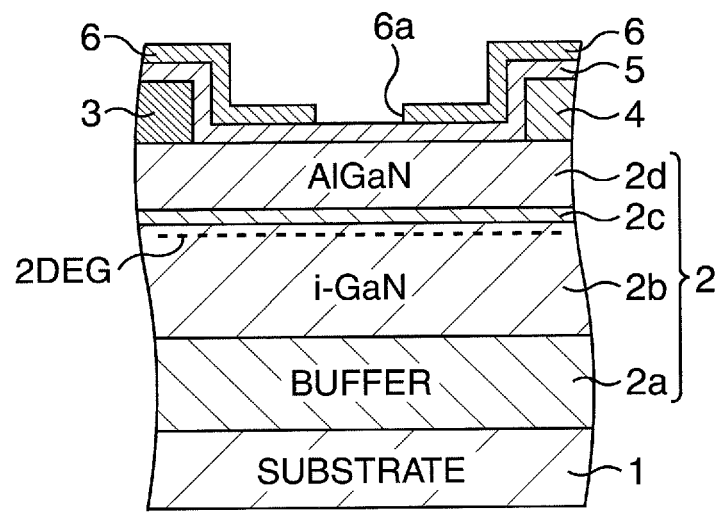
FIG. 5A and FIG. 5B are schematic cross-sectional views illustrating main processes in a method of manufacturing an AlGaN/GaN HEMT according to a third embodiment.
Figure 5B:
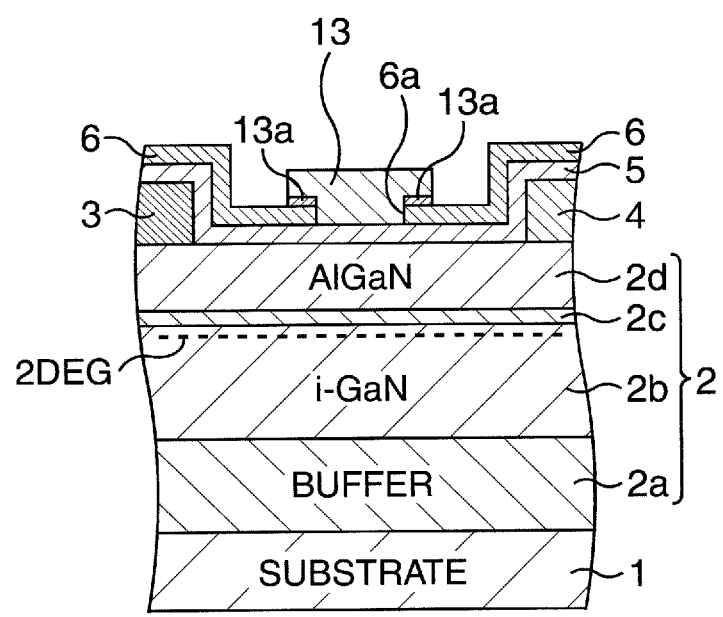

FIG. 5A and FIG. 5B are schematic cross-sectional views illustrating main processes in a method of manufacturing the AlGaN/GaN HEMT according to the third embodiment.

First, through the processes in FIG. 1A to FIG. 2A of the first embodiment, an opening 6a is formed in a SiON film 6 as illustrated in FIG. 5A.

Subsequently, as illustrated in FIG. 5B, a gate electrode 13 is formed.

As an electrode material, for example, Ni/Au (Ni for a lower layer and Au for an upper layer) are used. To form the electrode, an eaves-structure, double-layer resist suitable for a vapor deposition method and a liftoff method is used, for instance. This resist is applied on the SiON film 6 including the inside of the opening 6a, and consequently a resist mask having an opening at a predetermined gate electrode formation position including the opening 6a is formed. By using this resist mask, Ni/Au are deposited by, for example, the vapor deposition method. A thickness of Ni is about 30 nm and a thickness of Au is about 400 nm. By the liftoff method, the resist mask with the eaves structure and Ni/Au deposited thereon are removed. Consequently, the gate electrode 13 is formed on a compound semiconductor layer 2 via a SiN film 5 so as to fill the inside of the opening 6a with gate metal. The SiN film 5 is a passivation film and also functions as a gate insulating film.

The gate electrode 13 is formed in a so-called overhanging shape, using Ni filling the inside of the opening 6a and riding on the SiON film 6 and Au deposited on Ni. In the vicinity of the opening 6a of a surface of the SiON film 6, at a portion in contact with Ni of the gate electrode 13, oxygen of the SiON film 6 and Ni of the overhanging portion of the gate electrode 13 react with each other, so that a NiO layer 13a being a thin oxide film is formed.

Thereafter, through processes of electrical connection of a source electrode 3, a drain electrode 4, and the gate electrode 13 and so on, the MIS-type AlGaN/GaN HEMT is formed.

In this embodiment, the passivation film is formed as a stacked structure of the SiN film 5 not containing oxygen and the SiON film 6 containing oxygen. As the passivation film, an insulating film not containing oxygen with little interface state is suitable. A surface of a compound semiconductor layer 2 is directly covered by the SiN film 5 not containing oxygen, and the SiN film 5 mainly functions as a protection film. Being separated from the surface of the compound semiconductor layer 2 by the SiN film 5, the SiON film 6 containing oxygen might not affect this surface. The gate electrode 13 in the overhanging shape is formed so as to fill the inside of the opening 6a of the SiON film 6. In this structure, the gate electrode 13 is formed on the portion where it fills the opening 6a, and a gradually fanning out multi-step structure (here, double-step structure) of the overhanging portion, so that electric field concentration points during a high-voltage operation are dispersed.

Further, in this embodiment, oxygen of the SiON film 6 and Ni of the overhanging portion of the gate electrode 13 react with each other to form the NiO layer 13a. NiO functions as a p-type oxide semiconductor. The overhanging portion of the gate electrode 13 is located at the uppermost step of the multi-step structure, and in the gate electrode 13, the overhanging portion is a portion closest to the drain electrode 4 and thus the largest electric field concentration occurs here. Due to the presence of the NiO layer 13a being the p-type oxide semiconductor formed on the overhanging portion, a lateral resistance of the overhanging portion increases and field intensity at a gate end is greatly alleviated. Consequently, the current collapse phenomenon is suppressed.

Further, in this embodiment, in the passivation film with the double-layer structure, the SiN film 5 being the lower layer not only is the passivation film but also functions as the gate insulating film. In this structure, the step of forming the gate insulating film separately from the passivation film with the double-layer structure is curtailed and an intended MIS-type AlGaN/GaN HEMT is realized.

As described above, according to this embodiment, a highly reliable AlGaN/GaN HEMT that fully suppresses the current collapse phenomenon even during the high-voltage operation and realizes a high withstand voltage and a high power is obtained.

Fourth Embodiment

Hereinafter, a MIS-type AlGaN/GaN HEMT according to a fourth embodiment will be described. Note that the same constituent members and so on as those of the AlGaN/GaN HEMT according to the first embodiment will be denoted by the same reference signs, and a detailed description thereof will be omitted.

FIG. 6A to FIG. 6C and FIG. 7A to FIG. 7C are schematic cross-sectional views illustrating main processes in a method of manufacturing the AlGaN/GaN HEMT according to the fourth embodiment.

Figure 6A:
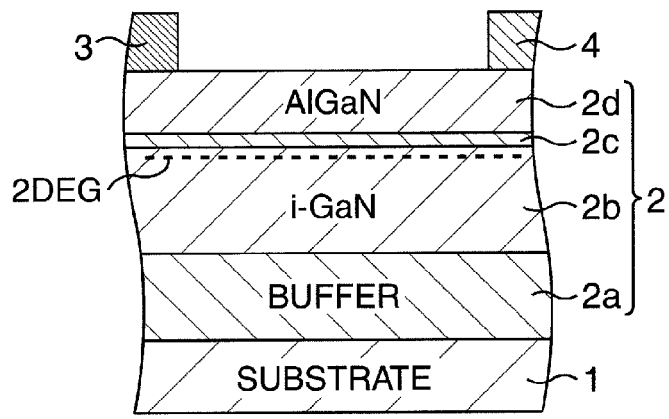
FIG. 6A to FIG. 6C are schematic cross-sectional views illustrating main processes in a method of manufacturing an AlGaN/GaN HEMT according to a fourth embodiment.

First, through the processes in FIG. 1A and FIG. 1B of the first embodiment, a source electrode 3 and a drain electrode 4 are formed on a compound semiconductor layer 2 as illustrated in FIG. 6A.

Figure 6B:
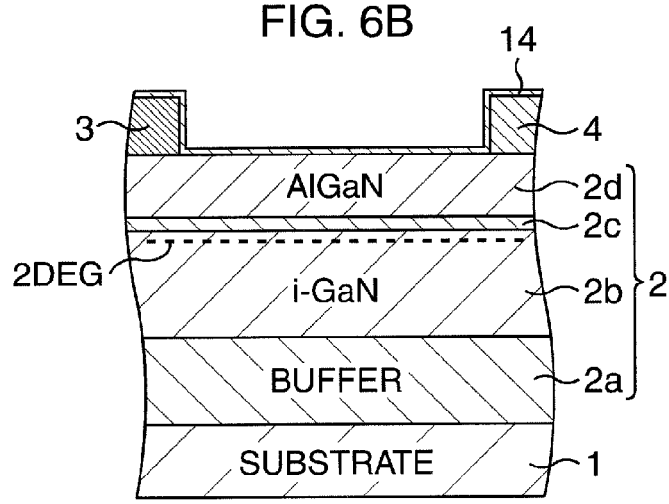

Subsequently, a gate insulating film 14 is formed as illustrated in FIG. 6B.

In more detail, as an insulating material, an insulator not containing oxygen, for example, AlN is deposited on the compound semiconductor layer 2. AlN is deposited to an about 2 nm to about 100 nm thickness, here for example, an about 10 nm thickness by, for example, an ALD (Atomic Layer Deposition) method. Consequently, the gate insulating film 14 is formed.

Incidentally, for the deposition of AlN, a plasma CVD method, a sputtering method, or the like, for instance, may be used instead of the ALD method. Further, instead of depositing AlN, a nitride of Al may be used. Besides, a nitride of Si, Hf, Zr, Ti, Ta, or W or a multilayer of appropriately selected ones out of these may be deposited to form the gate insulating film.

Figure 6C:
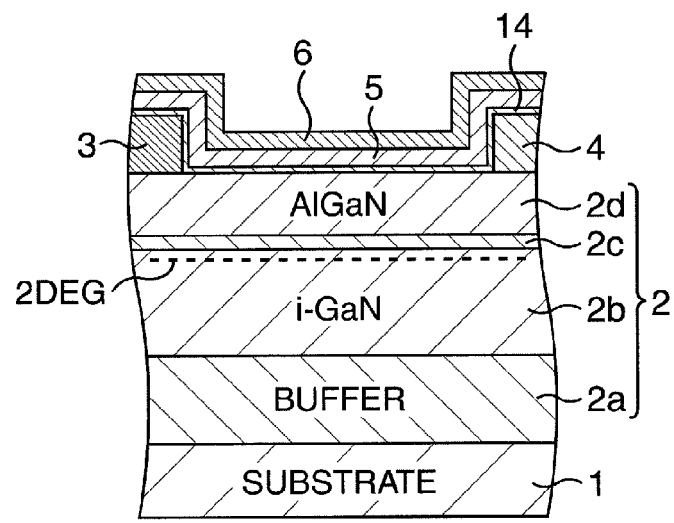

Subsequently, as illustrated in FIG. 6C, a passivation film protecting a surface of the compound semiconductor layer 2 is formed.

The passivation film has a stacked structure of a lower insulating film not containing oxygen, here, a $SiN(Si_3N_4)$ film 5 and an upper insulating film containing oxygen, here a SiON film 6.

In more detail, SiN is deposited on the gate insulating film 14 to, for example, an about 2 nm to about 200 nm thickness, for example, an about 20 nm thickness by a plasma CVD method, a sputtering method, or the like to form the SiN film 5. Subsequently, SiON is deposited on the SiN film 5 to, for example, an about 2 nm to about 200 nm thickness, for example, an about 20 nm thickness by a plasma CVD method, a sputtering method, or the like to form the SiON film 6. Consequently, the passivation film in which the SiN film 5 and the SiON film 6 are stacked is formed.

Figure 7A:
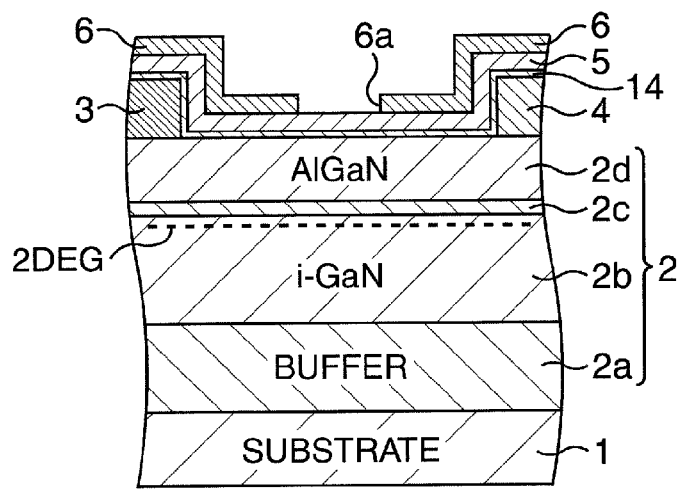
FIG. 7A to FIG. 7C, which are continued from FIG. 6A to FIG. 6C, are schematic cross-sectional views illustrating main processes in the method of manufacturing the AlGaN/GaN HEMT according to the fourth embodiment.

Subsequently, as illustrated in FIG. 7A, an opening 6a is formed in the SiON film 6.

In more detail, a resist is applied on the whole surface of the SiON film 6 and is processed by lithography. Consequently, a resist mask having an opening from which a predetermined gate electrode formation position of the SiON film 6 is exposed is formed.

By using this resist mask, the SiON film 6 is dry-etched with, for example, fluorine-based gas used as etching gas. At this time, a surface layer of the SiN film 5 may be slightly etched together with the SiON film 6. Consequently, the opening 6a is formed at the predetermined gate electrode formation position of the SiON film 6.

The resist mask is removed by ashing or wet processing using a predetermined chemical solution.

Figure 7B:
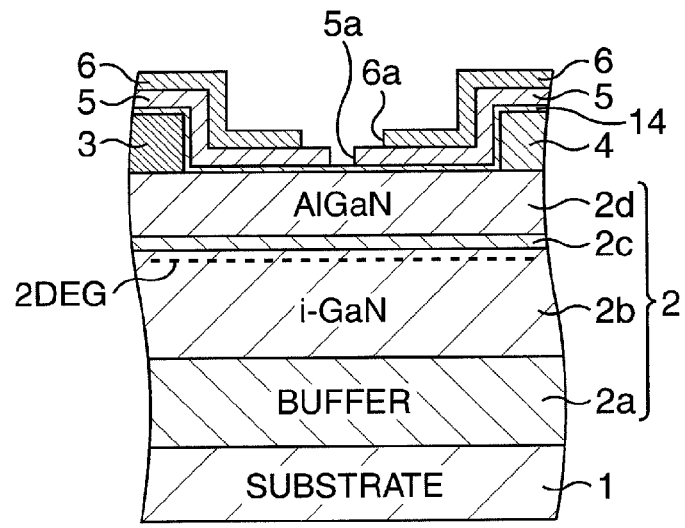

Subsequently, as illustrated in FIG. 7B, an opening 5a is formed in the SiN film 5.

In more detail, a resist is applied on the whole surface of the SiON film 6 including a region on the SiN film 5 exposed from the opening 6a and is processed by lithography. Consequently, a resist mask having an opening from which the predetermined gate electrode formation position of the SiN film 5 in the opening 6a is exposed is formed.

By using this resist mask, the SiN film 5 is dry-etched with, for example, fluorine-based gas used as etching gas. Consequently, the opening 5a is formed at the predetermined gate electrode formation position of the SiN film 5. The opening 6a of the SiON film 6 is wider than the opening 5a of the SiN film 5. The openings 5a, 6a communicate with each other, so that an opening where to form the gate electrode is formed.

The resist mask is removed by ashing or wet processing using a predetermined chemical solution.

Figure 7C:
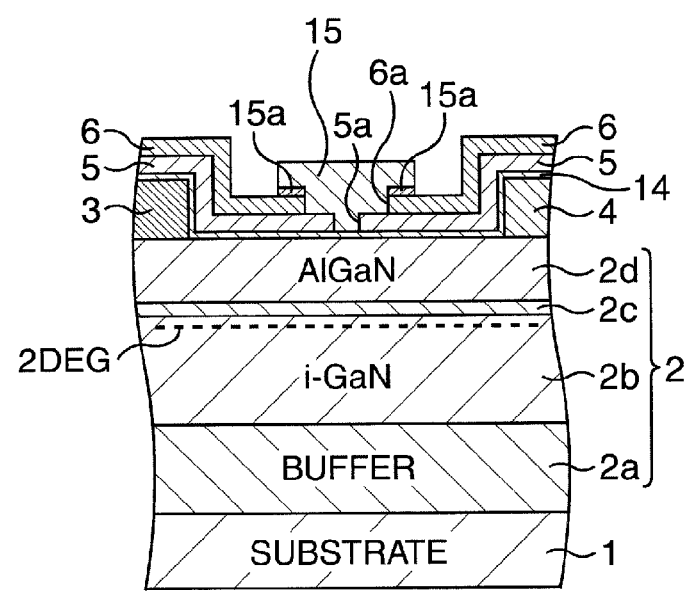

Subsequently, as illustrated in FIG. 7C, the gate electrode 15 is formed.

As an electrode material, for example, Ni/Au (Ni for a lower layer and Au for an upper layer) are used. To form the electrode, an eaves-structure, double-layer resist suitable for a vapor deposition method and a liftoff method is used, for instance. This resist is applied on the SiON film 6 including the inside of the openings 5a, 6a, and consequently a resist mask having an opening at the predetermined gate electrode formation position including the openings 5a, 6a is formed. By using this resist mask, Ni/Au are deposited by, for example, the vapor deposition method. A thickness of Ni is about 30 nm and a thickness of Au is about 400 nm. By the liftoff method, the resist mask with the eaves structure and Ni/Au deposited thereon are removed. Consequently, the gate electrode 15 is formed on the compound semiconductor layer 2 via the gate insulating film 14 so as to fill the openings 5a, 6a with gate metal.

The gate electrode 15 is formed in a so-called overhanging shape, using Ni filling the inside of the openings 5a, 6a and riding on the SiON film 6 and Au deposited on Ni. In the vicinity of the opening 6a of the surface of the SiON film 6, at a portion in contact with Ni of the gate electrode 15, oxygen of the SiON film 6 and Ni of the overhanging portion of the gate electrode 15 react with each other, so that a NiO layer 15a being a thin oxide film is formed.

Thereafter, through processes of electrical connection of a source electrode 3, a drain electrode 4, and the gate electrode 15 and so on, the MIS-type AlGaN/GaN HEMT is formed.

In this embodiment, the passivation film is formed as a stacked structure of the SiN film 5 not containing oxygen and the SiON film 6 containing oxygen. As the passivation film, an insulating film not containing oxygen with little interface state is suitable and the SiN film 5 together with the gate insulating film 14 of AlN mainly functions as a protection film. Being separated from the surface of the compound semiconductor layer 2 by the gate insulating film 14 and the SiN film 5, the SiON film 6 containing oxygen might not affect this surface. The opening 5a of the SiN film 5 and the opening 6a of the SiON film 6 wider than the opening 5a communicate with each other, and the gate electrode 15 in the overhanging shape is formed so as to fill the inside of an opening made up of the openings 5a, 6a. In this structure, the gate electrode 15 is formed on the portion where it fills the opening 5a, the portion where it fills the opening 6a, and a gradually fanning out multi-step structure (here, triple-step structure) of the overhanging portion, so that electric field concentration points during a high-voltage operation are dispersed.

Further, in this embodiment, oxygen of the SiON film 6 and Ni of the overhanging portion of the gate electrode 15 react with each other to form the NiO layer 15a. NiO functions as a p-type oxide semiconductor. The overhanging portion of the gate electrode 15 is located at the uppermost step of the multi-step structure, and in the gate electrode 15, the overhanging portion is a portion closest to the drain electrode 4 and thus the largest electric field concentration occurs here. Due to the presence of the NiO layer 15a being the p-type oxide semiconductor formed on the overhanging portion, a lateral resistance of the overhanging portion increases and field intensity at a gate end is greatly alleviated. Consequently, the current collapse phenomenon is suppressed.

Further, in this embodiment, the gate insulating film 14 not only is the gate insulating film but also functions as the passivation film, and an intended MIS-type AlGaN/GaN HEMT is realized.

As described above, according to this embodiment, a highly reliable AlGaN/GaN HEMT that fully suppresses the current collapse phenomenon even during the high-voltage operation and realizes a high withstand voltage and a high power is obtained.

Fifth Embodiment

Hereinafter, a MIS-type AlGaN/GaN HEMT according to a fifth embodiment will be described. Note that the same constituent members and so on as those of the AlGaN/GaN HEMT according to the first embodiment will be denoted by the same reference signs, and a detailed description thereof will be omitted.

FIG. 8A to FIG. 8C and FIG. 9A to FIG. 9C are schematic cross-sectional views illustrating main processes in a method of manufacturing the AlGaN/GaN HEMT according to the fifth embodiment.

First, through the processes in FIG. 1A and FIG. 1B of the first embodiment, a source electrode 3 and a drain electrode 4 are formed on a compound semiconductor layer 2.

Figure 8A:
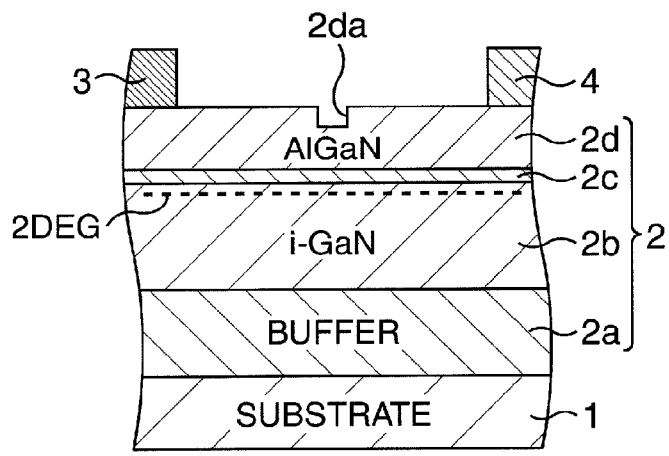
FIG. 8A to FIG. 8C are schematic cross-sectional views illustrating main processes in a method of manufacturing an AlGaN/GaN HEMT according to a fifth embodiment.

Subsequently, a trench 2da is formed in an electron supply layer 2d as illustrated in FIG. 8A.

In more detail, a resist is applied on the electron supply layer 2d and is processed by lithography. Consequently, a resist mask having an opening from which a predetermined gate electrode formation position of the electron supply layer 2d is exposed is formed.

By using this resist mask, a surface layer of the electron supply layer 2d is dry-etched with, for example, fluorine-based gas used as etching gas. Consequently, the trench 2da is formed at the predetermined gate electrode formation position in the surface layer of the electron supply layer 2d.

The resist mask is removed by ashing or wet processing using a predetermined chemical solution.

Figure 8B:
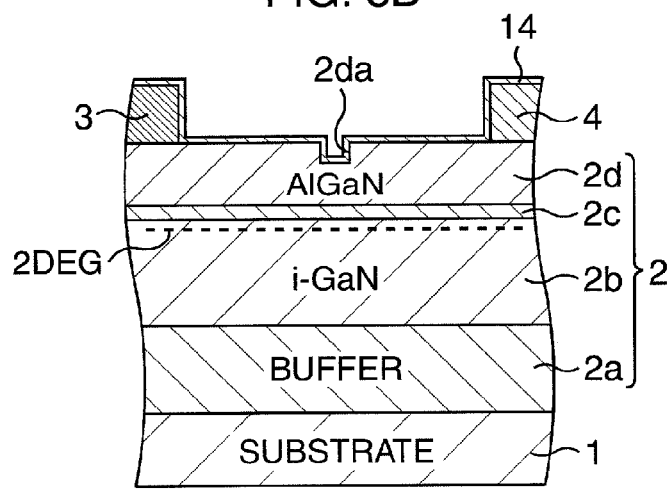

Subsequently, a gate insulating film 14 is formed as illustrated in FIG. 8B.

In more detail, as an insulating material, an insulator not containing oxygen, for example, AlN is deposited on the compound semiconductor layer 2 including an inner wall surface of the trench 2da. AlN is deposited to an about 2 nm to about 100 nm thickness, here for example, an about 10 nm thickness by, for example, an ALD (Atomic Layer Deposition) method. Consequently, the gate insulating film 14 is formed.

Incidentally, for the deposition of AlN, a plasma CVD method, a sputtering method, or the like, for instance, may be used instead of the ALD method. Further, instead of depositing AlN, a nitride of Al may be used. Besides, a nitride of Si, Hf, Zr, Ti, Ta, or W or a multilayer of appropriately selected ones out of these may be deposited to form the gate insulating film.

Figure 8C:
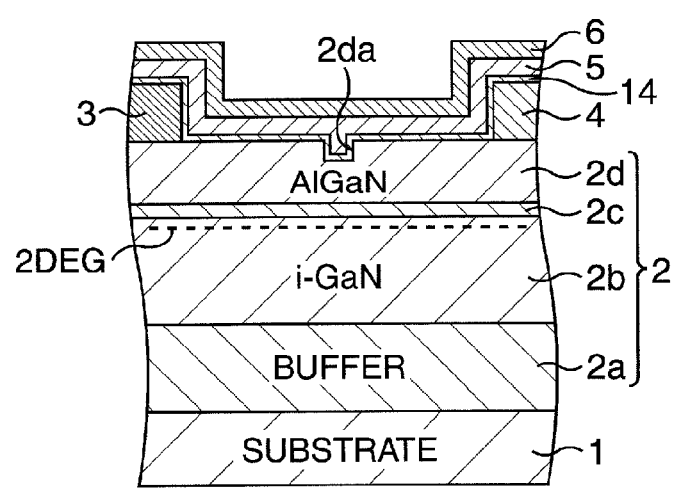

Subsequently, as illustrated in FIG. 8C, a passivation film protecting a surface of the compound semiconductor layer 2 is formed.

The passivation film has a stacked structure of a lower insulating film not containing oxygen, here, a $SiN(Si_3N_4)$ film 5 and an upper insulating film containing oxygen, here a SiON film 6.

In more detail, SiN is deposited on the gate insulating film 14 to, for example, an about 2 nm to about 200 nm thickness, for example, an about 20 nm thickness by a plasma CVD method, a sputtering method, or the like to form the SiN film 5. Subsequently, SiON is deposited on the SiN film 5 to, for example, an about 2 nm to about 200 nm thickness, for example, an about 20 nm thickness by a plasma CVD method, a sputtering method, or the like to form the SiON film 6. Consequently, the passivation film in which the SiN film 5 and the SiON film 6 are stacked is formed.

Figure 9A:
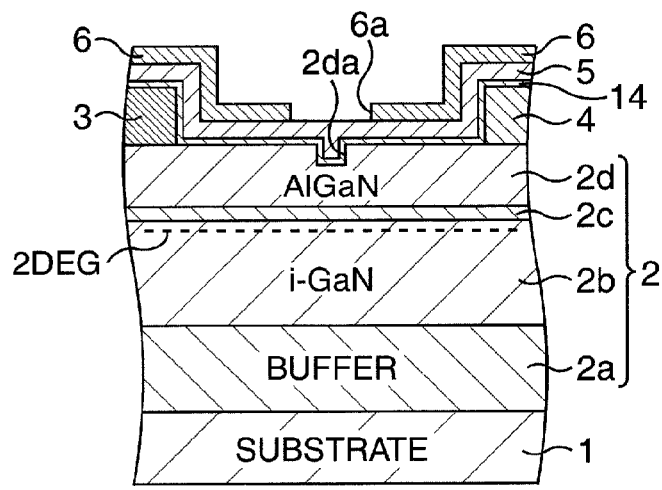
FIG. 9A to FIG. 9C, which are continued from FIG. 8A to FIG. 8C, are schematic cross-sectional views illustrating main processes in the method of manufacturing the AlGaN/GaN HEMT according to the fifth embodiment.

Subsequently, as illustrated in FIG. 9A, an opening 6a is formed in the SiON film 6.

In more detail, a resist is applied on the whole surface of the SiON film 6 and is processed by lithography. Consequently, a resist mask having an opening from which the predetermined gate electrode formation position of the SiON film 6 is exposed is formed.

By using this resist mask, the SiON film 6 is dry-etched with, for example, fluorine-based gas used as etching gas. At this time, a surface layer of the SiN film 5 may be slightly etched together with the SiON film 6. Consequently, the opening 6a is formed at the predetermined gate electrode formation position of the SiON film 6. The opening 6a is wider than the trench 2da of the electron supply layer 2d.

The resist mask is removed by ashing or wet processing using a predetermined chemical solution.

Figure 9B:
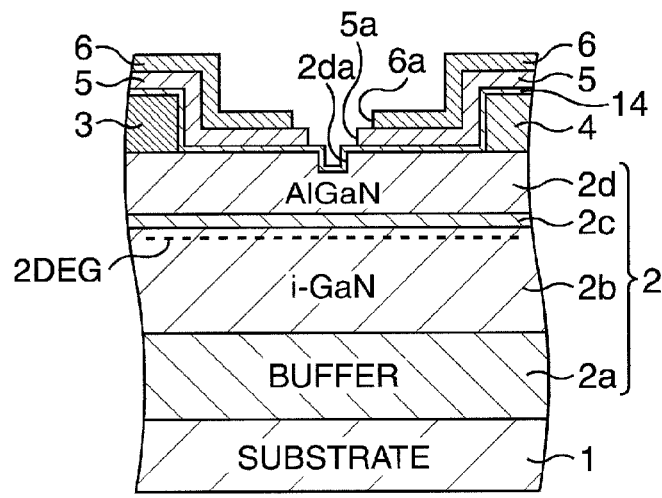

Subsequently, as illustrated in FIG. 9B, an opening 5a is formed in the SiN film 5.

In more detail, a resist is applied on the whole surface of the SiON film 6 including a region on the SiN film 5 exposed from the opening 6a and is processed by lithography. Consequently, a resist mask having an opening from which the predetermined gate electrode formation position of the SiN film 5 in the opening 6a is exposed is formed.

By using this resist mask, the SiN film 5 is dry-etched with, for example, fluorine-based gas used as etching gas. Consequently, the opening 5a is formed at the predetermined gate electrode formation position of the SiN film 5. The opening 6a of the SiON film 6 is wider than the opening 5a of the SiN film 5. The trench 2da and the openings 5a, 6a communicate with one another via the gate insulating film 14, so that an electrode trench where to form the gate electrode is formed.

The resist mask is removed by ashing or wet processing using a predetermined chemical solution.

Figure 9C:
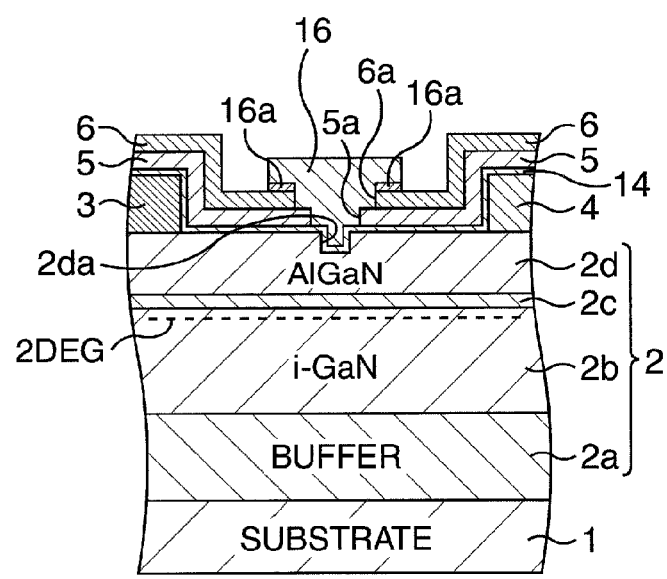

Subsequently, as illustrated in FIG. 9C, the gate electrode 16 is formed.

As an electrode material, for example, Ni/Au (Ni for a lower layer and Au for an upper layer) are used. To form the electrode, an eaves-structure, double-layer resist suitable for a vapor deposition method and a liftoff method is used, for instance. This resist is applied on the SiON film 6 including the inside of the openings 5a, 6a, and consequently a resist mask having an opening at the predetermined gate electrode formation position including the electrode trench is formed. By using this resist mask, Ni/Au are deposited by, for example, the vapor deposition method. A thickness of Ni is about 30 nm and a thickness of Au is about 400 nm. By the liftoff method, the resist mask with the eaves structure and Ni/Au deposited thereon are removed. Consequently, the gate electrode 16 is formed on the compound semiconductor layer 2 via the gate insulating film 14 so as to fill the electrode trench with gate metal.

The gate electrode 16 is formed in a so-called overhanging shape, using Ni filling the inside of the trench 2da and the openings 5a, 6a with the gate insulating film 14 therebetween and riding on the SiON film 6 and Au deposited on Ni. In the vicinity of the opening 6a of the surface of the SiON film 6, at a portion in contact with N of the gate electrode 16, oxygen of the SiON film 6 and Ni of the overhanging portion of the gate electrode 16 react with each other, so that a NiO layer 16a being a thin oxide film is formed.

Thereafter, through processes of electrical connection of the source electrode 3, the drain electrode 4, and the gate electrode 16, and so on, the MIS-type AlGaN/GaN HEMT is formed.

In this embodiment, the passivation film is formed as a stacked structure of the SiN film 5 not containing oxygen and the SiON film 6 containing oxygen. As the passivation film, an insulating film not containing oxygen with little interface state is suitable and the SiN film 5 together with the gate insulating film 14 of AlN mainly functions as a protection film. Being separated from the surface of the compound semiconductor layer 2 by the gate insulating film 14 and the SiN film 5, the SiON film 6 containing oxygen might not affect this surface. The trench 2da of the electrode supply layer 2d, the opening 5a of the SiN film 5, and the opening 6a of the SiON film 6 wider than the opening 5a communicate with one another, and the gate electrode 16 in the overhanging shape is formed so as to fill the inside of the electrode trench made up of the trench 2da and the openings 5a, 6a. In this structure, the gate electrode 16 is formed on the portion where it fills the trench 2da via the gate insulating film 14, the portion where it fills the opening 5a, the portion where it fills the opening 6a, and a gradually fanning out multi-step structure (here, four-step structure) of the overhanging portion, so that electric field concentration points during a high-voltage operation are dispersed.

Further, in this embodiment, oxygen of the SiON film 6 and Ni of the overhanging portion of the gate electrode 16 react with each other to form the NiO layer 16a. NiO functions as a p-type oxide semiconductor. The overhanging portion of the gate electrode 16 is located at the uppermost step of the multi-step structure, and in the gate electrode 16, the overhanging portion is a portion closest to the drain electrode 4 and thus the largest electric field concentration occurs here. Due to the presence of the NiO layer 16a being the p-type oxide semiconductor formed on the overhanging portion, a lateral resistance of the overhanging portion increases and field intensity at a gate end is greatly alleviated. Consequently, the current collapse phenomenon is suppressed.

Further, in this embodiment, the trench 2da is formed in the electrode supply layer 2d and the lowest portion of the gate electrode 16 is formed on the trench portion. This contributes to realizing a so-called normally-off operation where no gate current passes during a power-off time and further alleviates the electric field concentration in the gate electrode 16.

Further, in this embodiment, the gate insulating film 14 not only is the gate insulating film but also functions as the passivation film, and an intended MIS-type AlGaN/GaN HEMT is realized.

As described above, according to this embodiment, a highly reliable AlGaN/GaN HEMT that fully suppresses the current collapse phenomenon even during the high-voltage operation and realizes a high withstand voltage and a high power is obtained.

Sixth Embodiment

This embodiment discloses a Schottky-type AlGaN/GaN HEMT as a compound semiconductor device. Note that the same constituent members and so on as those of the AlGaN/GaN HEMT according to the first embodiment will be denoted by the same reference signs, and a detailed description thereof will be omitted.

FIG. 10A to FIG. 10C and FIG. 11A and FIG. 11B are schematic cross-sectional views illustrating main processes in a method of manufacturing the AlGaN/GaN HEMT according to the sixth embodiment.

Figure 10A:
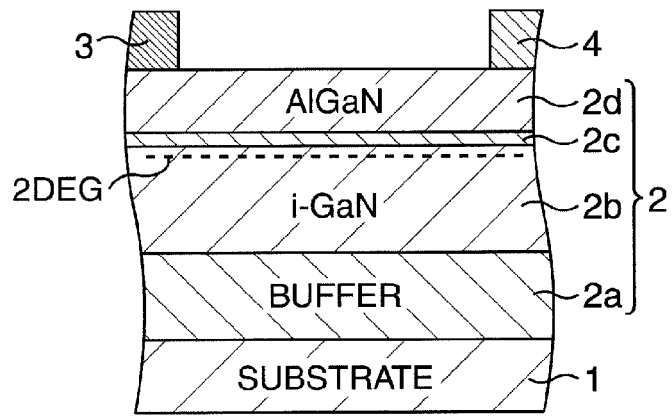
FIG. 10A to FIG. 10C are schematic cross-sectional views illustrating main processes in a method of manufacturing an AlGaN/GaN HEMT according to a sixth embodiment.

First, through the processes in FIG. 1A and FIG. 1B of the first embodiment, a source electrode 3 and a drain electrode 4 are formed on a compound semiconductor layer 2 as illustrated in FIG. 10A.

Figure 10B:
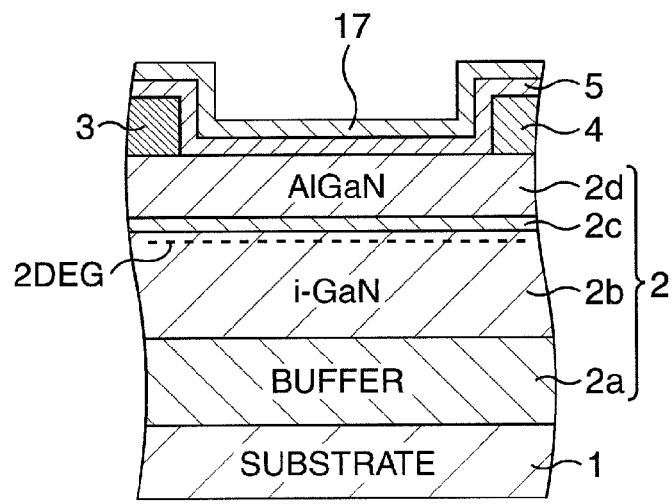

Subsequently, as illustrated in FIG. 10B, a passivation film protecting a surface of the compound semiconductor layer 2 is formed.

The passivation film has a stacked structure of a lower insulating film not containing oxygen, here, a SiN($Si_3N_4$) film 5 and an upper insulating film containing oxygen, here a NiO film 17.

In more detail, SiN is deposited on the whole surface of the compound semiconductor layer 2 to, for example, an about 2 nm to about 200 nm thickness, for example, an about 20 nm thickness by a plasma CVD method, a sputtering method, or the like, to form the SiN film 5. Subsequently, NiO is deposited on the SiN film 5 to, for example, an about 2 nm to about 200 nm thickness, for example, to an about 20 nm thickness by a sputtering method or the like, to form the NiO film 17. Through the above processes, the passivation film in which the SiN film 5 and the NiO film 17 are stacked is formed.

Figure 10C:
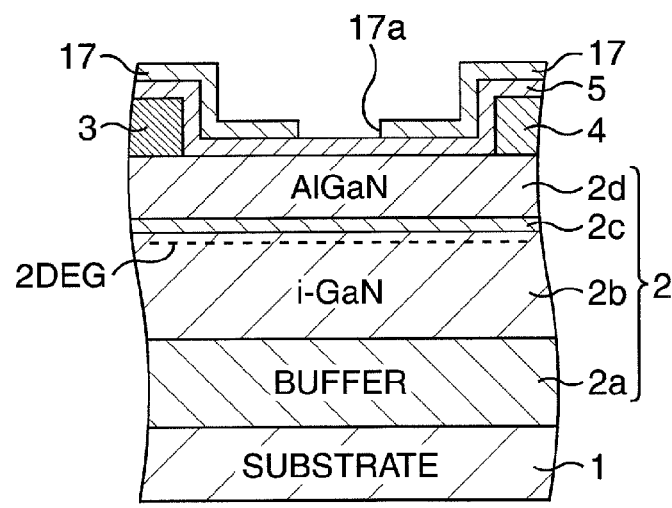

Subsequently, as illustrated in FIG. 10C, an opening 17a is formed in the NiO film 17.

In more detail, a resist is applied on the whole surface of the NiO film 17 and is processed by lithography. Consequently, a resist mask having an opening from which a predetermined gate electrode formation position of the NiO film 17 is exposed is formed.

By using this resist mask, the NiO film 17 is dry-etched with, for example, fluorine-based gas used as etching gas. At this time, a surface layer of the SiN film 5 may be slightly etched together with the NiO film 17. Consequently, the opening 17a is formed at the predetermined gate electrode formation position of the NiO film 17.

The resist mask is removed by ashing or wet processing using a predetermined chemical solution.

Figure 11A:
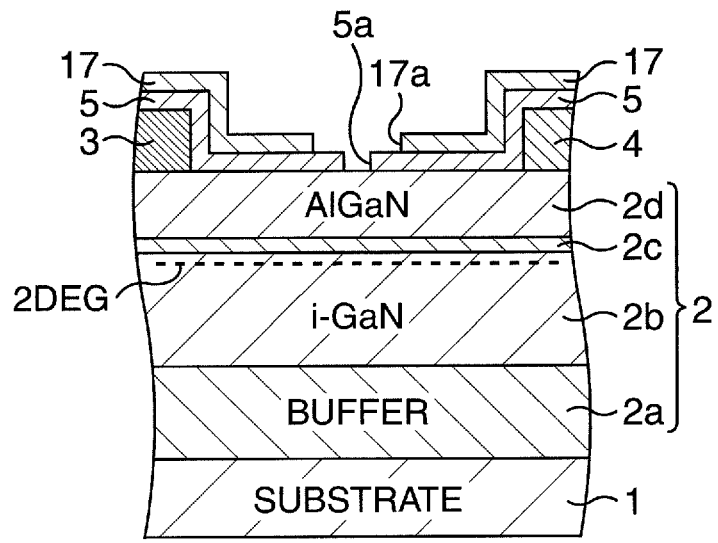
FIG. 11A and FIG. 11B, which are continued from FIG. 10A to FIG. 10C, are schematic cross-sectional views illustrating main processes in the method of manufacturing the AlGaN/GaN HEMT according to the sixth embodiment.

Subsequently, as illustrated in FIG. 11A, an opening 5a is formed in the SiN film 5.

In more detail, a resist is applied on the whole surface of the NiO film 17 including a region on the SiN film 5 exposed from the opening 17a and is processed by lithography. Consequently, a resist mask having an opening from which the predetermined gate electrode formation position of the SiN film 5 in the opening 17a is exposed is formed.

By using this resist mask, the SiN film 5 is dry-etched with, for example, fluorine-based gas used as etching gas. Consequently, the opening 5a is formed at the predetermined gate electrode formation position of the SiN film 5. The opening 17a of the NiO film 17 is wider than the opening 5a of the SiN film 5. The openings 5a, 17a communicate with each other, so that an opening where to form the gate electrode is formed.

The resist mask is removed by ashing or wet processing using a predetermined chemical solution.

Figure 11B:
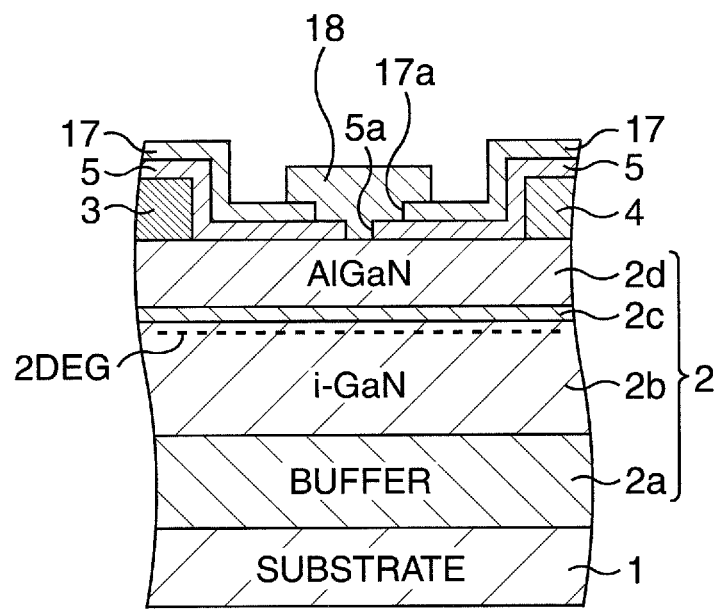

Subsequently, as illustrated in FIG. 11B, a gate electrode 18 is formed.

As an electrode material, for example, Ni/Au (Ni for a lower layer and Au for an upper layer) are used. To form the electrode, an eaves-structure, double-layer resist suitable for a vapor deposition method and a liftoff method is used, for instance. This resist is applied on the NiO film 17 including the inside of the openings 5a, 17a, and consequently a resist mask having an opening at the predetermined gate electrode formation position including the openings 5a, 17a is formed. By using this resist mask, Ni/Au are deposited by, for example, the vapor deposition method. A thickness of Ni is about 30 nm and a thickness of Au is about 400 nm. By the liftoff method, the resist mask with the eaves structure and Ni/Au deposited thereon are removed. Consequently, the gate electrode 18 in Schottky contact with the surface of the compound semiconductor layer 2 is formed so as to fill the inside of the openings 5a, 17a with gate metal.

The gate electrode 18 is formed in a so-called overhanging shape, using Ni filling the inside of the openings 5a, 17a and riding on the NiO film 17 and Au deposited on Ni.

Thereafter, through the processes of electrical connection of the source electrode 3, the drain electrode 4, and the gate electrode 18, and so on, the Schottky-type AlGaN/GaN HEMT is formed.

In this embodiment, the passivation film is formed as a stacked structure of the SiN film 5 not containing oxygen and the NiO film 17 containing oxygen. As the passivation film, an insulating film not containing oxygen with little interface state is suitable. The surface of the compound semiconductor layer 2 to be a Schottky surface is directly covered by the SiN film 5 not containing oxygen, and the SiN film 5 mainly functions as a protection film. Being separated from the Schottky surface by the SiN film 5, the NiO film 17 might not affect the Schottky surface. The opening 5a of the SiN film 5 and the opening 17a of the NiO film 17 wider than the opening 5a communicate with each other, and the gate electrode 18 in the overhanging shape is formed so as to fill the inside of an opening made up of the openings 5a, 17a. In this structure, the gate electrode 18 is formed on the portion where it fills the opening 5a, the portion where it fills the opening 17a, and a gradually fanning out multi-step structure (here, triple-step structure) of the overhanging portion, so that electric field concentration points during a high-voltage operation are dispersed.

Further, in this embodiment, the NiO film 17 is in contact with a lower surface of Ni at the overhanging portion. NiO functions as a p-type oxide semiconductor. The overhanging portion of the gate electrode 18 is located at the uppermost step of the multi-step structure, and in the gate electrode 18, the overhanging portion is a portion closest to the drain electrode 4 and thus the largest electric field concentration occurs here. Due to the presence of NiO being the p-type oxide semiconductor in contact with the overhanging portion, a lateral resistance of the overhanging portion increases and field intensity at a gate end is greatly alleviated. Consequently, the current collapse phenomenon is suppressed.

As described above, according to this embodiment, a highly reliable AlGaN/GaN HEMT that fully suppresses the current collapse phenomenon even during the high-voltage operation and realizes a high withstand voltage and a high power is obtained.

Seventh Embodiment

Hereinafter, a Schottky-type AlGaN/GaN HEMT according to a seventh embodiment will be described. Note that the same constituent members and so on as those of the AlGaN/GaN HEMT according to the first embodiment will be denoted by the same reference signs, and a detailed description thereof will be omitted.

FIG. 12A and FIG. 12B, and FIG. 13A and FIG. 13B are cross-sectional views illustrating main processes in a method of manufacturing the AlGaN/GaN HEMT according to the seventh embodiment.

Figure 12A:
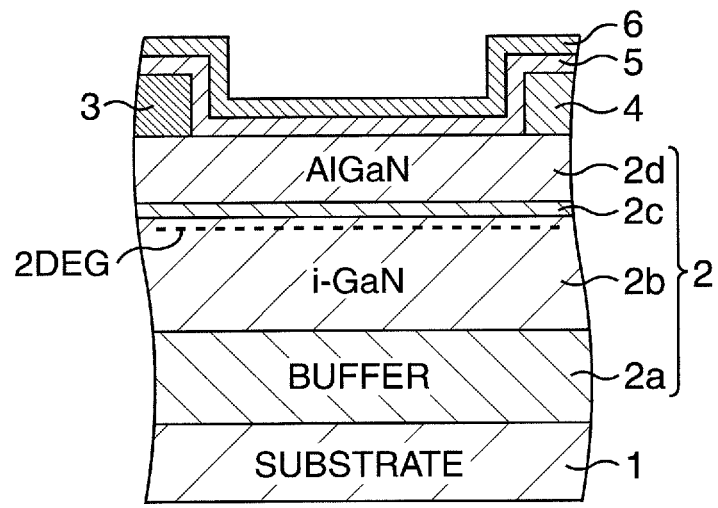
FIG. 12A and FIG. 12B are schematic cross-sectional views illustrating main processes in a method of manufacturing an AlGaN/GaN HEMT according to a seventh embodiment.

First, through the processes in FIG. 1A to FIG. 1C of the first embodiment, a SiN film 5 and a SiON film 6 are formed as illustrated in FIG. 12A.

Figure 12B:
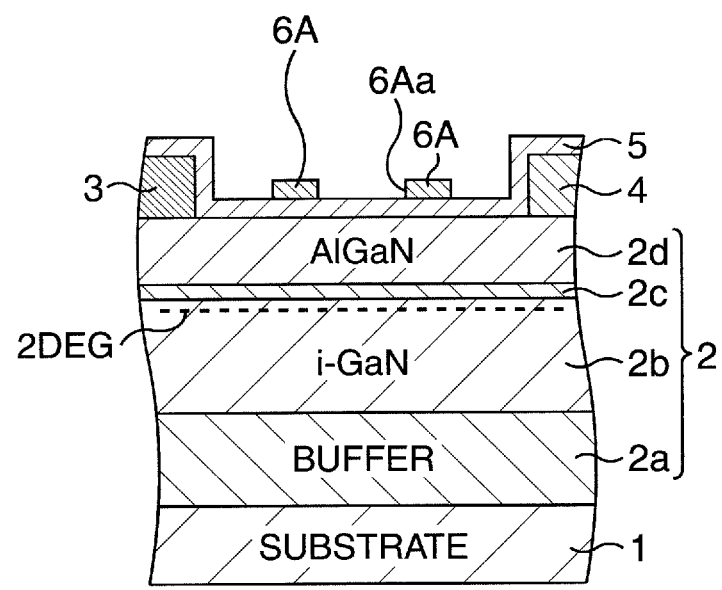

Subsequently, as illustrated in FIG. 12B, the SiON film 6 is processed to form a SiON piece 6A having an opening 6Aa.

In more detail, a resist is applied on the whole surface of the SiON film 6, and is processed by lithography. Consequently, a resist mask in a band shape covering only the vicinity of a predetermined gate electrode formation position of the SiON film 6 is formed.

By using this resist mask, the SiON film 6 is dry-etched with, for example, fluorine-based gas used as etching gas. At this time, a surface layer of the SiN film 5 together with the SiON film 6 may be slightly etched. Consequently, there remains the SiON film 6 in the band shape covering only the vicinity of the predetermined gate electrode formation position and having the opening 6Aa at the predetermined gate electrode formation position, and the SiON piece 6A is formed.

The resist mask is removed by ashing or wet processing using a predetermined chemical solution.

Figure 13A:
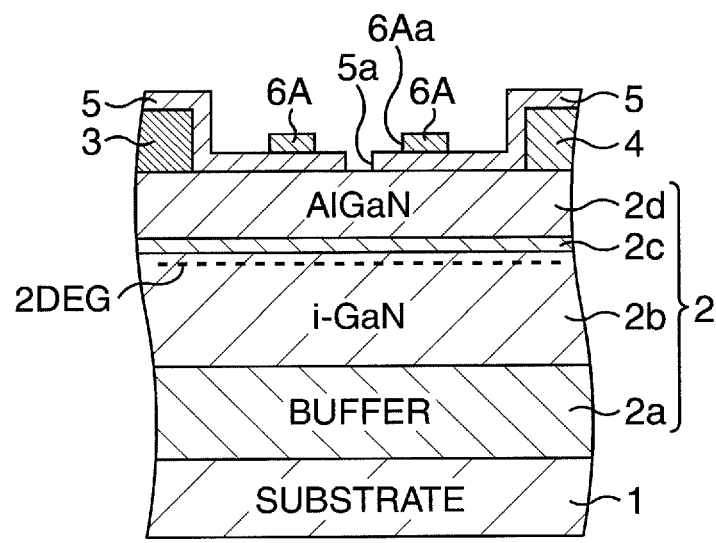
FIG. 13A and FIG. 13B, which are continued from FIG. 12A and FIG. 12B, are schematic cross-sectional views illustrating main processes in the method of manufacturing the AlGaN/GaN HEMT according to the seventh embodiment.

Subsequently, an opening 5a is formed in the SiN film 5 as illustrated in FIG. 13A.

In more detail, a resist is applied on the whole surface of the SiN film 5 including an upper portion of the SiON piece 6A, and is processed by lithography. Consequently, a resist mask having an opening from which the predetermined gate electrode formation position of the SiN film 5 in the opening 6Aa is exposed is formed.

By using this resist mask, the SiN film 5 is dry-etched with, for example, fluorine-based gas used as etching gas. Consequently, the opening 5a is formed at the predetermined gate electrode formation position of the SiN film 5. The opening 6Aa of the SiON piece 6A is wider than the opening 5a of the SiN film 5. The openings 5a, 6Aa communicate with each other, so that an opening where to form the gate electrode is formed.

The resist mask is removed by ashing or wet processing using a predetermined chemical solution.

Figure 13B:
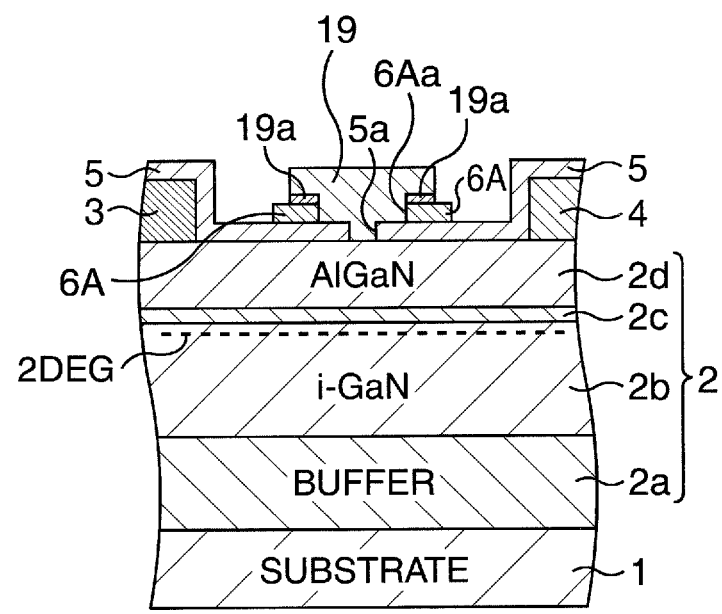

Subsequently, as illustrated in FIG. 13B, the gate electrode 19 is formed.

As an electrode material, for example, Ni/Au (Ni for a lower layer and Au for an upper layer) are used. To form the electrode, an eaves-structure, double-layer resist suitable for a vapor deposition method and a liftoff method is used, for instance. This resist is applied on the SiON piece 6A including the inside of the openings 5a, 6Aa and on the SiN film 5, and a resist mask having an opening at the predetermined gate electrode formation position including the openings 5a, 6Aa is formed. By using this resist mask, Ni/Au are deposited by, for example, the vapor deposition method. A thickness of Ni is about 30 nm and a thickness of Au is about 400 nm. By the liftoff method, the resist mask with the eaves structure and Ni/Au deposited thereon are removed. Consequently, the gate electrode 19 in Schottky contact with a surface of a compound semiconductor layer 2 is formed so as to fill the inside of the openings 5a, 6Aa with gate metal.

The gate electrode 19 is formed in a so-called overhanging shape, using Ni filling the inside of the openings 5a, 6Aa and riding on the SiON piece 6A and Au deposited on Ni. At a portion, of the SiON piece 6A, in contact with Ni of the gate electrode 19, oxygen of the SiON piece 6A and Ni of the overhanging portion of the gate electrode 19 react with each other, so that a NiO layer 19a being a thin oxide film is formed.

Thereafter, through processes of electrical connection of a source electrode 3, a drain electrode 4, and the gate electrode 19, and so on, the Schottky-type AlGaN/GaN HEMT is formed.

In this embodiment, a passivation film is formed in which the SiON piece 6A containing oxygen is formed on the SiN film 5 not containing oxygen. As the passivation film, an insulating film not containing oxygen with little interface state is suitable. The surface of the compound semiconductor layer 2 to be a Schottky surface is directly covered by the SiN film 5 not containing oxygen, and the SiN film 5 mainly functions as a protection film. Being separated from the Schottky surface by the SiN film 5, the SiON piece 6A containing oxygen might not affect the Schottky surface. The opening 5a of the SiN film 5 and the opening 6Aa of the SiON piece 6A wider than the opening 5a communicate with each other, and the gate electrode 19 in the overhanging shape is formed so as to fill the inside of an opening made up of the openings 5a, 6Aa. In this structure, the gate electrode 19 is formed on the portion where it fills the opening 5a, the portion where it fills the opening 6Aa, and a gradually fanning out multi-step structure (here, triple-step structure) of the overhanging portion, so that electric field concentration points during a high-voltage operation are dispersed.

Further, in this embodiment, oxygen of the SiON piece 6A and Ni of the overhanging portion of the gate electrode 19 react with each other to form the NiO layer 19a. NiO functions as a p-type oxide semiconductor. The overhanging portion of the gate electrode 19 is located at the uppermost step of the multi-step structure, and in the gate electrode 19, the overhanging portion is a portion closest to the drain electrode 4 and thus the largest electric field concentration occurs here. Due to the presence of the NiO layer 19a being the p-type oxide semiconductor formed on the overhanging portion, a lateral resistance of the overhanging portion increases and field intensity at a gate end is greatly alleviated. Consequently, the current collapse phenomenon is suppressed.

Further, in this embodiment, on the SiN film 5, the SiON piece 6A covers only the vicinity of the overhanging portion of the gate electrode 19 and is the residue of SiON in the band shape having the opening 6Aa, and all SiON is removed except at a portion of the gate end. Consequently, a component of a leakage current via SiON and an interface of SiON/SiN and a capacitance component are greatly reduced.

As described above, according to this embodiment, a highly reliable AlGaN/GaN HEMT that fully suppresses the current collapse phenomenon even during the high-voltage operation and realizes a high withstand voltage and a high power is obtained.

Eighth Embodiment

Hereinafter, a Schottky-type AlGaN/GaN HEMT according to an eighth embodiment will be described. Note that the same constituent members and so on as those of the AlGaN/GaN HEMT according to the first embodiment will be denoted by the same reference signs, and a detailed description thereof will be omitted.

FIG. 14A to FIG. 14C, and FIG. 15A and FIG. 15B are schematic cross-sectional views illustrating main processes in a method of manufacturing the AlGaN/GaN HEMT according to the eighth embodiment.

Figure 14A:
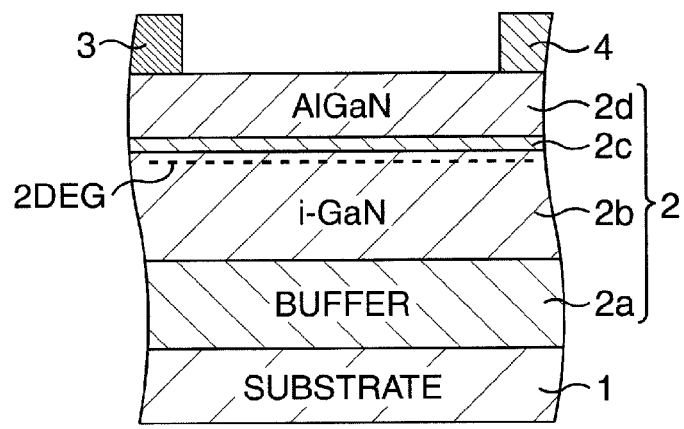
FIG. 14A to FIG. 14C are schematic cross-sectional views illustrating main processes in a method of manufacturing an AlGaN/GaN HEMT according to an eighth embodiment.

First, through the processes in FIG. 1A and FIG. 1B of the first embodiment, a source electrode 3 and a drain electrode 4 are formed on a compound semiconductor layer 2 as illustrated in FIG. 14A.

Figure 14B:
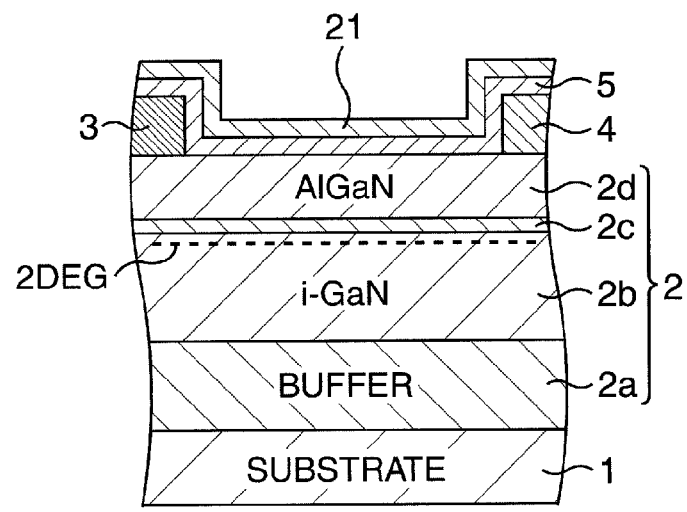

Subsequently, a passivation film protecting a surface of the compound semiconductor layer 2 is formed as illustrated in FIG. 14B.

The passivation film has a stacked structure of a lower insulating film not containing oxygen, here, a SiN($Si_3N_4$) film 5 and an upper insulating film containing oxygen, here a NiO film 21.

In more detail, SiN is deposited on the whole surface of the compound semiconductor layer 2 to, for example, an about 2 nm to about 200 nm thickness, for example, an about 20 nm thickness by a plasma CVD method, a sputtering method, or the like to form the SiN film 5. Subsequently, NiO is deposited on the SiN film 5 to, for example, an about 2 nm to about 200 nm thickness, for example, an about 20 nm thickness by a sputtering method or the like to form the NiO film 21. Consequently, the passivation film in which the SiN film 5 and the NiO film 21 are stacked is formed.

Figure 14C:
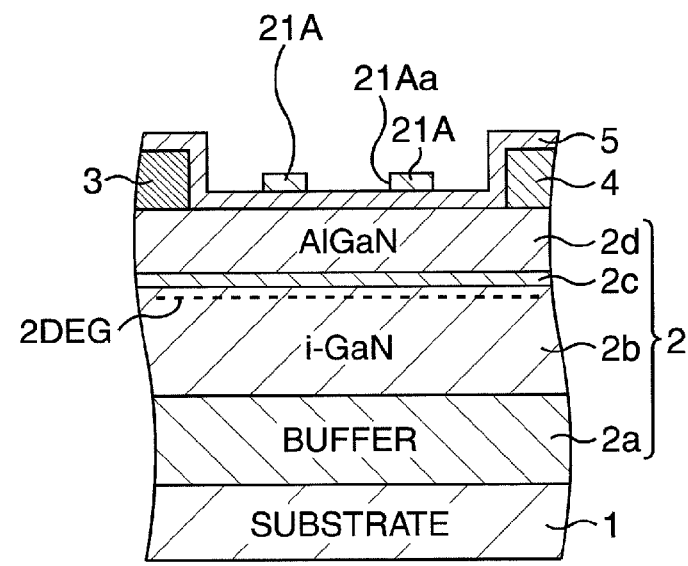

Subsequently, as illustrated in FIG. 14C, the NiO film 21 is processed, whereby a NiO piece 21A having an opening 21Aa is formed.

In more detail, a resist is applied on the whole surface of the NiO film 21, and is processed by lithography. Consequently, a resist mask in a band shape covering only the vicinity of a predetermined gate electrode formation position of the NiO film 21 is formed.

By using this resist mask, the NiO film 21 is dry-etched with, for example, fluorine-based gas used as etching gas. At this time, a surface layer of the SiN layer 5 together with the NiO film 21 may be slightly etched. Consequently, there remains the NiO film 21 in the band shape covering only the vicinity of the predetermined gate electrode formation position and having the opening 21Aa at the predetermined gate electrode formation position, and the NiO piece 21A is formed.

The resist mask is removed by ashing or wet processing using a predetermined chemical solution.

Figure 15A:
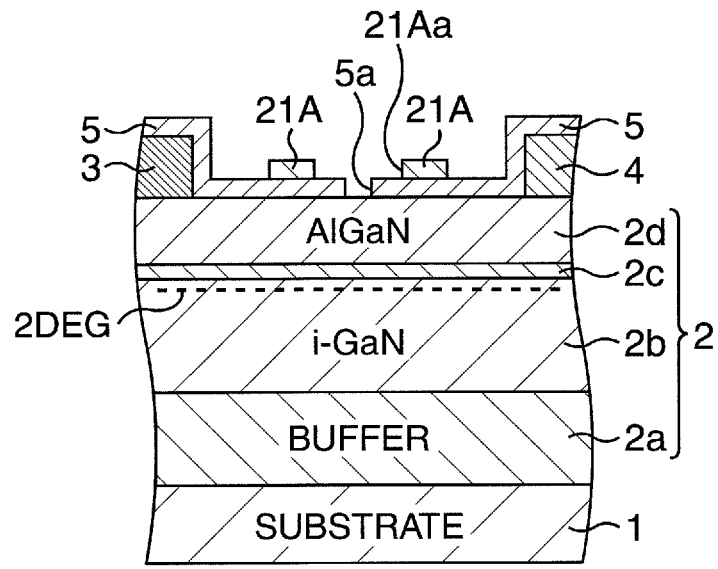
FIG. 15A and FIG. 15B, which are continued from FIG. 14A to FIG. 14C, are schematic cross-sectional views illustrating main processes in the method of manufacturing the AlGaN/GaN HEMT according to the eighth embodiment.

Subsequently, an opening 5a is formed in the SiN film 5 as illustrated in FIG. 15A.

In more detail, a resist is applied on the whole surface of the SiN film 5 including an upper portion of the NiO piece 21A, and is processed by lithography. Consequently, a resist mask having an opening from which the predetermined gate electrode formation position of the SiN film 5 in the opening 21Aa is exposed is formed.

By using this resist mask, the SiN film 5 is dry-etched with, for example, fluorine-based gas used as etching gas. Consequently, the opening 5a is formed at the predetermined gate electrode formation position of the SiN film 5. The opening 21Aa of the NiO piece 21A is wider than the opening 5a of the SiN film 5. The openings 5a, 21Aa communicate with each other, so that an opening where to form the gate electrode is formed.

The resist mask is removed by ashing or wet processing using a predetermined chemical solution.

Figure 15B:
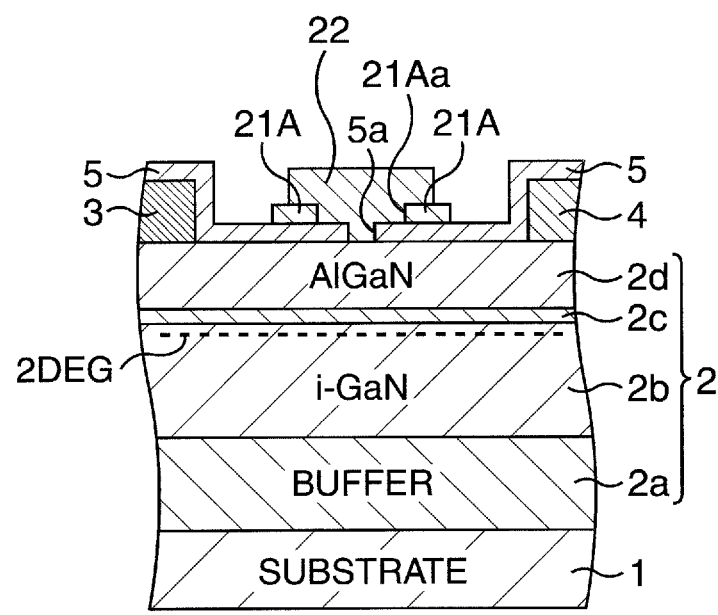

Subsequently, as illustrated in FIG. 15B, the gate electrode 22 is formed.

As an electrode material, for example, Ni/Au (Ni for a lower layer and Au for an upper layer) are used. To form the electrode, an eaves-structure, double-layer resist suitable for a vapor deposition method and a liftoff method is used, for instance. This resist is applied on the NiO piece 21A including the inside of the openings 5a, 21Aa and on the SiN film 5, and consequently a resist mask having an opening at the gate electrode formation position including the opening 5a, 21Aa is formed. By using this resist mask, Ni/Au are deposited by, for example, the vapor deposition method. A thickness of Ni is about 30 nm and a thickness of Au is about 400 nm. By the liftoff method, the resist mask with the eaves structure and Ni/Au deposited thereon are removed. Consequently, the gate electrode 22 in Schottky contact with the surface of the compound semiconductor layer 2 is formed so as to fill the inside of the opening 5a, 21Aa with gate metal.

The gate electrode 22 is formed in a so-called overhanging shape, using Ni filling the inside of the openings 5a, 21Aa and riding on the NiO piece 21A and Au deposited on Ni.

Thereafter, through processes of electrical connection of the source electrode 3, the drain electrode 4, and the gate electrode 22, and so on, the Schottky-type AlGaN/GaN HEMT is formed.

In this embodiment, the passivation film is formed in which the NiO piece 21A containing oxygen is formed on the SiN film 5 not containing oxygen. As the passivation film, an insulating film not containing oxygen with little interface state is suitable. The surface of the compound semiconductor layer 2 to be a Schottky surface is directly covered by the SiN film 5 not containing oxygen, and the SiN film 5 mainly functions as a protection film. Being separated from the Schottky surface by the SiN film 5, the NiO piece 21A containing oxygen might not affect the Schottky surface. The opening 5a of the SiN film 5 and the opening 21Aa of the NiO piece 21A wider than the opening 5a communicate with each other, and the gate electrode 22 in the overhanging shape is formed so as to fill the inside of an opening made up of the openings 5a, 21Aa. In this structure, the gate electrode 22 is formed on the portion where it fills the opening 5a, the portion where it fills the opening 21Aa, and a gradually fanning out multi-step structure (here, triple-step structure) of the overhanging portion, so that electric field concentration points during a high-voltage operation are dispersed.

Further, in this embodiment, the NiO piece 21A is in contact with a lower surface of Ni of the overhanging portion. NiO functions as a p-type oxide semiconductor. The overhanging portion of the gate electrode 22 is located at the uppermost step of the multi-step structure, and in the gate electrode 22, the overhanging portion is a portion closest to the drain electrode 4 and thus the largest electric field concentration occurs here. Due to the presence of NiO being the p-type oxide semiconductor in contact with the overhanging portion, a lateral resistance of the overhanging portion increases and field intensity at a gate end is greatly alleviated. Consequently, the current collapse phenomenon is suppressed.

Further, in this embodiment, the NiO piece 21A covers only the vicinity of the overhanging portion of the gate electrode 22 and is the residue of NiO in the band shape having the opening 21Aa, and all SiON is removed except at a portion of the gate end. Consequently, a component of a leakage current via NiO and an interface of NiO/SiN and a capacitance component are greatly reduced.

As described above, according to this embodiment, a highly reliable AlGaN/GaN HEMT that fully suppresses the current collapse phenomenon even during the high-voltage operation and realizes a high withstand voltage and a high power is obtained.

Ninth Embodiment

Hereinafter, a Schottky-type AlGaN/GaN HEMT according to a ninth embodiment will be described. Note that the same constituent members and so on as those of the AlGaN/GaN HEMT according to the first embodiment will be denoted by the same reference signs, and a detailed description thereof will be omitted.

FIG. 16A and FIG. 16B, and FIG. 17A and FIG. 17B are schematic cross-sectional views illustrating main processes in a method of manufacturing the AlGaN/GaN HEMT according to the ninth embodiment.

Figure 16A:
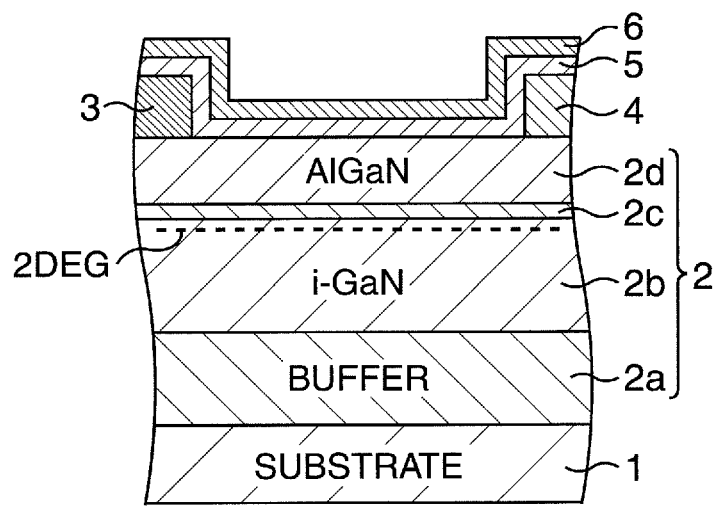
FIG. 16A and FIG. 16B are schematic cross-sectional views illustrating main processes in a method of manufacturing an AlGaN/GaN HEMT according to a ninth embodiment.

First, through the processes in FIG. 1A to FIG. 1C of the first embodiment, a SiN film 5 and a SiON film 6 are formed as illustrated in FIG. 16A.

Figure 16B:
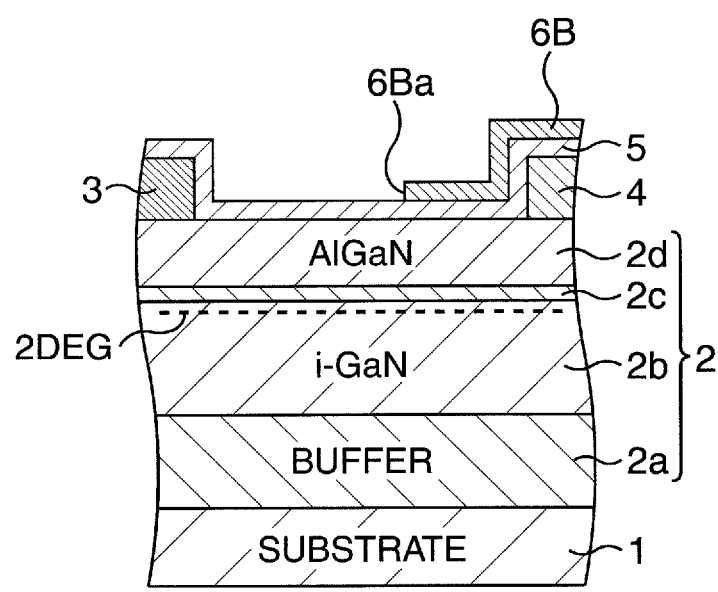

Subsequently, as illustrated in FIG. 16B, the SiON film 6 is processed so that only its drain electrode 4 side is left, whereby a SiON layer 6B is formed.

In more detail, a resist is applied on the whole surface of the SiON film 6 and is processed by lithography. Consequently, a resist mask covering only the drain electrode 4 side of the SiON film 6 is formed.

By using this resist mask, the SiON film 6 is dry-etched with, for example, fluorine-based gas used as etching gas. At this time, a surface layer of the SiN film 5 may be slightly etched together with the SiON film 6. Consequently, the SiON film 6 remains so as to cover only the drain electrode 4 side and the SiON layer 6B is formed. Here, an end portion of the SiON layer 6B becomes a drain electrode 4-side end portion of a predetermined gate electrode formation position, and a region spreading from this end portion toward a source electrode 3 side is called an opening 6Ba.

The resist mask is removed by ashing or wet processing using a predetermined chemical solution.

Figure 17A:
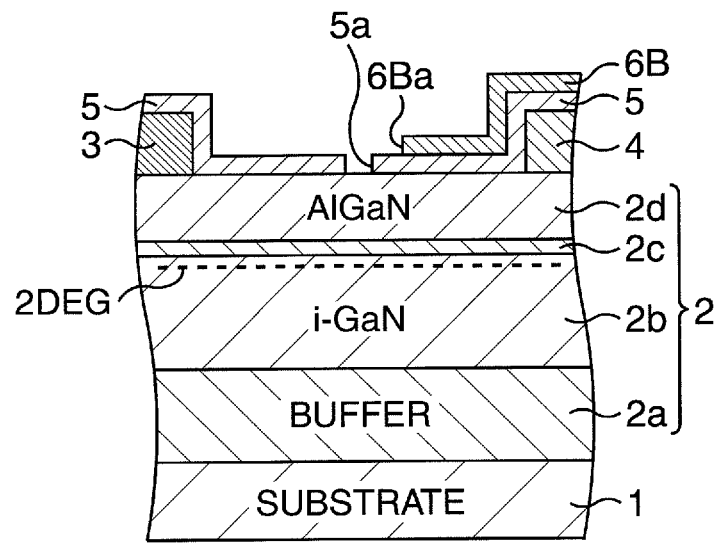
FIG. 17A and FIG. 17B, which are continued from FIG. 16A and FIG. 16B, are schematic cross-sectional views illustrating main processes in the method of manufacturing the AlGaN/GaN HEMT according to the ninth embodiment.

Subsequently, as illustrated in FIG. 17A, an opening 5a is formed in the SiN film 5.

In more detail, a resist is applied on the whole surface of the SiON layer 6B including a region on the SiN film 5 exposed from the opening 6Ba and is processed by lithography. Consequently, a resist mask having an opening from which the predetermined gate electrode formation position of the SiN film 5 in the opening 6Ba is exposed is formed.

By using this resist mask, the SiN film 5 is dry-etched with, for example, fluorine-based gas used as etching gas. Consequently, the opening 5a is formed at the predetermined gate electrode formation position of the SiN film 5. An end portion of the opening 6Ba of the SiON layer 6B is formed to deviate from the drain electrode 4-side end portion of the opening 5a of the SiN film 5 toward the drain electrode 4 side. The openings 5a, 6Ba communicate with each other, so that an opening where to form the gate electrode is formed.

The resist mask is removed by asking or wet processing using a predetermined chemical solution.

Figure 17B:
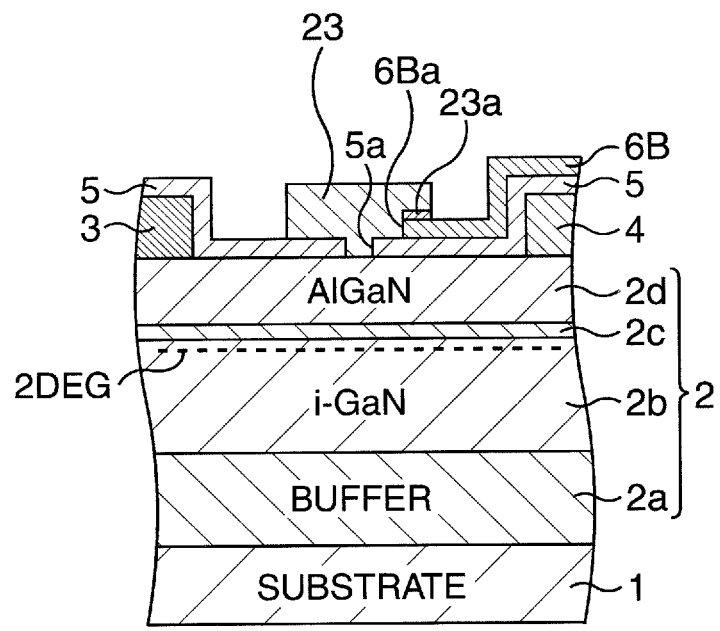

Subsequently, as illustrated in FIG. 17B, the gate electrode 23 is formed.

As an electrode material, for example, Ni/Au (Ni for a lower layer and Au for an upper layer) are used. To form the electrode, an eaves-structure, double-layer resist suitable for a vapor deposition method and a liftoff method is used, for instance. This resist is applied on the SiON layer 6B and on the SiN film 5 including the inside of the opening 5a, and consequently a resist mask having an opening at the predetermined gate electrode formation position including the opening 5a is formed. By using this resist mask, Ni/Au are deposited by, for example, the vapor deposition method. A thickness of Ni is about 30 nm and a thickness of Au is about 400 nm. By the liftoff method, the resist mask with the eaves structure and Ni/Au deposited thereon are removed. Consequently, the gate electrode 23 in Schottky contact with a surface of a compound semiconductor layer 2 is formed so as to fill the opening 5a with gate metal.

The gate electrode 23 is formed in a so-called overhanging shape, using Ni filling the inside of the opening 5a and crossing over the end portion of the opening 6Ba to ride on the SiON layer 6A and Au deposited on Ni. In the vicinity of the end portion of the opening 6Ba of the surface of the SiON layer 6B, at a portion in contact with Ni of the gate electrode 23, oxygen of the SiON film 6 and Ni of the overhanging portion of the gate electrode 23 react with each other, so that a NiO layer 23a being a thin oxide film is formed.

Thereafter, through processes of electrical connection of a source electrode 3, the drain electrode 4, and the gate electrode 23, and so on, the Schottky-type AlGaN/GaN HEMT is formed.

In this embodiment, a passivation film is formed as a stacked structure of the SiN film 5 not containing oxygen and the SiON layer 6A containing oxygen. As the passivation film, an insulating film not containing oxygen with little interface state is suitable. The surface of the compound semiconductor layer 2 to be a Schottky surface is directly covered by the SiN film 5 not containing oxygen, and the SiN film 5 mainly functions as a protection film. Being separated from the Schottky surface by the SiN film 5, the SiON layer 6A containing oxygen might not affect the Schottky surface. The opening 5a of the SiN film 5 and the opening 6Ba of the SiON layer 6B having the end portion deviated from the drain electrode 4-side end portion of the opening 5a toward the drain electrode 4 side communicate with each other, and the gate electrode 23 in the overhanging shape crossing over the end portion of the opening 6Ba to ride on the SiON layer 6A is formed so as to fill the opening 5a. In this structure, the gate electrode 23 is formed on the portion where it fills the opening 5a, the portion where it fills a gap between the drain electrode 4-side end portion of the opening 5a and the end portion of the opening 6Ba, and a gradually fanning out multi-step structure (here, triple-step structure) of the overhanging portion crossing over the end portion of the opening 6Ba to ride on the SiON layer 6A, so that electric field concentration points during a high-voltage operation are dispersed.

Further, in this embodiment, oxygen of the SiON layer 6B and Ni of the overhanging portion of the gate electrode 23 react with each other to form the NiO layer 23a. NiO functions as a p-type oxide semiconductor. The overhanging portion of the gate electrode 23 is located at the uppermost step of the multi-step structure, and in the gate electrode 23, the overhanging portion is a portion closest to the drain electrode 4 and thus the largest electric field concentration occurs here. Due to the presence of the NiO layer 23a being the p-type oxide semiconductor formed on the overhanging portion, a lateral resistance of the overhanging portion increases and field intensity at a gate end is greatly alleviated. Consequently, the current collapse phenomenon is suppressed.

Further, in this embodiment, the SiON layer 6B is SiON remaining on the SiN film 5 so as to cover only the drain electrode 4 side, and SiON is all removed except at a gap between the gate electrode 23 and the drain electrode 4. Consequently, it is possible to suppress an increase in source resistance due to an increase in resistance between the gate electrode 23 and the source electrode 3.

Tenth Embodiment

Hereinafter, a Schottky-type AlGaN/GaN HEMT according to a tenth embodiment will be described. Note that the same constituent members and so on as those of the AlGaN/GaN HEMT according to the first embodiment will be denoted by the same reference signs, and a detailed description thereof will be omitted.

FIG. 18A to FIG. 18C, and FIG. 19A and FIG. 19B are schematic cross-sectional views illustrating main processes in a method of manufacturing the AlGaN/GaN HEMT according to the tenth embodiment.

Figure 18A:
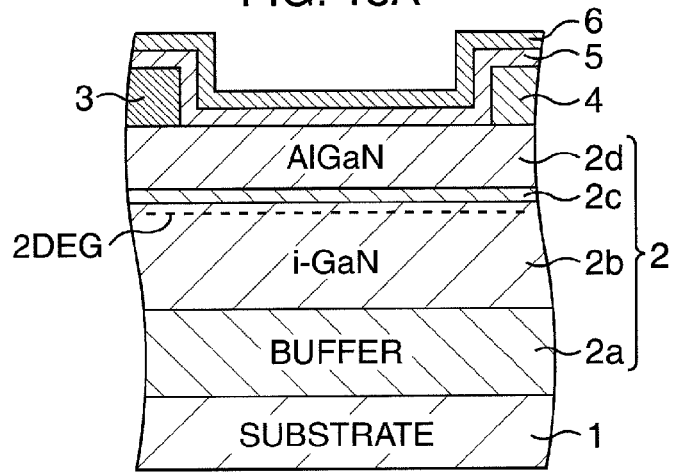
FIG. 18A to FIG. 18C are schematic cross-sectional views illustrating main processes in a method of manufacturing an AlGaN/GaN HEMT according to a tenth embodiment.

First, through the processes in FIG. 1A to FIG. 1C of the first embodiment, a SiN film 5 and a SiON film 6 are formed as illustrated in FIG. 18A.

Figure 18B:
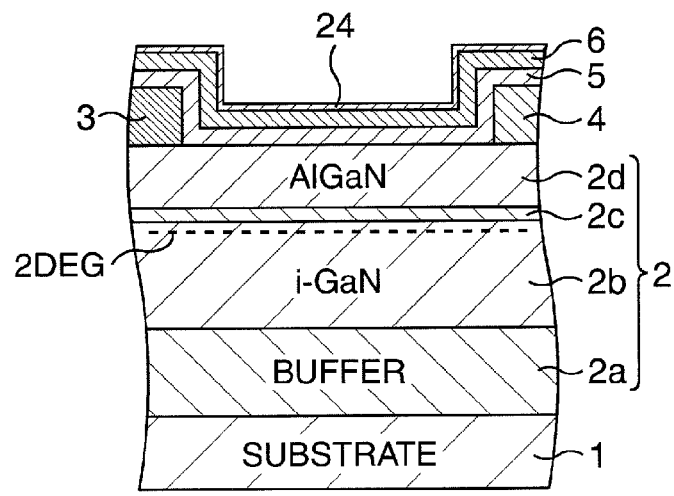

Subsequently, as illustrated in FIG. 18B, an oxygen-rich film 24 is formed on a surface layer of the SiON film 6.

In more detail, the surface of the SiON film 6 is processed with oxygen plasma. Consequently, the surface layer of the SiON film 6 is oxidized, so that the oxygen-rich film 24 of SiON high in oxygen content is formed only on the surface layer.

Figure 18C:
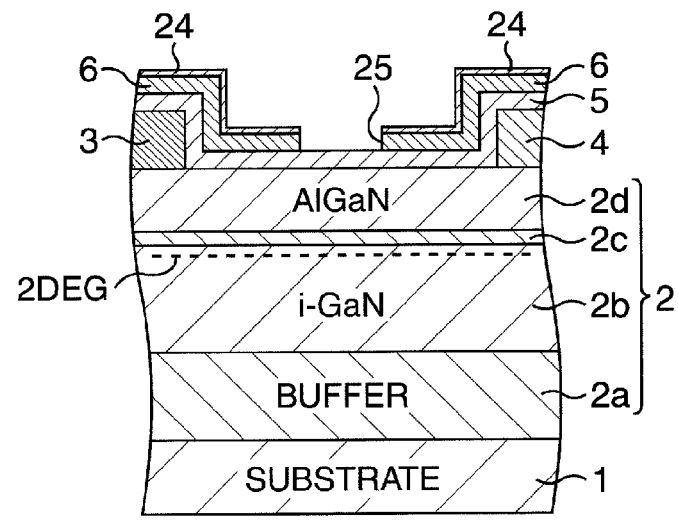

Subsequently, as illustrated in FIG. 18C, an opening 25 is formed in the oxygen-rich film 24 and the SiON film 6.

In more detail, a resist is applied on the whole surface of the oxygen-rich film 24 and is processed by lithography. Consequently, a resist mask having an opening from which a predetermined gate electrode formation position of the oxygen-rich film 24 is exposed is formed.

By using this resist mask, the oxygen-rich film 24 and the SiON film 6 are dry-etched with, for example, fluorine-based gas used as etching gas. At this time, a surface layer of the SiN film 5 may be slightly etched together with the oxygen-rich film 24 and the SiON film 6. Consequently, the opening 25 is formed at the predetermined gate electrode formation position of the oxygen-rich film 24 and the SiON film 6.

The resist mask is removed by ashing or wet processing using a predetermined chemical solution.

Figure 19A:
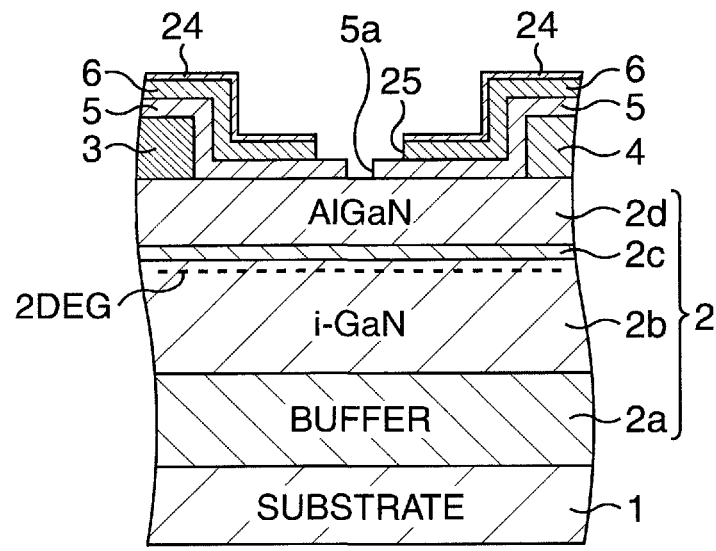
FIG. 19A and FIG. 19B, which are continued from FIG. 18A to FIG. 18C, are schematic cross-sectional views illustrating main processes in the method of manufacturing the AlGaN/GaN HEMT according to the tenth embodiment.

Subsequently, as illustrated in FIG. 19A, an opening 5a is formed in the SiN film 5.

In more detail, a resist is applied on the whole surface of the oxygen-rich film 24 including a region on the SiN film 5 exposed from the opening 25 and is processed by lithography. Consequently, a resist mask having an opening from which the predetermined gate electrode formation position of the SiN film 5 in the opening 25 is exposed is formed.

By using this resist mask, the SiN film 5 is dry-etched with, for example, fluorine-based gas used as etching gas. Consequently, the opening 5a is formed at the predetermined gate electrode formation position of the SiN film 5. The opening 25 of the SiON film 6 and the oxygen-rich film 24 is wider than the opening 5a of the SiN film 5. The openings 5a, 25 communicate with each other, so that an opening where to form the gate electrode is formed.

The resist mask is removed by ashing or wet processing using a predetermined chemical solution.

Figure 19B:
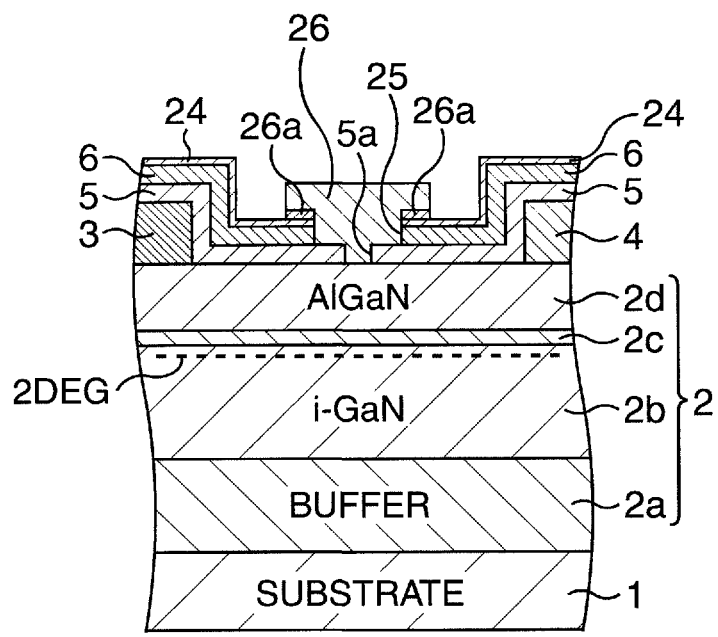

Subsequently, as illustrated in FIG. 19B, the gate electrode 26 is formed.

As an electrode material, for example, Ni/Au (Ni for a lower layer and Au for an upper layer) are used. To form the electrode, an eaves-structure, double-layer resist, for instance, suitable for a vapor deposition method and a liftoff method is used. This resist is applied on the oxygen-rich film 24 including the inside of the openings 5a, 25, and consequently a resist mask having an opening at the predetermined gate electrode formation position including the openings 5a, 25 is formed. By using this resist mask, Ni/Au are deposited by, for example, the vapor deposition method. A thickness of Ni is about 30 nm and a thickness of Au is about 400 nm. By the liftoff method, the resist mask with the eaves structure and Ni/Au deposited thereon are removed. Consequently, the gate electrode 26 in Schottky contact with a surface of a compound semiconductor layer 2 is formed so as to fill the inside of the openings 5a, 25 with gate metal.

The gate electrode 26 is formed in a so-called overhanging shape, using Ni filling the inside of the openings 5a, 25 and riding on the oxygen-rich film 24 and Au deposited on Ni. In the vicinity of the opening 25 of the surface of the oxygen-rich film 24, at a portion in contact with Ni of the gate electrode 26, oxygen of the oxygen-rich film 24 and Ni of the overhanging portion of the gate electrode 26 react with each other, so that a NiO layer 26a being a thin oxide film is formed.

Thereafter, through processes of electrical connection of a source electrode 3, a drain electrode 4, and the gate electrode 26 and so on, the Schottky-type AlGaN/GaN HEMT is formed.

In this embodiment, a passivation film is formed as a stacked structure of the SiN film 5 not containing oxygen and the SiON film 6 containing oxygen with the oxygen-rich film 24 formed on its surface layer. As the passivation film, an insulating film not containing oxygen with little interface state is suitable. The surface of the compound semiconductor layer 2 to be a Schottky surface is directly covered by the SiN film 5 not containing oxygen, and the SiN film 5 mainly functions as a protection film. Being separated from the Schottky surface by the SiN film 5, the SiON film 6 containing oxygen (and the oxygen-rich film 24) might not affect the Schottky surface. The opening 5a of the SiN film 5 and the opening 25 of the SiON film 6 and the oxygen-rich film 24 wider than the opening 5a communicate with each other, and the gate electrode 26 in the overhanging shape is formed so as to fill the inside of an opening made up of the openings 5a, 25. In this structure, the gate electrode 26 is formed on the portion where it fills the opening 5a, the portion where it fills the opening 25, and a gradually fanning out multi-step structure (here, triple-step structure) of the overhanging portion, so that electric field concentration points during a high-voltage operation are dispersed.

Further, in this embodiment, oxygen of the oxygen-rich film 24 and Ni of the overhanging portion of the gate electrode 26 react with each other to form the NiO layer 26a. Since Ni of the overhanging portion is in contact with the oxygen-rich film 24 high in oxygen content, the oxidization of Ni is promoted. NiO functions as a p-type oxide semiconductor. The overhanging portion of the gate electrode 26 is located at the uppermost step of the multi-step structure, and in the gate electrode 26, the overhanging portion is a portion closest to the drain electrode 4 and thus the largest electric field concentration occurs here. Due to the presence of the NiO layer 26a being the p-type oxide semiconductor formed on the overhanging portion, a lateral resistance of the overhanging portion increases and field intensity at a gate end is greatly alleviated. This, together with the effect of the presence of the oxygen-rich film 24, achieves further suppression of the current collapse phenomenon.

As described above, according to this embodiment, a highly reliable AlGaN/GaN HEMT that fully suppresses the current collapse phenomenon even during the high-voltage operation and realizes a high withstand voltage and a high power is obtained.

Eleventh Embodiment

Hereinafter, a Schottky-type AlGaN/GaN HEMT according to an eleventh embodiment will be described. Note that the same constituent members and so on as those of the AlGaN/GaN HEMT according to the first embodiment will be denoted by the same reference signs, and a detailed description thereof will be omitted.

FIG. 20A and FIG. 20B, and FIG. 21A and FIG. 21B are schematic cross-sectional views illustrating main processes in a method of manufacturing the AlGaN/GaN HEMT according to the eleventh embodiment.

Figure 20A:
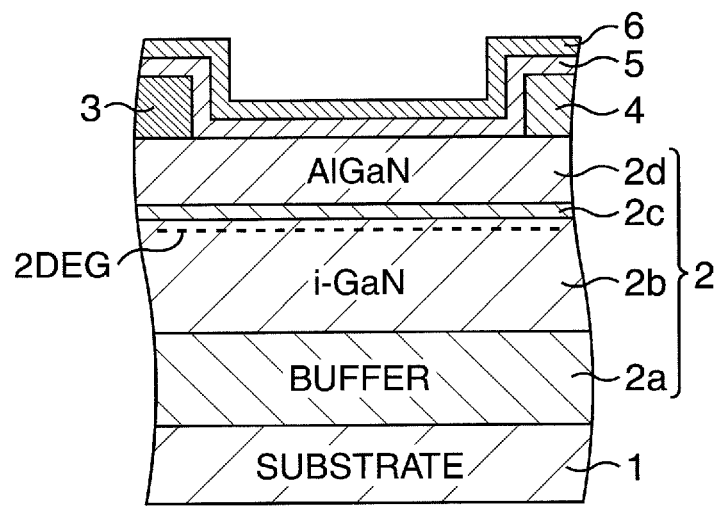
FIG. 20A and FIG. 20B are schematic cross-sectional views illustrating main processes in a method of manufacturing an AlGaN/GaN HEMT according to an eleventh embodiment.

First, through the processes in FIG. 1A to FIG. 1C of the first embodiment, a SiN film 5 and a SiON film 6 are formed as illustrated in FIG. 20A.

Figure 20B:
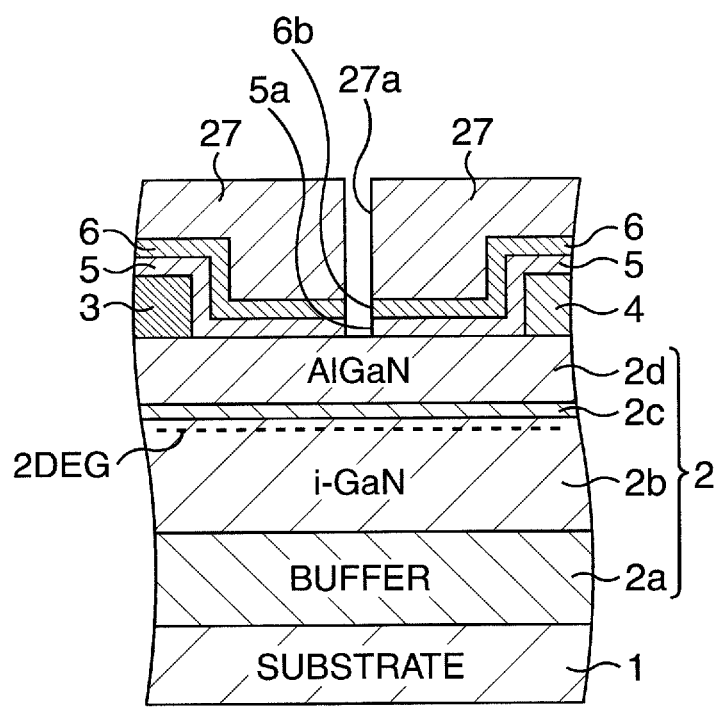

Subsequently, as illustrated in FIG. 20B, an opening 6b and an opening 5a are simultaneously formed in the SiON film 6 and the SiN film 5 respectively so as to have substantially the same width.

In more detail, a resist is applied on the whole surface of the SiON film 6, and is processed by lithography. Consequently, a resist mask 27 having an opening 27a from which a predetermined gate electrode formation position of the SiON film 6 is exposed is formed.

By using this resist mask, the SiON film 6 and the SiN film 5 are dry-etched with, for example, fluorine-based gas used as etching gas. Consequently, the opening 6b and the opening 5a are simultaneously formed at the predetermined gate electrode formation position in the SiON film 6 and the SiN film 5 respectively so as to have substantially the same width.

Figure 21A:
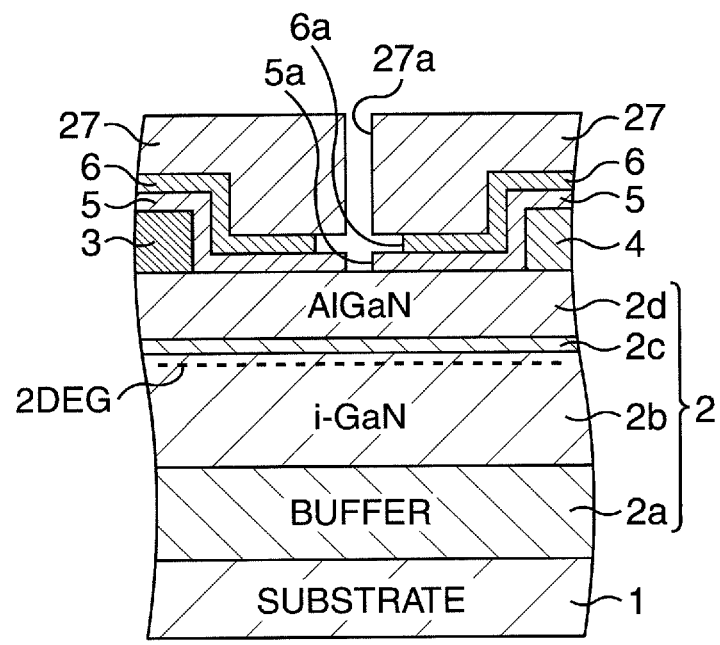
FIG. 21A and FIG. 21B, which are continued from FIG. 20A and FIG. 20B, are schematic cross-sectional views illustrating main processes in the method of manufacturing the AlGaN/GaN HEMT according to the eleventh embodiment.

Subsequently, as illustrated in FIG. 21A, an opening 6a is formed in the SiON film 6.

In more detail, by continuously using the resist mask 27, wet etching using, for example, buffered hydrofluoric acid (BHF) is performed. In this embodiment, an etching rate in the SiN film 5 by BHF and that in the SiON film 6 are different, and their film qualities are selected so that the etching rate is faster in the latter than in the former. Consequently, the SiN film 5 is scarcely etched and the width of the opening 5a does not change, while the SiON film 6 is etched and the width of the opening 6b is expanded, so that the opening 6a wider than the opening 5a is formed.

The resist mask 27 is removed by ashing or wet processing using a predetermined chemical solution.

Figure 21B:
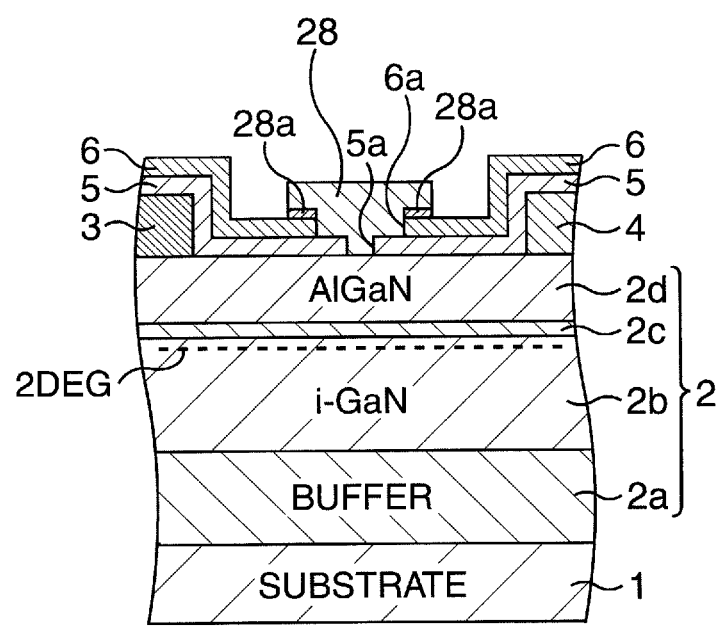

Subsequently, as illustrated in FIG. 21B, a gate electrode 28 is formed.

As an electrode material, for example, Ni/Au (Ni for a lower layer and Au for an upper layer) are used. To form the electrode, an eaves-structure, double-layer resist suitable for a vapor deposition method and a liftoff method is used, for instance. This resist is applied on the SiON film 6 including the inside of the openings 5a, 6a, and a resist mask having an opening at a predetermined gate electrode formation position including the openings 5a, 6a is formed. By using this resist mask, Ni/Au are deposited by, for example, the vapor deposition method. A thickness of Ni is about 30 nm and a thickness of Au is about 400 nm. By the liftoff method, the resist mask with the eaves structure and Ni/Au deposited thereon are removed. Consequently, the gate electrode 28 in Schottky contact with a surface of a compound semiconductor layer 2 is formed so as to fill the inside of the openings 5a, 6a with gate metal.

The gate electrode 28 is formed in a so-called overhanging shape, using Ni filling the inside of the openings 5a, 6a and riding on the SiON film 6 and Au deposited on Ni. In the vicinity of the opening 6a of the surface of the SiON film 6, at a portion in contact with Ni of the gate electrode 28, oxygen of the SiON film 6 and Ni of the overhanging portion of the gate electrode 28 react with each other, so that a NiO layer 28a being a thin oxide film is formed.

Thereafter, through processes of electrical connection of a source electrode 3, a drain electrode 4, and the gate electrode 28, and so on, the Schottky-type AlGaN/GaN HEMT is formed.

In this embodiment, a passivation film is formed as a stacked structure of the SiN film 5 not containing oxygen and the SiON film 6 containing oxygen. As the passivation film, an insulating film not containing oxygen with little interface state is suitable. The surface of the compound semiconductor layer 2 to be a Schottky surface is directly covered by the SiN film 5 not containing oxygen, and the SiN film 5 mainly functions as a protection film. Being separated from the Schottky surface by the SiN film 5, the SiON film 6 containing oxygen might not affect the Schottky surface. The opening 5a of the SiN film 5 and the opening 6a of the SiON film 6 wider than the opening 5a communicate with each other, and the gate electrode 28 in the overhanging shape is formed so as to fill the inside of an opening made up of the openings 5a, 6a. In this structure, the gate electrode 28 is formed on the portion where it fills the opening 5a, the portion where it fills the opening 6a, and a gradually fanning out multi-step structure (here, triple-step structure) of the overhanging portion, so that electric field concentration points during a high-voltage operation are dispersed.

Further, in this embodiment, oxygen of the SiON film 6 and Ni of the overhanging portion of the gate electrode 28 react with each other to form the NiO layer 28a. NiO functions as a p-type oxide semiconductor. The overhanging portion of the gate electrode 28 is located at the uppermost step of the multi-step structure, and in the gate electrode 28, the overhanging portion is a portion closest to the drain electrode 4 and thus the largest electric field concentration occurs here. Due to the presence of the NiO layer 28a being the p-type oxide semiconductor formed on the overhanging portion, a lateral resistance of the overhanging portion increases and field intensity at a gate end is greatly alleviated. Consequently, the current collapse phenomenon is suppressed.

As described above, according to this embodiment, a highly reliable AlGaN/GaN HEMT that fully suppresses the current collapse phenomenon even during the high-voltage operation and realizes a high withstand voltage and a high power is obtained.

Twelfth Embodiment

Hereinafter, a Schottky-type AlGaN/GaN HEMT according to a twelfth embodiment will be described. Note that the same constituent members and so on as those of the AlGaN/GaN HEMT according to the first embodiment will be denoted by the same reference signs, and a detailed description thereof will be omitted.

FIG. 22A and FIG. 22B, and FIG. 23A and FIG. 23B are schematic cross-sectional views illustrating main processes in a method of manufacturing the AlGaN/GaN HEMT according to the twelfth embodiment.

Figure 22A:
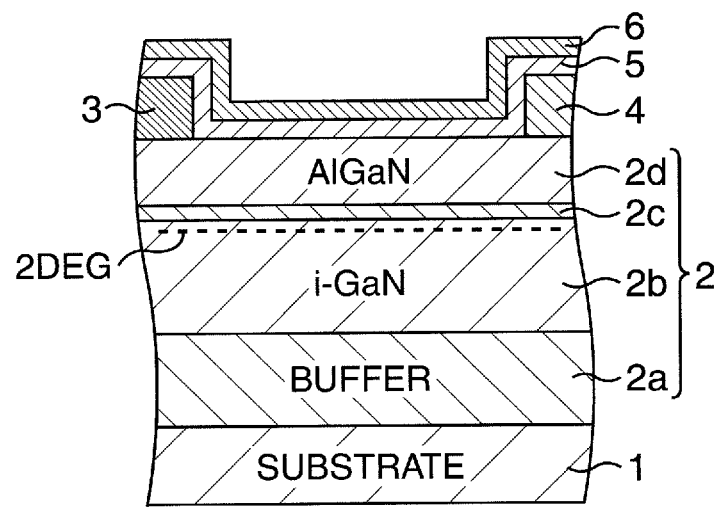
FIG. 22A and FIG. 22B are schematic cross-sectional views illustrating main processes in a method of manufacturing an AlGaN/GaN HEMT according to a twelfth embodiment.

First, through the processes in FIG. 1A to FIG. 1C of the first embodiment, a SiN film 5 and a SiON film 6 are formed as illustrated in FIG. 22A.

Figure 22B:
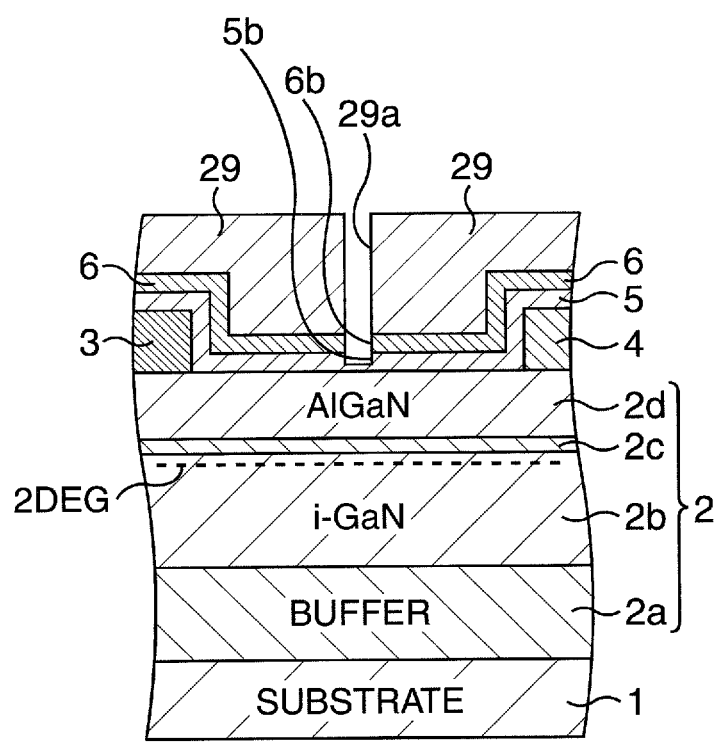

Subsequently, as illustrated in FIG. 22B, an opening 6b and a concave portion 5b are simultaneously formed in the SiON film 6 and the SiN film 5 respectively so as to have substantially the same width.

In more detail, a resist is applied on the whole surface of the SiON film 6, and is processed by lithography. Consequently, a resist mask 29 having an opening 29a from which a predetermined gate electrode formation position of the SiON film 6 is exposed is formed.

By using this resist mask 29, the SiON film 6 and the SiN film 5 are dry-etched with, for example, fluorine-based gas used as etching gas. The dry etching is performed up to a middle of the SiN film 5, that is, so that, for example, only an about 5 nm thickness of the SiN film 5 is left. Consequently, the opening 6b and the concave portion 5b are simultaneously formed at the predetermined gate electrode formation position in the SiON film 6 and the SiN film 5 respectively so as to have substantially the same width.

Figure 23A:
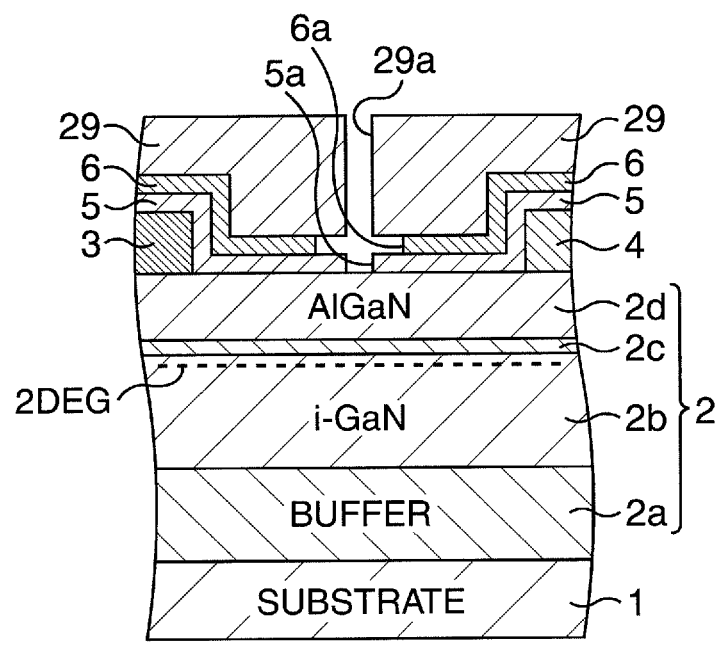
FIG. 23A and FIG. 23B, which are continued from FIG. 22A and FIG. 22B, are schematic cross-sectional views illustrating main processes in the method of manufacturing the AlGaN/GaN HEMT according to the twelfth embodiment.

Subsequently, as illustrated in FIG. 23A, an opening 6a is formed in the SiON film 6 and an opening 5a is formed in the SiN film 5.

In more detail, by continuously using the resist mask 29, wet etching using, for example, buffered hydrofluoric acid (BHF) is performed. In this embodiment, an etching rate in the SiN film 5 by BHF and that in the SiON film 6 are different, and their film qualities are selected so that the etching rate is faster in the latter than in the former. Consequently, in the SiN film 5, the opening 5a from which part of a surface of an electrode supply layer 2d is exposed is formed by a slight amount of etching, and in the SiON film 6, the width of the opening 6b is expanded by the etching, so that the opening 6a wider than the opening 5a is formed.

The resist mask 29 is removed by ashing or wet processing using a predetermined chemical solution.

Figure 23B:
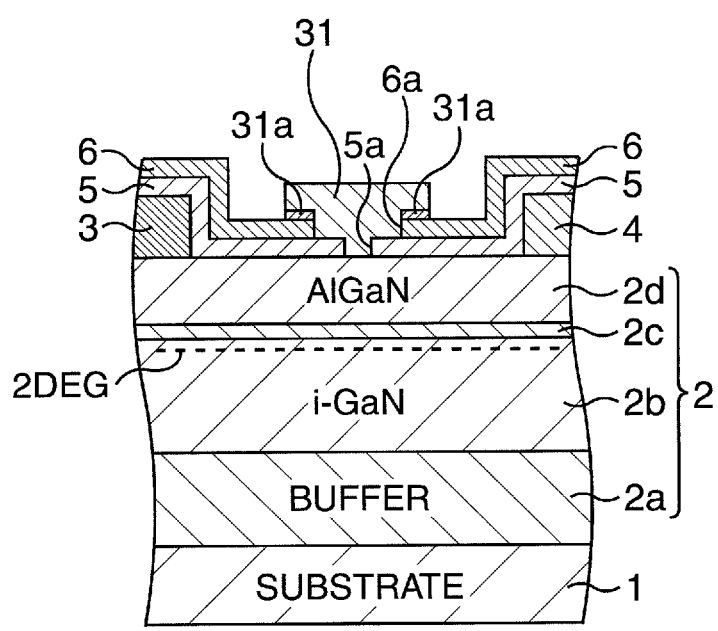

Subsequently, as illustrated in FIG. 23B, a gate electrode 31 is formed.

As the electrode material, for example, Ni/Au (Ni for a lower layer and Au for an upper layer) are used. To form the electrode, an eaves-structure, double-layer resist suitable for a vapor deposition method and a liftoff method is used, for instance. This resist is applied on the SiON film 6 including the inside of the openings 5a, 6a, and a resist mask having an opening at the predetermined gate electrode formation position including the openings 5a, 6a is formed. By using this resist mask, Ni/Au are deposited by, for example, the vapor deposition method. A thickness of Ni is about 30 nm and a thickness of Au is about 400 nm. By the liftoff method, the resist mask with the eaves structure and Ni/Au deposited thereon are removed. Consequently, the gate electrode 31 in Schottky contact with a surface of a compound semiconductor layer 2 is formed so as to fill the inside of the openings 5a, 6a with gate metal.

The gate electrode 31 is formed in a so-called overhanging shape, using Ni filling the inside of the openings 5a, 6a and riding on the SiON film 6 and Au deposited on Ni. In the vicinity of the opening 6a of the surface of the SiON film 6, at a portion in contact with Ni of the gate electrode 31, oxygen of the SiON film 6 and Ni of the overhanging portion of the gate electrode 31 react with each other, so that a NiO layer 31a being a thin oxide film is formed.

Thereafter, through processes of electrical connection of a source electrode 3, a drain electrode 4, and the gate electrode 31, and so on, the Schottky-type AlGaN/GaN HEMT is formed.

In this embodiment, a passivation film is formed as a stacked structure of the SiN film 5 not containing oxygen and the SiON film 6 containing oxygen. As the passivation film, an insulating film not containing oxygen with little interface state is suitable. The surface of the compound semiconductor layer 2 to be a Schottky surface is directly covered by the SiN film 5 not containing oxygen, and the SiN film 5 mainly functions as a protection film. Being separated from the Schottky surface by the SiN film 5, the SiON film 6 containing oxygen might not affect the Schottky surface. The opening 5a of the SiN film 5 and the opening 6a of the SiON film 6 wider than the opening 5a communicate with each other, and the gate electrode 31 in the overhanging shape is formed so as to fill the inside of an opening made up of the openings 5a, 6a. In this structure, the gate electrode 31 is formed on the portion where it fills the opening 5a, the portion where it fills the opening 6a, and a gradually fanning out multi-step structure (here, triple-step structure) of the overhanging portion, so that electric field concentration points during a high-voltage operation are dispersed.

Further, in this embodiment, oxygen of the SiON film 6 and Ni of the overhanging portion of the gate electrode 31 react with each other to form the NiO layer 31a. NiO functions as a p-type oxide semiconductor. The overhanging portion of the gate electrode 31 is located at the uppermost step of the multi-step structure, and in the gate electrode 31, the overhanging portion is a portion closest to the drain electrode 4 and thus the largest electric field concentration occurs here. Due to the presence of the NiO layer 31a being the p-type oxide semiconductor formed on the overhanging portion, a lateral resistance of the overhanging portion increases and field intensity at a gate end is greatly alleviated. Consequently, the current collapse phenomenon is suppressed.

Further in this embodiment, when the SiON film 6 and the SiN film 5 are dry-etched, the SiN film 5 is thinly left so that the surface of the compound semiconductor layer 2 being the Schottky surface is not exposed. Consequently, a damage of the Schottky surface due to the dry etching is greatly reduced.

As described above, according to this embodiment, a highly reliable AlGaN/GaN HEMT that fully suppresses the current collapse phenomenon even during the high-voltage operation and realizes a high withstand voltage and a high power is obtained.

Thirteenth Embodiment

Hereinafter, a Schottky-type AlGaN/GaN HEMT according to a thirteenth embodiment will be described. Note that the same constituent members and so on as those of the AlGaN/GaN HEMT according to the first embodiment will be denoted by the same reference signs, and a detailed description thereof will be omitted.

FIG. 24A to FIG. 24C, and FIG. 25A and FIG. 25B are schematic cross-sectional views illustrating main processes in a method of manufacturing the AlGaN/GaN HEMT according to the thirteenth embodiment.

Figure 24A:
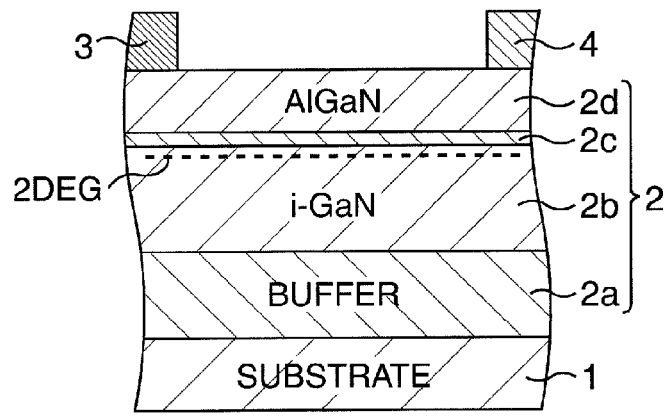
FIG. 24A to FIG. 24C are schematic cross-sectional views illustrating main processes in a method of manufacturing an AlGaN/GaN HEMT according to a thirteenth embodiment.

First, through the processes in FIG. 1A and FIG. 1B of the first embodiment, a source electrode 3 and a drain electrode 4 are formed on a compound semiconductor layer 2 as illustrated in FIG. 24A.

Figure 24B:
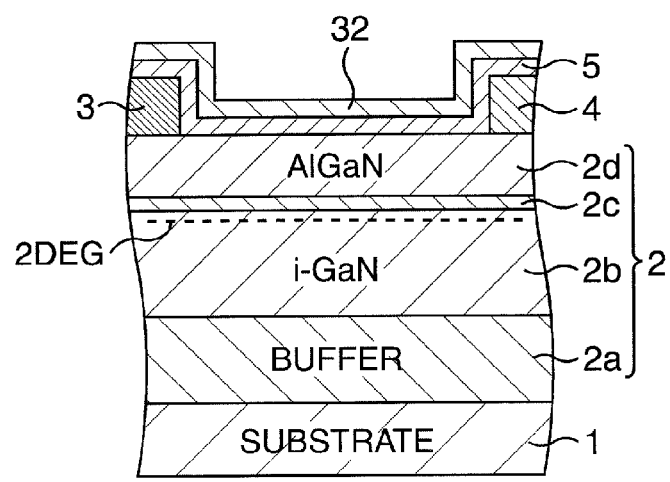

Subsequently, a passivation film protecting a surface of the compound semiconductor layer 2 is formed as illustrated in FIG. 24B.

The passivation film has a stacked structure of a lower insulating film not containing oxygen, here, a SiN($Si_3N_4$) film 5 and an upper insulating film containing oxygen, here a $SiO_2$ film 32.

In more detail, SiN is deposited on the whole surface of the compound semiconductor layer 2 to, for example, an about 2 nm to about 200 nm thickness, for example, an about 20 nm thickness by a plasma CVD method, a sputtering method, or the like to form the SiN film 5. Subsequently, $SiO_2$ is deposited on the SiN film 5 to, for example, an about 2 nm to about 200 nm thickness, for example, an about 20 nm thickness by a plasma CVD method, a sputtering method, or the like to form the $SiO_2$ film 32. Consequently, the passivation film in which the SiN film 5 and the $SiO_2$ film 32 are stacked is formed.

Figure 24C:
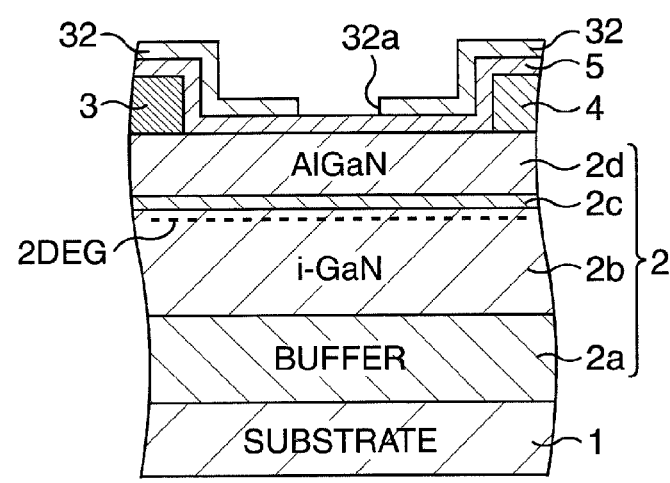

Subsequently, as illustrated in FIG. 24C, an opening 32a is formed in the $SiO_2$ film 32.

In more detail, a resist is applied on the whole surface of the $SiO_2$ film 32 and is processed by lithography. Consequently, a resist mask having an opening from which a predetermined gate electrode formation position of the $SiO_2$ film 32 is exposed is formed.

By using this resist mask, the $SiO_2$ film 32 is dry-etched with, for example, fluorine-based gas used as etching gas. At this time, a surface layer of the SiN film 5 may be slightly etched together with the $SiO_2$ film 32. Consequently, the opening 32a is formed at the predetermined gate electrode formation position of the $SiO_2$ film 32.

The resist mask is removed by ashing or wet processing using a predetermined chemical solution.

Figure 25A:
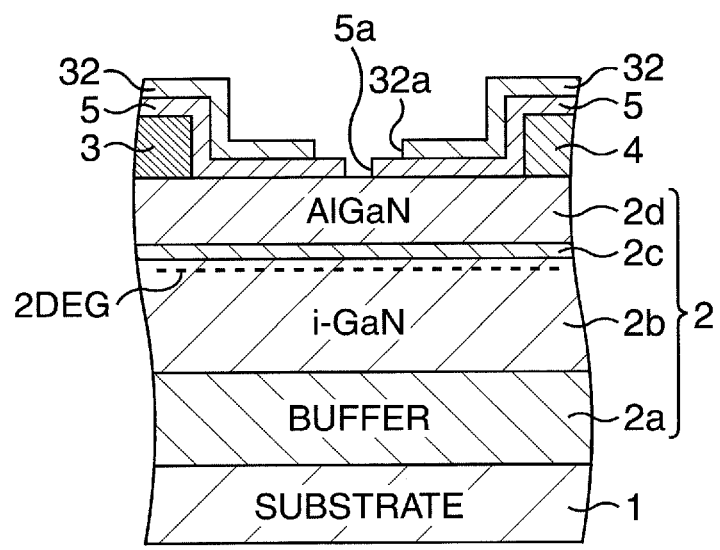
FIG. 25A and FIG. 25B, which are continued from FIG. 24A to FIG. 24C, are schematic cross-sectional views illustrating main processes in the method of manufacturing the AlGaN/GaN HEMT according to the thirteenth embodiment.

Subsequently, as illustrated in FIG. 25A, an opening 5a is formed in the SiN film 5.

In more detail, a resist is applied on the whole surface of the $SiO_2$ film 32 including a region on the SiN film 5 exposed from the opening 32a and is processed by lithography. Consequently, a resist mask having an opening from which the predetermined gate electrode formation position of the SiN film 5 in the opening 32a is exposed is formed.

By using this resist mask, the SiN film 5 is dry-etched with, for example, fluorine-based gas used as etching gas. Consequently, the opening 5a is formed at the predetermined gate electrode formation position of the SiN film 5. The opening 32a of the $SiO_2$ film 32 is wider than the opening 5a of the SiN film 5. The openings 5a, 32a communicate with each other, so that an opening where to form the gate electrode is formed.

The resist mask is removed by ashing or wet processing using a predetermined chemical solution.

Figure 25B:
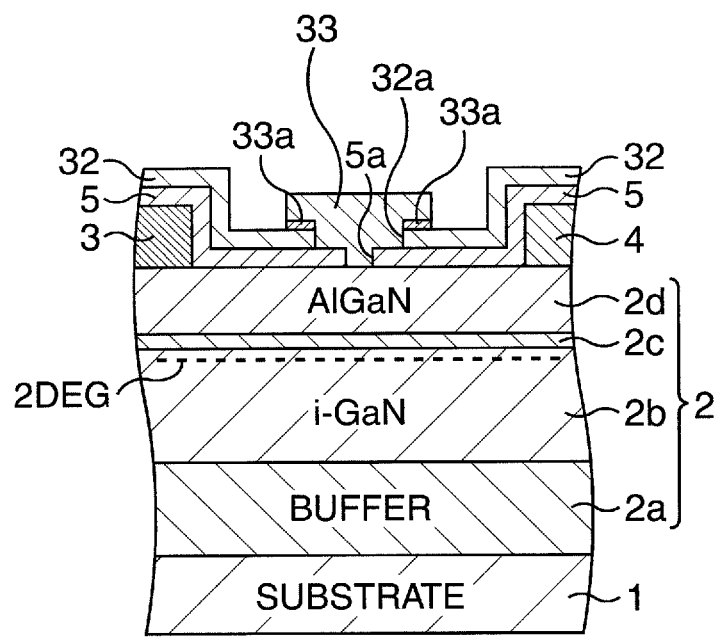

Subsequently, as illustrated in FIG. 25B, the gate electrode 33 is formed.

As an electrode material, for example, Ni/Au (Ni for a lower layer and Au for an upper layer) are used. To form the electrode, an eaves-structure, double-layer resist suitable for a vapor deposition method and a liftoff method is used, for instance. This resist is applied on the $SiO_2$ film 32 including the inside of the openings 5a, 32a, and a resist mask having an opening at the predetermined gate electrode formation position including the openings 5a, 32a is formed. By using this resist mask, Ni/Au are deposited by, for example, the vapor deposition method. A thickness of Ni is about 30 nm and a thickness of Au is about 400 nm. By the liftoff method, the resist mask with the eaves structure and Ni/Au deposited thereon are removed. Consequently, the gate electrode 33 in Schottky contact with the surface of the compound semiconductor layer 2 is formed so as to fill the openings 5a, 32a with gate metal.

The gate electrode 33 is formed in a so-called overhanging shape, using Ni filling the inside of the openings 5a, 32a and riding on the $SiO_2$ film 32 and Au deposited on Ni. In the vicinity of the opening 32a of the surface of the $SiO_2$ film 32, at a portion in contact with Ni of the gate electrode 33, oxygen of the $SiO_2$ film 32 and Ni of the overhanging portion of the gate electrode 33 react with each other, so that a NiO layer 33a being a thin oxide film is formed.

Thereafter, through processes of electrical connection of the source electrode 3, the drain electrode 4, and the gate electrode 33, and so on, the Schottky-type AlGaN/GaN HEMT is formed.

In this embodiment, the passivation film is formed as a stacked structure of the SiN film 5 not containing oxygen and the $SiO_2$ film 32 high in oxygen content. As the passivation film, an insulating film not containing oxygen with little interface state is suitable. The surface of the compound semiconductor layer 2 being a Schottky surface is directly covered by the SiN film 5 not containing oxygen, and the SiN film 5 mainly functions as a protection film. Being separated from the Schottky surface by the SiN film 5, the $SiO_2$ film 32 containing oxygen might not affect the Schottky surface. The opening 5a of the SiN film and the opening 32a of the $SiO_2$ film 32 wider than the opening 5a communicate with each other, and the gate electrode 33 in the overhanging shape is formed so as to fill the inside of an opening made up of the openings 5a, 32a. In this structure, the gate electrode 33 is formed on the portion where it fills the opening 5a, the portion where it fills the opening 32a, and a gradually fanning out multi-step structure (here, triple-step structure) of the overhanging portion, so that electric field concentration points during a high-voltage operation are dispersed.

Further, in this embodiment, oxygen of the SiO$_2$ film 32 and Ni of the overhanging portion of the gate electrode 33 react with each other to form the NiO layer 33a. Since Ni of the overhanging portion is in contact with the SiO$_2$ film 32 high in oxygen content, the oxidization of Ni is promoted. NiO functions as a p-type oxide semiconductor. The overhanging portion of the gate electrode 33 is located at the uppermost step of the multi-step structure, and in the gate electrode 33, the overhanging portion is a portion closest to the drain electrode 4 and thus the largest electric field concentration occurs here. Due to the presence of the NiO layer 33a being the p-type oxide semiconductor formed on the overhanging portion, a lateral resistance of the overhanging portion increases and field intensity at a gate end is greatly alleviated. This, along with the effect of the presence of the SiO$_2$ film 32, achieves further suppression of the current collapse phenomenon.

As described above, according to this embodiment, a highly reliable AlGaN/GaN HEMT that fully suppresses the current collapse phenomenon even during the high-voltage operation and realizes a high withstand voltage and a high power is obtained.

Fourteenth Embodiment

Hereinafter, a Schottky-type AlGaN/GaN HEMT according to a fourteenth embodiment will be described. Note that the same constituent members and so on as those of the AlGaN/GaN HEMT according to the first embodiment will be denoted by the same reference signs, and a detailed description thereof will be omitted.

Figure 26A:
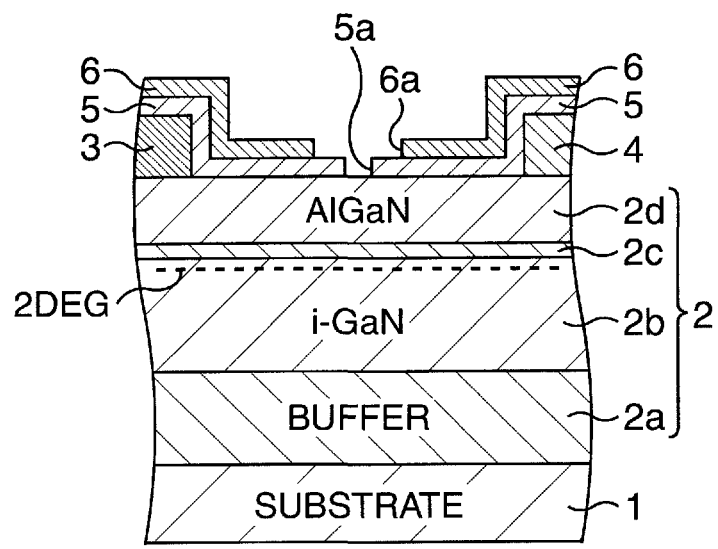
FIG. 26A and FIG. 26B are schematic cross-sectional views illustrating main processes in a method of manufacturing an AlGaN/GaN HEMT according to a fourteenth embodiment.
Figure 26B:
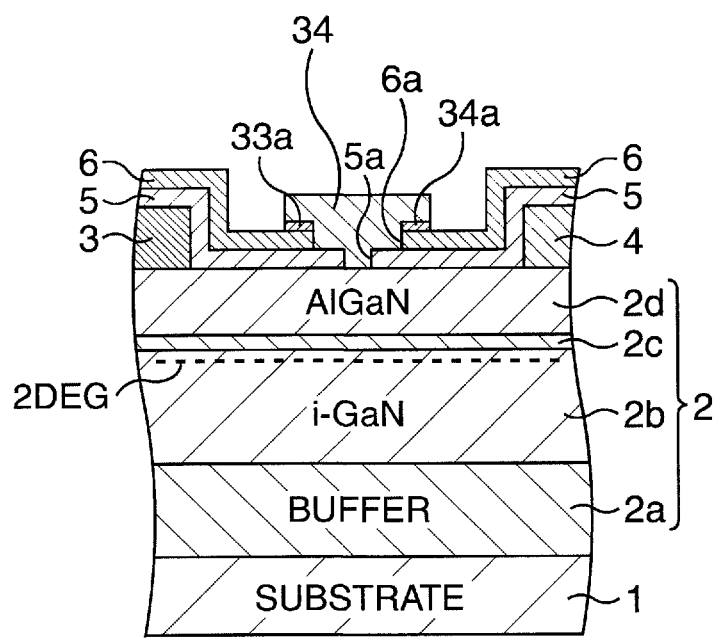

FIG. 26A and FIG. 26B are schematic cross-sectional views illustrating main processes in a method of manufacturing the AlGaN/GaN HEMT according to the fourteenth embodiment.

First, through the processes in FIG. 1A to FIG. 2B of the first embodiment, an opening 5a is formed in a SiN film 5 as illustrated in FIG. 26A.

Subsequently, as illustrated in FIG. 26B, a gate electrode 34 is formed.

As an electrode material, for example, Cu is used. To form the electrode, an eaves-structure, double-layer resist suitable for a vapor deposition method and a liftoff method is used, for instance. This resist is applied on a SiON film 6 including the inside of the openings 5a, 6a, and a resist mask having an opening at a predetermined gate electrode formation position including the openings 5a, 6a is formed. By using this resist mask, Cu is deposited by, for example, the vapor deposition method. A thickness of Cu is about 300 nm. By the liftoff method, the resist mask with the eaves structure and Cu deposited thereon are removed. Consequently, the gate electrode 34 in Schottky contact with a surface of a compound semiconductor layer 2 is formed so as to fill the inside of the openings 5a, 6a with gate metal.

The gate electrode 34 is formed in a so-called overhanging shape from Cu filling the inside of the openings 5a, 6a and riding on the SiON film 6. In the vicinity of the opening 6a of the surface of the SiON film 6, at a portion in contact with the gate electrode 34, oxygen of the SiON film 6 and Cu of the overhanging portion of the gate electrode 34 react with each other, so that a CuO layer 34a being a thin oxide film is formed.

Thereafter, through processes of electrical connection of a source electrode 3, a drain electrode 4, and the gate electrode 34, and so on, the Schottky-type AlGaN/GaN HEMT is formed.

In this embodiment, a passivation film is formed as a stacked structure of the SiN film 5 not containing oxygen and the SiON film 6 containing oxygen. As the passivation film, an insulating film not containing oxygen with little interface state is suitable. The surface of the compound semiconductor layer 2 being a Schottky surface is directly covered by the SiN film 5 not containing oxygen, and the SiN film 5 mainly functions as a protection film. Being separated from the Schottky surface by the SiN film 5, the SiON film 6 containing oxygen might not affect this Schottky surface. The opening 5a of the SiN film 5 and the opening 6a of the SiON film 6 wider than the opening 5a communicate with each other, and the gate electrode 34 in the overhanging shape is formed so as to fill the inside of an opening made up of the openings 5a, 6a. In this structure, the gate electrode 34 is formed on the portion where it fills the opening 5a, the portion where it fills the opening 6a, and a gradually fanning out multi-step structure (here, triple-step structure) of the overhanging portion, so that electric field concentration points during a high-voltage operation are dispersed.

Further, in this embodiment, oxygen of the SiON film 6 and Cu of the overhanging portion of the gate electrode 34 react with each other to form the CuO layer 34a. CuO functions as a p-type oxide semiconductor. The overhanging portion of the gate electrode 34 is located at the uppermost step of the multi-step structure, and in the gate electrode 34, the overhanging portion is a portion closest to the drain electrode 4 and thus the largest electric field concentration occurs here. Due to the presence of the CuO layer 34a being the p-type oxide semiconductor formed on the overhanging portion, a lateral resistance of the overhanging portion increases and field intensity at a gate end is greatly alleviated. Consequently, the current collapse phenomenon is suppressed.

As described above, according to this embodiment, a highly reliable AlGaN/GaN HEMT that fully suppresses the current collapse phenomenon even during the high-voltage operation and realizes a high withstand voltage and a high power is obtained.

Fifteenth Embodiment

Hereinafter, a Schottky-type AlGaN/GaN HEMT according to a fifteenth embodiment will be described. Note that the same constituent members and so on as those of the AlGaN/GaN HEMT according to the first embodiment will be denoted by the same reference signs, and a detailed description thereof will be omitted.

FIG. 27A to FIG. 27C and FIG. 28A to FIG. 28C are schematic cross-sectional views illustrating main processes in a method of manufacturing the AlGaN/GaN HEMT according to the fifteenth embodiment.

Figure 27A:
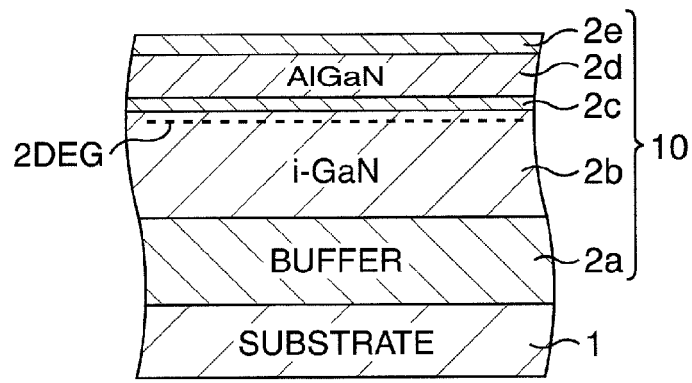
FIG. 27A to FIG. 27C are schematic cross-sectional views illustrating main processes in a method of manufacturing an AlGaN/GaN HEMT according to a fifteenth embodiment.

First, as illustrated in FIG. 27A, a compound semiconductor layer 10 being a stacked structure of compound semiconductors is formed on, for example, a semi-insulating SiC substrate 1 being a growth substrate. As the growth substrate, a Si substrate, a sapphire substrate, a GaAs substrate, a GaN substrate, or the like may be used instead of the SiC substrate. The conductivity of the substrate may be either semi-insulating or conductive.

The compound semiconductor layer 10 includes a buffer layer 2a, an electron transit layer 2b, an intermediate layer 2c, an electron supply layer 2d, and a cap layer 2e.

In the finished AlGaN/GaN HEMT, two-dimensional electron gas (2DEG) is generated in the vicinity of an interface, of the electron transit layer 2b, with the electron supply layer 2d (to be exact, the intermediate layer 2c) during its operation. This 2DEG is generated based on not only spontaneous polarization of the electron transit layer 2b and the electron supply layer 2d but also piezoelectric polarization caused by a distortion ascribable to a difference in lattice constant between the compound semiconductor (here GaN) of the electron transit layer 2b and the compound semiconductor (here AlGaN) of the electron supply layer 2d.

In more detail, on the SiC substrate 1, the following compound semiconductors are grown by, for example, a MOVPE method. A MBE method or the like may be used instead of the MOVPE method.

On the SiC substrate 1, the compound semiconductors to be the buffer layer 2a, the electron transit layer 2b, the intermediate layer 2c, the electron supply layer 2d, and the cap layer 2c are sequentially grown. The buffer layer 2a is formed by AlN being grown with an about 0.1 µm thickness on the Si substrate 1. The electron transit layer 2b is formed by i-GaN being grown with an about 1 µm to about 3 µm thickness. The intermediate layer 2c is formed by i-AlGaN being grown with an about 5 nm thickness. The electron supply layer 2d is formed by n-AlGaN being grown with an about 30 nm thickness. The cap layer 2e is formed by n-GaN being grown with an about 10 nm thickness. In some case, the intermediate layer 2c is not formed. As the electron supply layer, i-AlGaN may be formed.

To grow GaN, mixed gas of trimethylgallium (TMGa) gas being a Ga source and ammonia ($NH_3$) gas is used as a source gas. To grow AlGaN, mixed gas of TMAl gas, TMGa gas, and $NH_3$ gas is used as a source gas. Depending on the compound semiconductor layer that is to be grown, whether or not to supply the TMAl gas and the TMGa gas and their flow rates are appropriately set. A flow rate of the $NH_3$ gas being a common source is set to about 100 sccm to about 10 slm. Further, growth pressure is set to about 50 Torr to about 300 Torr, and growth temperature is set to about 1000° C. to about 1200° C.

In order to grow AlGaN and GaN as an n-type, that is, in order to form the electron supply layer 2d (n-AlGaN) and the cap layer 2e (n-GaN), n-type impurities are added to the source gases for AlGaN and GaN. Here, gas containing, for example, Si, for example, silane ($SiH_4$) gas is added to the source gas at a predetermined flow rate, thereby doping AlGaN and GaN with Si. A doping concentration of Si is set to about $1\times10^{18}/cm^3$ to about $1\times10^{20}/cm^3$, for example, set to about $2\times10^{18}/cm^3$.

Subsequently, element isolation structures are formed.

In more detail, argon (Ar), for instance, is injected to element isolation regions of the compound semiconductor layer 10. Consequently, the element isolation structures are formed in the compound semiconductor layer 10 and in a surface layer portion of the SiC substrate 1. The element isolation structures demarcate an active region on the compound semiconductor layer 10.

Incidentally, instead of the above injection method, a STI (Shallow Trench Isolation) method, for instance, may be used for the element isolation.

Figure 27B:
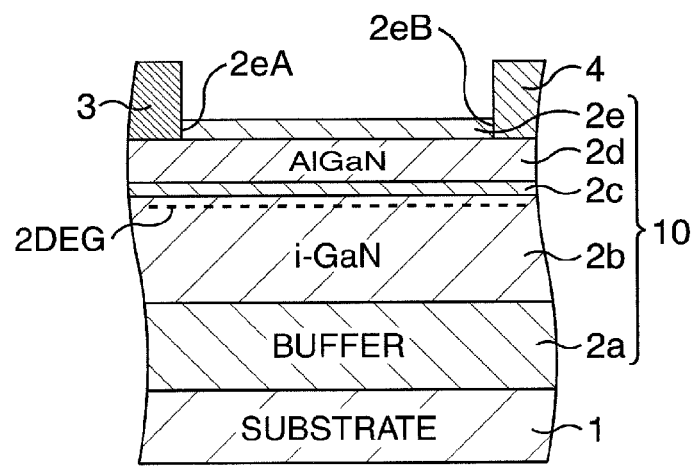

Subsequently, as illustrated in FIG. 27B, a source electrode 3 and a drain electrode 4 are formed.

In more detail, electrode trenches 2eA, 2eB are first formed at predetermined source electrode and drain electrode formation positions (electrode formation positions) on a surface of the compound semiconductor layer 10.

A resist is applied on the surface of the compound semiconductor layer 10 and is processed by lithography, and an opening from which the surface of the compound semiconductor layer 10 corresponding to the predetermined electrode formation position is exposed is formed in the resist. Consequently, a resist mask having the opening is formed.

By using this resist mask, the predetermined electrode formation position of the cap layer 2e is dry-etched to be removed until a surface of the electrode supply layer 2d is exposed. Consequently, the electrode trenches 2eA, 2eB from which the predetermined electrode formation position of the surface of the electrode supply layer 2d is exposed are formed. As etching conditions, inert gas such as Ar and chlorine gas such as $Cl_2$ are used as etching gas, and for example, a flow rate of $Cl_2$ is set to 30 sccm, a pressure is set to 2 Pa, and Rf supply power is set to 20 W. Incidentally, the electrode trenches 2eA, 2eB may be formed by etching to the middle of the cap layer 2e or may be formed by etching beyond the electrode supply layer 2d.

The resist mask is removed by ashing or the like.

A resist mask for forming a source electrode and a drain electrode is formed. Here, for example, an eaves-structure, double-layer resist suitable for a vapor deposition method and a liftoff method is used. This resist is applied on the compound semiconductor layer 10 and openings from which the electrode trenches 2eA, 2eB are exposed are formed. Consequently, a resist mask having the openings is formed.

By using this resist mask, as an electrode material, for example, Ta/Al (Ta for a lower layer and Al for an upper layer) are deposited on the resist mask including the openings from which the electrode trenches 2eA, 2eB are exposed, by, for example, the vapor deposition method. A thickness of Ta is about 20 nm and a thickness of Al is about 200 nm. By the liftoff method, the resist mask and Ta/Al deposited thereon are removed. Thereafter, the SiC substrate 1 is heat-treated at a temperature of about 400° C. to about 1000° C., for example, about 550° C. in, for example, a nitrogen atmosphere, and the residual Ta/Al and the electrode supply layer 2d are brought into ohmic contact with each other. If the ohmic contact of Ta/Al and the electron supply layer 2d is obtained, the heat treatment is unnecessary in some case. Consequently, the source electrode 3 and the drain electrode 4 part of whose electrode materials fill the electrode trenches 2eA, 2eB are formed.

Figure 27C:
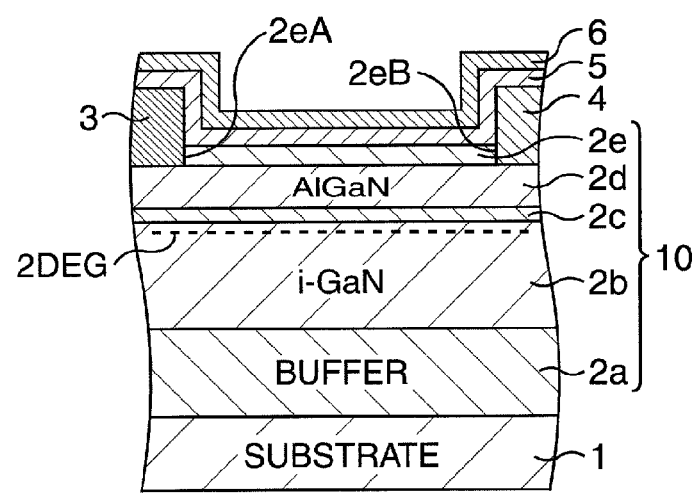

Subsequently, as illustrated in FIG. 27C, a passivation film protecting the surface of the compound semiconductor layer 10 is formed.

The passivation film has a stacked structure of a lower insulating film not containing oxygen, here, a SiN($Si_3N_4$) film 5 and an upper insulating film containing oxygen, here a SiON film 6.

In more detail, SiN is deposited on the whole surface of the compound semiconductor layer 10 to, for example, an about 2 nm to about 200 nm thickness, for example, an about 20 nm thickness by a plasma CVD method, a sputtering method, or the like to form the SiN film 5. Subsequently, SiON is deposited on the SiN film 5 to, for example, an about 2 nm to about 200 nm thickness, for example, an about 20 nm thickness by a plasma CVD method, a sputtering method, or the like to form the SiON film 6. Consequently, the passivation film in which the SiN film 5 and the SiON film 6 are stacked is formed.

Figure 28A:
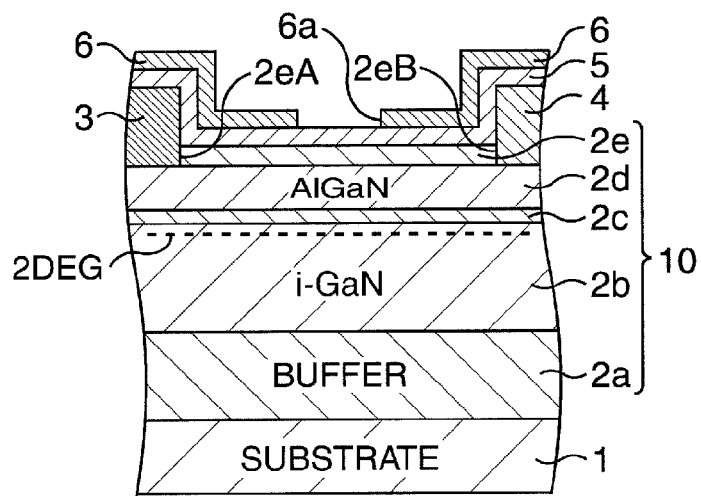
FIG. 28A to FIG. 28C, which are continued from FIG. 27A to FIG. 27C, are schematic cross-sectional views illustrating main processes in the method of manufacturing the AlGaN/GaN HEMT according to the fifteenth embodiment.

Subsequently, as illustrated in FIG. 28A, an opening 6a is formed in the SiON film 6.

In more detail, a resist is applied on the whole surface of the SiON film 6 and is processed by lithography. Consequently, a resist mask having an opening from which a predetermined gate electrode formation position of the SiON film 6 is exposed is formed.

By using this resist mask, the SiON film 6 is dry-etched with, for example, fluorine-based gas used as etching gas. At this time, a surface layer of the SiN film 5 may be slightly etched together with the SiON film 6. Consequently, the opening 6a is formed at the predetermined gate electrode formation position of the SiON film 6.

The resist mask is removed by ashing or wet processing using a predetermined chemical solution.

Figure 28B:
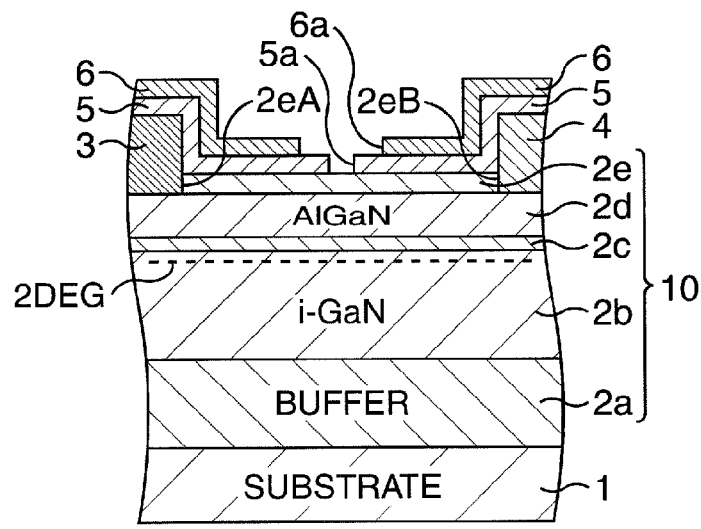

Subsequently, as illustrated in FIG. 28B, an opening 5a is formed in the SiN film 5.

In more detail, a resist is applied on the whole surface of the SiON film 6 including a region on the SiN film 5 exposed from the opening 6a and is processed by lithography. Consequently, a resist mask having an opening from which the predetermined gate electrode formation position of the SiN film 5 in the opening 6a is exposed is formed.

By using this resist mask, the SiN film 5 is dry-etched with, for example, fluorine-based gas used as etching gas. Consequently, the opening 5a is formed at the predetermined gate electrode formation position of the SiN film 5. The opening 6a of the SiON film 6 is wider than the opening 5a of the SiN film 5. The openings 5a, 6a communicate with each other, so that an opening where to form the gate electrode is formed.

The resist mask is removed by ashing or wet processing using a predetermined chemical solution.

Figure 28C:
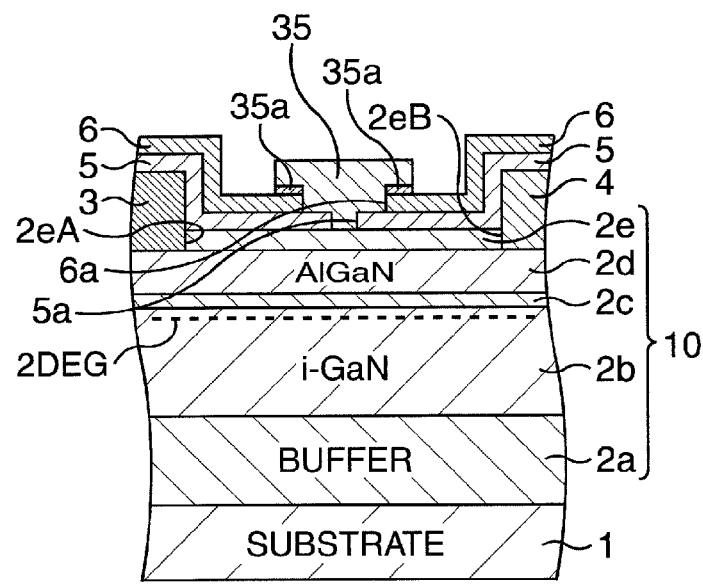

Subsequently, as illustrated in FIG. 28C, the gate electrode 35 is formed.

As an electrode material, for example, Ni/Au (Ni for a lower layer and Au for an upper layer) are used. To form the electrode, an eaves-structure, double-layer resist suitable for a vapor deposition method and a liftoff method is used, for instance. This resist is applied on the SiON film 6 including the inside of the openings 5a, 6a, and a resist mask having an opening at the predetermined gate electrode formation position including the openings 5a, 6a is formed. By using this resist mask, Ni/Au are deposited by, for example, the vapor deposition method. A thickness of Ni is about 30 nm and a thickness of Au is about 400 nm. By the liftoff method, the resist mask with the eaves structure and Ni/Au deposited thereon are removed. Consequently, the gate electrode 35 in Schottky contact with the surface of the compound semiconductor layer 10 is formed so as to fill the openings 5a, 6a with gate metal.

The gate electrode 35 is formed in a so-called overhanging shape, using Ni filling the inside of the openings 5a, 6a and riding on the SiON film 6 and Au deposited on Ni. In the vicinity of the opening 6a of the surface of the SiON film 6, at portion in contact with Ni of the gate electrode 35, oxygen of the SiON film 6 and Ni of the overhanging portion of the gate electrode 35 react with each other, so that a NiO layer 35a being a thin oxide film is formed.

Thereafter, through processes of electrical connection of the source electrode 3, the drain electrode 4, and the gate electrode 35, and so on, the Schottky-type AlGaN/GaN HEMT is formed.

In this embodiment, the passivation film is formed as a stacked structure of the SiN film 5 not containing oxygen and the SiON film 6 containing oxygen. As the passivation film, an insulating film not containing oxygen with little interface state is suitable. The surface of the compound semiconductor layer 10 to be a Schottky surface is directly covered by the SiN film 5 not containing oxygen and the SiN film 5 mainly functions as a protection film. Being separated from the Schottky surface by the SiN film 5, the SiON film 6 containing oxygen might not affect the Schottky surface. The opening 5a of the SiN film 5 and the opening 6a of the SiON film 6 wider than the opening 5a communicate with each other, and the gate electrode 35 in the overhanging shape is formed so as to fill the inside of an opening made up of the openings 5a, 6a. In this structure, the gate electrode 35 is formed on the portion where it fills the opening 5a, the portion where it fills the opening 6a, and a gradually fanning out multi-step structure (here, triple-step structure) of the overhanging portion, so that electric field concentration points during a high-voltage operation are dispersed.

Further, in this embodiment, oxygen of the SiON film 6 and Ni of the overhanging portion of the gate electrode 35 react with each other to form the NiO layer 35a. NiO functions as a p-type oxide semiconductor. The overhanging portion of the gate electrode 35 is located at the uppermost step of the multi-step structure, and in the gate electrode 35, the overhanging portion is a portion closest to the drain electrode 4 and thus the largest electric field concentration occurs here. Due to the presence of the NiO layer 35a being the p-type oxide semiconductor formed on the overhanging portion, a lateral resistance of the overhanging portion increases and field intensity at a gate end is greatly alleviated. Consequently, the current collapse phenomenon is suppressed.

As described above, according to this embodiment, a highly reliable AlGaN/GaN HEMT that fully suppresses the current collapse phenomenon even during the high-voltage operation and realizes a high withstand voltage and a high power is obtained.

Sixteenth Embodiment

Hereinafter, a Schottky-type InAlN/GaN HEMT according to a sixteenth embodiment will be described. Note that the same constituent members and so on as those of the AlGaN/GaN HEMT according to the first embodiment will be denoted by the same reference signs, and a detailed description thereof will be omitted.

FIG. 29A to FIG. 29C and FIG. 30A to FIG. 30C are schematic cross-sectional views illustrating a method of manufacturing the InAlN/GaN HEMT according to the sixteenth embodiment in order of processes.

Figure 29A:
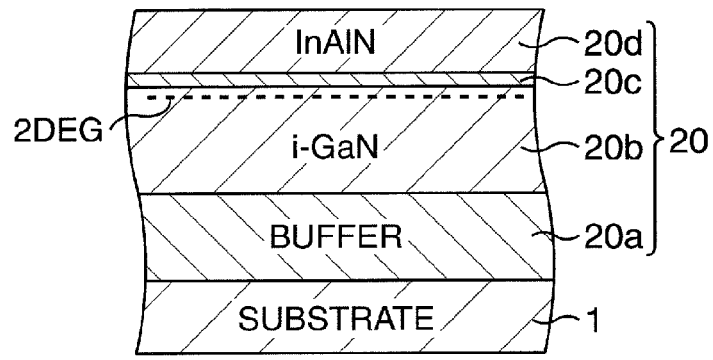
FIG. 29A to FIG. 29C are schematic cross-sectional views illustrating main processes in a method of manufacturing an InAlN/GaN HEMT according to a sixteenth embodiment.

First, as illustrated in FIG. 29A, a compound semiconductor layer 20 being a stacked structure of compound semiconductors is formed on, for example, a semi-insulating SiC substrate 1 being a growth substrate. As the growth substrate, a Si substrate, a sapphire substrate, a GaAs substrate, a GaN substrate, or the like may be used instead of the SiC substrate. The conductivity of the substrate may be either semi-insulating or conductive.

The compound semiconductor layer 20 includes a buffer layer 20a, an electron transit layer 20b, an intermediate layer 20c, and an electron supply layer 20d.

In the finished InAlN/GaN HEMT, two-dimensional electron gas (2DEG) is generated in the vicinity of an interface, of the electron transit layer 20b, with the electron supply layer 20d (to be exact, the intermediate layer 20c) during its operation. In the InAlN/GaN HEMT, piezoelectric polarization hardly occurs, but InAlN of the electrode supply layer 20d has strong spontaneous polarization, and due to a synergistic effect with spontaneous polarization of the electrode transit layer 20b, 2DEG is generated mainly based on the spontaneous polarization.

More specifically, on the SiC substrate 1, the following compound semiconductors are grown by, for example, a MOVPE method. A MBE method or the like may be used instead of the MOVPE method.

On the SiC substrate 1, the compound semiconductors to be the buffer layer 20a, the electron transit layer 20b, the intermediate layer 20c, and the electron supply layer 20d are sequentially grown. The buffer layer 20a is formed by AlN being grown with an about 0.1 μm thickness on the Si substrate 1. The electron transit layer 20b is formed by i-GaN being grown with an about 1 μm to about 3 μm thickness. The intermediate layer 20c is formed by i-InAlN being grown with an about 5 nm thickness. The electron supply layer 20d is formed by i-InAlN being grown with an about 30 nm thickness. In some case, the intermediate layer 20c is not formed.

To grow GaN, mixed gas of trimethylgallium (TMGa) gas being a Ga source and ammonia ($NH_3$) gas is used as a source gas. To grow InAlN, mixed gas of trimethylindium (TMIn) gas, TMAl gas, and $NH_3$ gas is used as a source gas. Depending on the compound semiconductor layer that is to be grown, whether or not to supply the TMGa gas, the TMIn gas, and the TMAl gas and their flow rates are appropriately set. A flow rate of the $NH_3$ gas being a common source is set to about 100 sccm to about 10 slm. Further, growth pressure is set to about 50 Torr to about 300 Torr, and growth temperature is set to about 1000° C. to about 1200° C.

Subsequently, element isolation structures are formed.

More specifically, argon (Ar), for instance, is injected to element isolation regions of the compound semiconductor layer 20. Consequently, the element isolation structures are formed in the compound semiconductor layer 20 and in a surface layer portion of the SiC substrate 1. The element isolation structures demarcate an active region on the compound semiconductor layer 20.

Incidentally, instead of the above injection method, a STI (Shallow Trench Isolation) method, for instance, may be used for the element isolation.

Figure 29B:
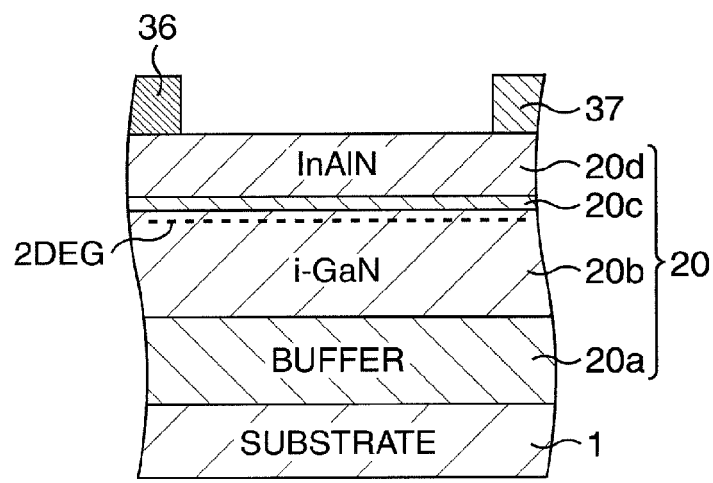

Subsequently, as illustrated in FIG. 29B, a source electrode 36 and a drain electrode 37 are formed.

As an electrode material, for example, Ta/Al (Ta for a lower layer and Al for an upper layer) are used. To form the electrode, an eaves-structure, double-layer resist suitable for a vapor deposition method and a liftoff method is used, for instance. This resist is applied on the compound semiconductor layer 20, and a resist mask having openings at predetermined source electrode and drain electrode formation positions is formed. By using this resist mask, Ta/Al are deposited by, for example, the vapor deposition method. A thickness of Ta is about 20 nm and a thickness of Al is about 200 nm. By the liftoff method, the resist mask with the eaves structure and Ta/Al deposited thereon are removed. Thereafter, the SiC substrate 1 is heat-treated at 400° C. to 1000° C., for example, about 550° C. in, for example, a nitrogen atmosphere, and the residual Ta/Al and the electron supply layer 20d are brought into ohmic contact with each other. Consequently, the source electrode 36 and the drain electrode 37 made of Ta/Al are formed.

Figure 29C:
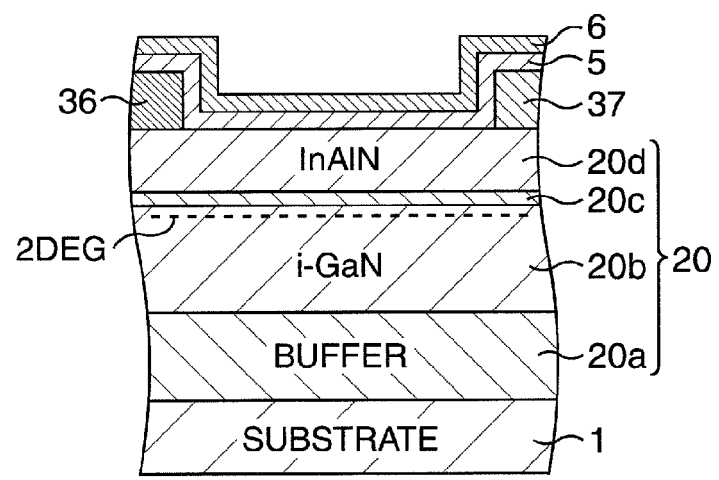

Subsequently, as illustrated in FIG. 29C, a passivation film protecting a surface of the compound semiconductor layer 20 is formed.

The passivation film has a stacked structure of a lower insulating film not containing oxygen, here, a SiN($Si_3N_4$) film 5 and an upper insulating film containing oxygen, here a SiON film 6.

In more detail, SiN is deposited on the whole surface of the compound semiconductor layer 20 to, for example, an about 2 nm to about 200 nm thickness, for example, an about 20 nm thickness by a plasma CVD method, a sputtering method, or the like to form the SiN film 5. Subsequently, SiON is deposited on the SiN film 5 to, for example, an about 2 nm to about 200 nm thickness, for example, an about 20 nm thickness by a plasma CVD method, a sputtering method, or the like to form the SiON film 6. Consequently, the passivation film in which the SiN film 5 and the SiON film 6 are stacked is formed.

Figure 30A:
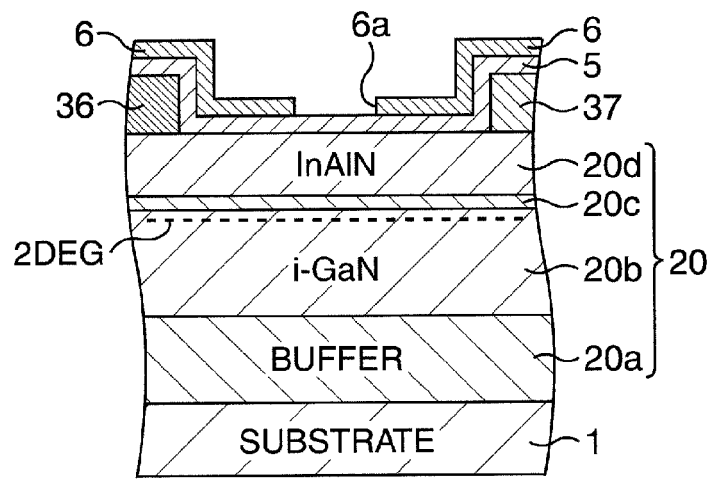
FIG. 30A to FIG. 30C, which are continued from FIG. 29A to FIG. 29C, are schematic cross-sectional views illustrating main processes in the method of manufacturing the InAlN/GaN HEMT according to the sixteenth embodiment.

Subsequently, as illustrated in FIG. 30A, an opening 6a is formed in the SiON film 6.

In more detail, a resist is applied on the whole surface of the SiON film 6 and is processed by lithography. Consequently, a resist mask having an opening from which a predetermined gate electrode formation position of the SiON film 6 is exposed is formed.

By using this resist mask, the SiON film 6 is dry-etched with, for example, fluorine-based gas used as etching gas. At this time, a surface layer of the SiN film 5 may be slightly etched together with the SiON film 6. Consequently, the opening 6a is formed at the predetermined gate electrode formation position of the SiON film 6.

The resist mask is removed by ashing or wet processing using a predetermined chemical solution.

Figure 30B:
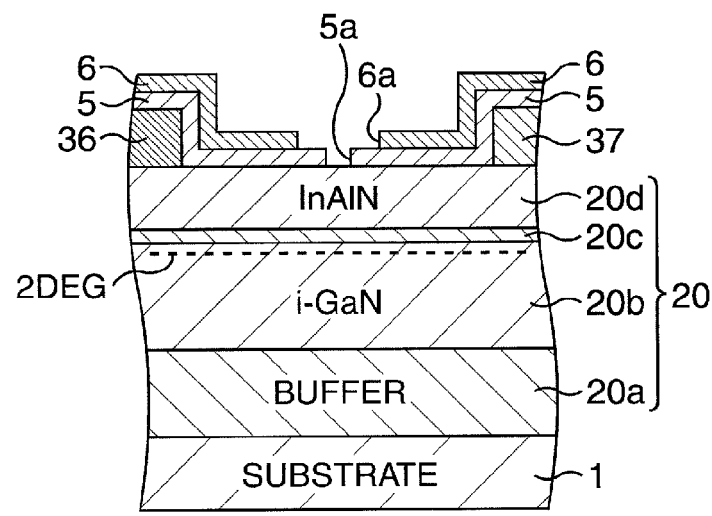

Subsequently, as illustrated in FIG. 30B, an opening 5a is formed in the SiN film 5.

In more detail, a resist is applied on the whole surface of the SiON film 6 including a region on the SiN film 5 exposed from the opening 6a and is processed by lithography. Consequently, a resist mask having an opening from which the predetermined gate electrode formation position of the SiN film 5 in the opening 6a is exposed is formed.

By using this resist mask, the SiN film 5 is dry-etched with, for example, fluorine-based gas used as etching gas. Consequently, the opening 5a is formed at the predetermined gate electrode formation position of the SiN film 5. The opening 6a of the SiON film 6 is wider than the opening 5a of the SiN film 5. The openings 5a, 6a communicate with each other, so that an opening where to form the gate electrode is formed.

The resist mask is removed by ashing or wet processing using a predetermined chemical solution.

Figure 30C:
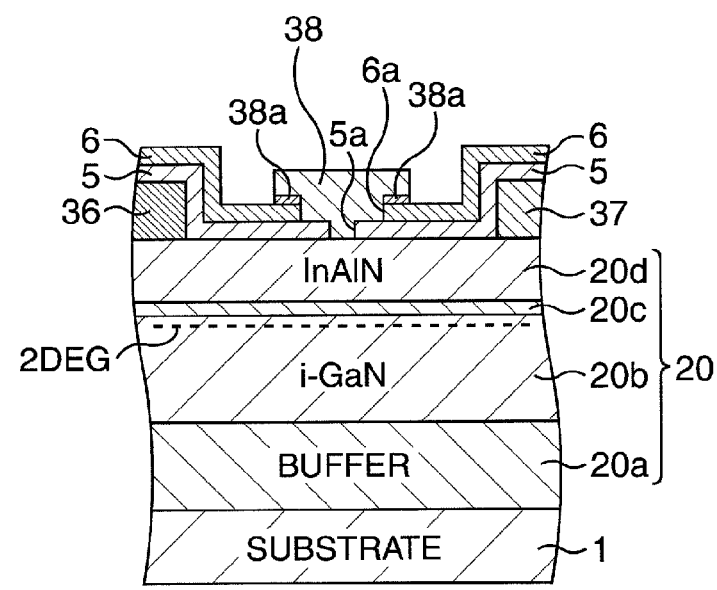

Subsequently, as illustrated in FIG. 30C, the gate electrode 38 is formed.

As an electrode material, for example, Ni/Au (Ni for a lower layer and Au for an upper layer) are used. To form the electrode, an eaves-structure, double-layer resist suitable for a vapor deposition method and a liftoff method is used, for instance. This resist is applied on the SiON film 6 including the inside of the openings 5a, 6a, and a resist mask having an opening at the predetermined gate electrode formation position including the openings 5a, 6a is formed. By using this resist mask, Ni/Au are deposited by, for example, the vapor deposition method. A thickness of Ni is about 30 nm and a thickness of Au is about 400 nm. By the liftoff method, the resist mask with the eaves structure and Ni/Au deposited thereon are removed. Consequently, the gate electrode 38 in Schottky contact with the surface of the compound semiconductor layer 20 is formed so as to fill the openings 5a, 6a with gate metal.

The gate electrode 38 is formed in a so-called overhanging shape, using Ni filling the inside of the openings 5a, 6a and riding on the SiON film 6 and Au deposited on Ni. In the vicinity of the opening 6a of the surface of the SiON film 6, at a portion in contact with Ni of the gate electrode 38, oxygen of the SiON film 6 and Ni of the overhanging portion of the gate electrode 38 react with each other, so that a NiO layer 38a being a thin oxide film is formed.

Thereafter, through processes of electrical connection of the source electrode 36, the drain electrode 37, and the gate electrode 38, and so on, the Schottky-type AlGaN/GaN HEMT is formed.

In this embodiment, the passivation film is formed as a stacked structure of the SiN film 5 not containing oxygen and the SiON film 6 containing oxygen. As the passivation film, an insulating film not containing oxygen with little interface state is suitable. The surface of the compound semiconductor layer 20 to be a Schottky surface is directly covered by the SiN film 5 not containing oxygen and the SiN film 5 mainly functions as a protection film. Being separated from the Schottky surface by the SiN film 5, the SiON film 6 containing oxygen might not affect the Schottky surface. The opening 5a of the SiN film 5 and the opening 6a of the SiON film 6 wider than the opening 5a communicate with each other, and the gate electrode 38 in the overhanging shape is formed so as to fill the inside of an opening made up of the openings 5a, 6a. In this structure, the gate electrode 38 is formed on the portion where it fills the opening 5a, the portion where it fills the opening 6a, and a gradually fanning out multi-step structure (here, triple-step structure) of the overhanging portion, so that electric field concentration points during a high-voltage operation are dispersed.

Further, in this embodiment, oxygen of the SiON film 6 and Ni of the overhanging portion of the gate electrode 38 react with each other to form the NiO layer 38a. NiO functions as a p-type oxide semiconductor. The overhanging portion of the gate electrode 38 is located at the uppermost step of the multi-step structure, and in the gate electrode 38, the overhanging portion is a portion closest to the drain electrode 37 and thus the largest electric field concentration occurs here. Due to the presence of the NiO layer 38a being the p-type oxide semiconductor formed on the overhanging portion, a lateral resistance of the overhanging portion increases and field intensity at a gate end is greatly alleviated. Consequently, the current collapse phenomenon is suppressed.

As described above, according to this embodiment, a highly reliable InAlN/GaN HEMT that fully suppresses the current collapse phenomenon even during the high-voltage operation and realizes a high withstand voltage and a high power is obtained.

In the above-described embodiments, the cases where the passivation film has the double-layer structure of the lower insulting film and the upper insulating film are presented as examples, but this is not restrictive. The passivation film may be formed as a multilayer structure with three layers or more, provided that the film in contact with the compound semiconductor layer is an insulating film not containing oxygen and the film in contact with the overhanging portion of the gate electrode is an insulating film containing oxygen.

Further, in the above-described embodiments, as the upper insulating film containing oxygen forming the passivation film, an $Al_2O_3$ film may be used.

Further, the present invention is also applicable to, for example, an InAlGaN/GaN HEMT or the like in which the electrode supply layer is made of i-InAlGaN, besides the AlGaN/GaN HEMT and the InAlN/GaN HEMT.

Further, the epitaxial structures of each of the compound semiconductors in the above-described embodiments are only examples, and any other structure can be employed, provided that it is a field-effect transistor.

Further, the layer structures of the source electrode and the drain electrode in the above-described embodiments are only examples, and any other layer structure may be employed irrespective of whether it is a single layer or a multiple layer, and the methods of forming the electrodes are also only examples, and any other formation method may be used.

Seventeenth Embodiment

This embodiment discloses a power supply device including one kind selected from the AlGaN/GaN HEMTs according to the first to fifteenth embodiments or the InAlN/GaN HEMT according to the sixteenth embodiment.

Figure 31:
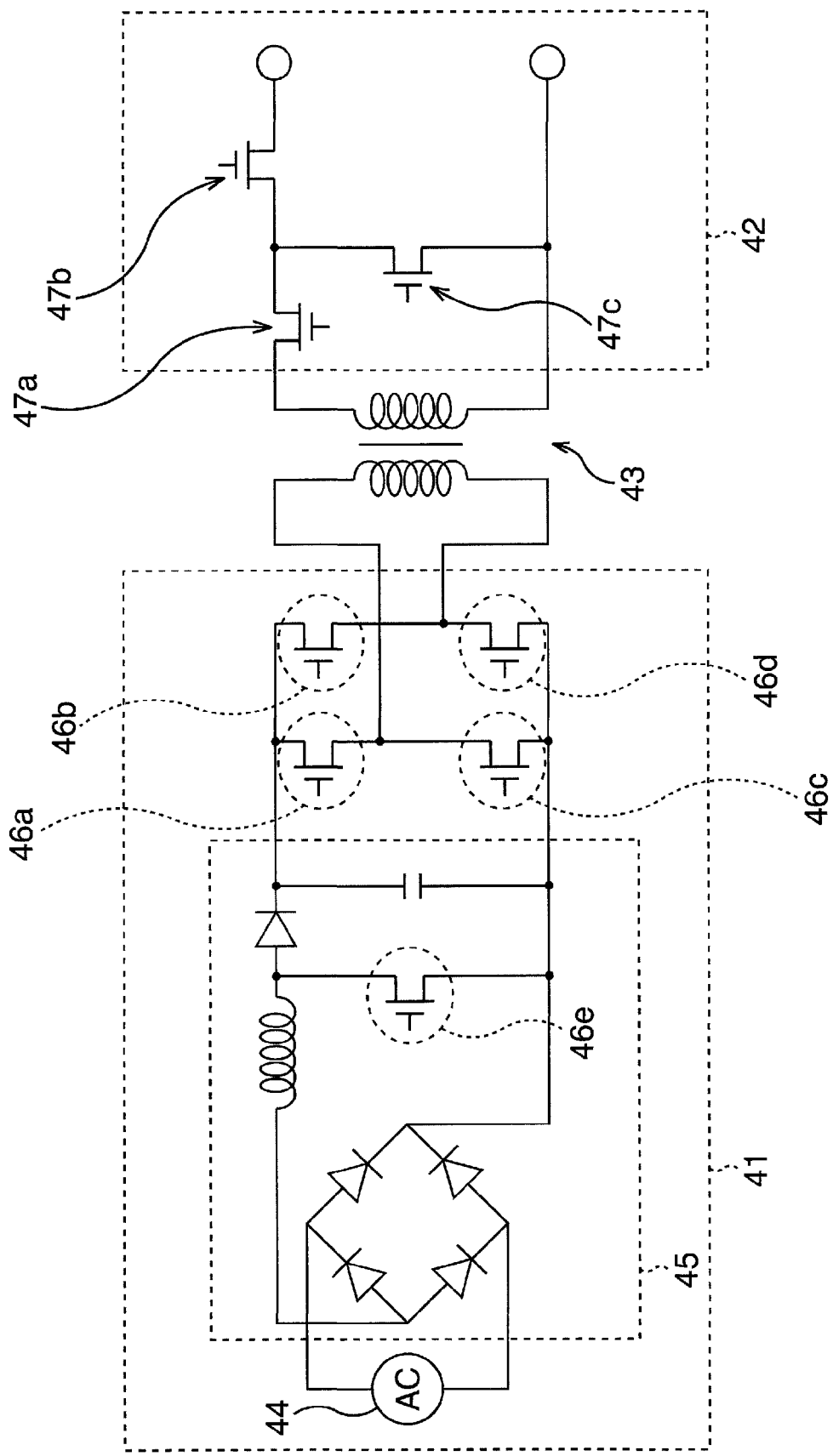
FIG. 31 is a connection diagram illustrating a schematic structure of a power supply device according to a seventeenth embodiment.

FIG. 31 is a connection diagram illustrating a schematic structure of the power supply device according to the seventeenth embodiment.

The power supply device according to this embodiment includes: a high-voltage primary circuit 41 and a lower-voltage secondary circuit 42; and a transformer 43 disposed between the primary circuit 41 and the secondary circuit 42.

The primary circuit 41 includes an AC power source 44, a so-called bridge rectifying circuit 45, and a plurality of (four here) switching elements 46a, 46b, 46c, 46d. Further, the bridge rectifying circuit 45 has a switching element 46e.

The secondary circuit 42 includes a plurality of (three here) switching elements 47a, 47b, 47c.

In this embodiment, the switching elements 46a, 46b, 46c, 46d, 46e of the primary circuit 41 are each one kind selected from the AlGaN/GaN HEMTs according to the first to fifteenth embodiments or the InAlN/GaN HEMT according to the sixteenth embodiment. On the other hand, the switching elements 47a, 47b, 47c of the secondary circuit 42 are each an ordinary MIS·FET using silicon.

In this embodiment, the highly reliable AlGaN/GTaN HEMT or InAlN/GaN HEMT that fully suppresses the current collapse phenomenon even during the high-voltage operation and realizes a high withstand voltage and a high power is applied to the high-voltage circuit. Consequently, a power supply circuit having high reliability and a high power is realized.

Eighteenth Embodiment

This embodiment discloses a high-frequency amplifier employing one kind selected from the AlGaN/GaN HEMTs according to the first to fifteenth embodiments or the InAlN/GaN HEMT according to the sixteenth embodiment.

Figure 32:
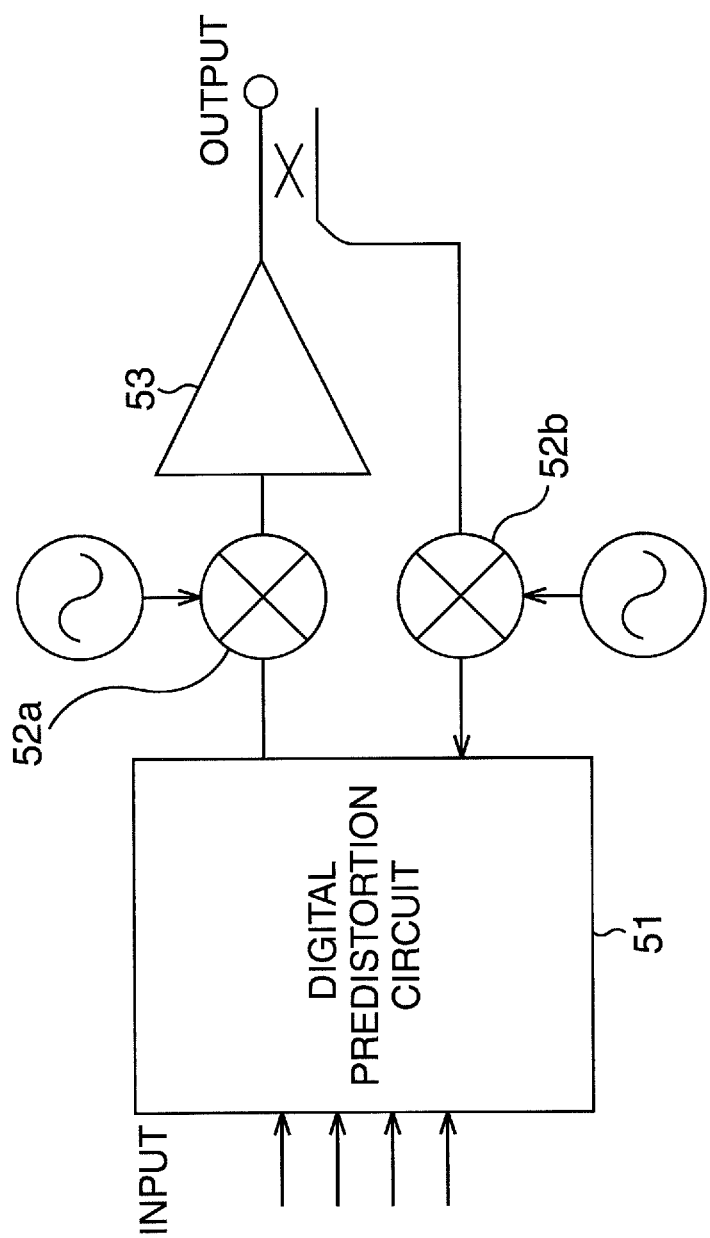
FIG. 32 is a connection diagram illustrating a schematic structure of a high-frequency amplifier according to an eighteenth embodiment.

FIG. 32 is a connection diagram illustrating a schematic structure of the high-frequency amplifier according to the eighteenth embodiment.

The high-frequency amplifier according to this embodiment includes a digital pre-distortion circuit 51, mixers 52a, 52b, and a power amplifier 53.

The digital pre-distortion circuit 51 compensates nonlinear distortion of an input signal. The mixer 52a mixes the input signal whose nonlinear distortion is compensated and an AC signal. The power amplifier 53 amplifies the input signal mixed with the AC signal, and has one kind selected from the AlGaN/GaN HEMTs according to the first to fifteenth embodiments or the InAlN/GaN HEMT according to the sixteenth embodiment. In FIG. 32, by, for example, changing of the switches, an output-side signal can be mixed with the AC signal by the mixer 52b, and the resultant can be sent out to the digital pre-distortion circuit 51.

In this embodiment, the highly reliable AlGaN/GaN HEMT or InAlN/GaN HEMT that fully suppresses the current collapse phenomenon even during the high-voltage operation and realizes a high withstand voltage and a high power is applied to the high-frequency amplifier. Consequently, a high-frequency amplifier having high reliability and a high withstand voltage is realized.

According to the above-described embodiments, a highly reliable compound semiconductor device that fully suppresses the current collapse phenomenon even during a high-voltage operation and realizes a high withstand voltage and a high power is obtained.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A compound semiconductor device comprising:
a compound semiconductor layer;
a protection film which has an opening and covers an upper side of the compound semiconductor layer; and
an electrode which fills the opening and has a shape riding on the compound semiconductor layer,
wherein the protection film has a stacked structure of a lower insulating film not containing oxygen and an upper insulating film containing oxygen,
wherein the opening has a first opening formed in the lower insulating film and a second opening formed in the upper insulating film and wider than the first opening, the first opening and the second opening communicating with each other, and
wherein between the upper insulating film and the electrode, an oxide film resulting from a reaction between the upper insulating film and the electrode is formed.

2. The compound semiconductor device according to claim 1, wherein the oxide film is made of NiO or CuO.

3. The compound semiconductor device according to claim 1, wherein the upper insulating film is made of SiON, $SiO_2$, or $Al_2O_3$ or any combination thereof.

4. The compound semiconductor device according to claim 1, wherein the upper insulating film is provided only on a lower periphery of the electrode.

5. The compound semiconductor device according to claim 1, wherein the upper insulating film is provided only on one side of the electrode.

6. The compound semiconductor device according to claim 1,
wherein a trench communicating with the first opening is formed in a surface layer of the compound semiconductor layer, and the electrode is formed so as to fill the trench and the opening.

7. The compound semiconductor device according to claim 1, wherein, on a surface layer of the upper insulating film, a thin film higher in oxygen content than other portions is formed.

8. A compound semiconductor device comprising:
a compound semiconductor layer;
a protection film which has an opening and covers an upper side of the compound semiconductor layer; and
an electrode which fills the opening and has a shape riding on the compound semiconductor layer,
wherein the protection film has a lower insulating film not containing oxygen and NiO piece smaller than the lower insulating film above the lower insulating film,
wherein the opening has a first opening formed in the lower insulating film and a second opening formed in the NiO piece and wider than the first opening, the first opening and the second opening communicating with each other.

9. A method of manufacturing a compound semiconductor device, comprising:
forming a protection film to cover an upper side of a compound semiconductor layer, the protection film having a stacked structure of a lower insulating film not containing oxygen and an upper insulating film containing oxygen;
forming a first opening in the lower insulating film and forming, in the upper insulating film, a second opening wider than the first opening, the first opening and the second opening being formed to communicate with each other;
forming an electrode that fills the opening and has a shape riding on the compound semiconductor layer,
wherein between the upper insulating film and the electrode, an oxide film resulting from a reaction between the upper insulating film and the electrode is formed.

10. The method of manufacturing the compound semiconductor device according to claim 9, wherein the oxide film is made of NiO or CuO.

11. The method of manufacturing the compound semiconductor device according to claim 9, wherein the upper insulating film is made of SiON, $SiO_2$, or $Al_2O_3$ or any combination thereof.

12. The method of manufacturing the compound semiconductor device according to claim 9, wherein the upper insulating film is provided only on a lower periphery of the electrode.

13. The method of manufacturing the compound semiconductor device according to claim 9, wherein the upper insulating film is provided only on one side of the electrode.

14. The method of manufacturing the compound semiconductor device according to claim 9, wherein a mask used when the first opening is formed is continuously used to form the second opening by wet etching utilizing a difference in etching rate between the lower insulating film and the upper insulating film.

15. The method of manufacturing the compound semiconductor device according to claim 9, wherein a trench communicating with the first opening is formed in a surface layer of the compound semiconductor layer, and the electrode is formed so as to fill the trench and the opening.

16. A method of manufacturing a compound semiconductor device, comprising:
forming a protection film to cover an upper side of a compound semiconductor layer, the protection film having a stacked structure of a lower insulating film not containing oxygen and NiO piece smaller than the lower insulating film above the lower insulating film;
forming a first opening in the lower insulating film and forming, in the NiO piece, a second opening wider than the first opening, the first opening and the second opening being formed to communicate with each other;
forming an electrode that fills the opening and has a shape riding on the compound semiconductor layer.

17. A power supply circuit comprising:
a transformer; and
a high-voltage circuit and a low-voltage circuit sandwiching the transformer,
wherein the high-voltage circuit comprises a transistor, the transistor comprising:
a compound semiconductor layer;
a protection film which has an opening and covers the compound semiconductor layer; and
an electrode which fills the opening and has a shape riding on the compound semiconductor layer,
wherein the protection film has a stacked structure of a lower insulating film not containing oxygen and an upper insulating film containing oxygen,
wherein the opening includes a first opening formed in the lower insulating film and a second opening formed in the upper insulating film and wider than the first opening, the first opening and the second opening communicating with each other, and wherein between the upper insulating film and the electrode, an oxide film resulting from a reaction between the upper insulating film and the electrode is formed.

* * * * *